United States Patent [19]
Kanazawa

[11] Patent Number: 5,818,229
[45] Date of Patent: Oct. 6, 1998

[54] CORRECTION OF MR IMAGING PULSE SEQUENCE USING PRESCAN HAVING APPLICATION PHASE ADJUSTED RF REFOCUSING PULSES

[75] Inventor: Hitoshi Kanazawa, Utsunomiya, Japan

[73] Assignee: Kabushiki Kaisha Toshiba, Kanagawa-ken, Japan

[21] Appl. No.: 637,068

[22] Filed: Apr. 24, 1996

[30] Foreign Application Priority Data

Oct. 31, 1995 [JP] Japan ................................ 7-284009

[51] Int. Cl.$^6$ ................................................ G01V 3/00
[52] U.S. Cl. ............................................ 324/309; 324/307
[58] Field of Search .................................. 324/300, 307, 324/309, 318; 128/653.2, 653.3, 653.4

[56] References Cited

U.S. PATENT DOCUMENTS

| | | | |
|---|---|---|---|
| 4,720,679 | 1/1988 | Patrick et al. | 324/309 |
| 5,270,654 | 12/1993 | Feinberg et al. | 324/309 |
| 5,361,028 | 11/1994 | Kanayama et al. | 324/309 |
| 5,378,985 | 1/1995 | Hinks | 324/309 |

FOREIGN PATENT DOCUMENTS

| | | |
|---|---|---|
| 6-54827 | 3/1994 | Japan . |
| 6-121777 | 5/1994 | Japan . |
| 7-155309 | 6/1995 | Japan . |

OTHER PUBLICATIONS

Magnetic Resonance in Medicine, vol. 3, 823–833, 1986, J. Hennig et al., "RARE Imaging: A Fast Imaging Method for Clinical MR".

J. of Magnetic Resonance Imaging, vol. 78, 397–407, 1988, J. Hennig, "Multiecho Imaging Sequences with Low Refocusing Flip Angles".

Magnetic Resonance in Medicine, vol. 30, 183–191, 1993, Patrick Le Roux et al., "Stabilization of Echo Amplitudes in FSE Sequences".

Magnetic Resonance in Medicine, vol. 30, 251–255, 1993, Koichi Oshio et al., "Fast MRI by Creating Multiple Spin Echoes in CPMG".

J. of Magnetic Resonance, vol. 96, 501–513, 1992, Limin Li and Christopher H. Sotak, "A Method for Evaluating Amisotropic and Restricted Diffusion by Simultaneous Use of Spin and Stimulated Echoes".

Magnetic Resonance in Medicine, vol. 34, 632–638, 1995, Xin Wan et al., "Reduction of Phase Error Ghosting Artifacts in Thin Slice Fast Spin–Echo Imaging".

Proceedings of Annual Meeting of the Society of Magnetic Resonance in Medicine (SMRM), 1993,No. 1219, J. Schiff et al., "A Fast Eddy Field Mapping Procedure".

(List continued on next page.)

*Primary Examiner*—Louis M. Arana
*Attorney, Agent, or Firm*—Limbach & Limbach L.L.P.

[57] ABSTRACT

There is a method of correcting an imaging pulse sequence magnetically applied by an imaging scan to an object. The method comprises a step of performing a first prescan to the object with a first preliminary pulse sequence including an RF excitation pulse and a plurality of RF refocusing pulses each having an application phase set to a specified phase value (for example, 90°) and a step of performing a second prescan to the object with a second preliminary pulse sequence including an RF excitation pulse and a plurality of RF refocusing pulses of which even-numbered RF refocusing pulse has an application phase set to another specified phase value (for example, 270°) differed by 180° from the specified phase value. The method further comprises a step of correcting the imaging pulse sequence on the basis of first and second echo data groups provided by the first and second prescan, prior to the imaging scan. Each of the first and second preliminary pulse sequences and the imaging pulse sequence is formed by a CPMG pulse train or a phase reversal CP pulse train, such as a GRASE sequence and a fast SE sequence.

39 Claims, 41 Drawing Sheets

OTHER PUBLICATIONS

Proceedings of Annual Meeting of the SMRM, 1991, No. 1025, J.E. Bishop et al., "Stimulated Echo Effects in Fast Spin Echo Images".

Procedure of Annual Meeting of the SMRM, 1992, No. 4508, K. Oshio et al., "Stimulated Echoes in Multi–Slice RARE Sequences".

Proceedings of Annual Meeting of the SMRM, 1993, No. 1248, Xiaohon Zhou et al., "On Phase Artifacts of High–Field Fast Spin–Echo Images".

Proceedings of Annual Meeting of the SMR, 1995, No. 633, Xin Wan et al., "Phase and Amplitude Properties of Stimulated Echoes in FSE Sequences".

Proceedings of Annual Meeting of the SMR, 1995, No.634, R. Scott Hinks et al., "Fast Spin Echo Prescan for Artifacts Reduction".

Proceedings of Annual Meeting of the SMR, No. 27, 1994, T. Schaffter et al., "FSF Improvements in Single Shot GRACE Imaging".

Proceedings of Annual Meeting of the SMRM, No. 1244, 1993, Y. Kassai et al., "Fast TIW Spin Echo Image with Interleaved EPI Technique".

Magnetic Resonance in Medicine, vol. 34, 632–638, 1995, Xin Wan et al., "Reduction of Phase Error Ghosting Artifacts in Thin Slice Fast Spin–Echo Imaging", Nov. 10, 1994.

CORRECTION OF MR IMAGING PULSE SEQUENCE USING PRESCAN HAVING APPLICATION PHASE ADJUSTED RF REFOCUSING PULSES

BACKGROUND OF THE INVENTION

1. Field of the Invention

The present invention relates to magnetic resonance imaging (MRI), or more particularly, to magnetic resonance imaging using a pulse sequence composed of a plurality of RF refocusing pulses; such as, a CPMG pulse sequence or phase reversal CP pulse sequence (a typical pulse sequence includes, for example, RARE (fast SE) and GRASE (hybrid EPI) pulse sequences).

2. Description of the Prior Art

Magnetic resonance imaging (MRI) utilizing magnetic resonance phenomena of nuclear spins is being implemented more and more eagerly in the field of medical engineering because of its noninvasiveness and its ability to produce images of the insides of patient bodies. Along with the advancement and sophistication of technologies including that for image processing, the demand for high-quality MR images and the degree of fast imaging are increasing.

In the past, various pulse sequences devised for magnetic resonance imaging have been implemented or proposed in an effort to satisfy the foregoing conditions. One of the pulse sequences is a pulse sequence referred to as a RARE pulse sequence (Refer to, for example, literature 1 "Magnetic Resonance in Medicine" (Vol. 3, P. 823–833, 1986), and literature 2 "Journal of Magnetic Resonance Imaging" (Vol. 78, P.397–407, 1988), or a GRASE pulse sequence (Refer to, for example, U.S. Pat. No. 5,270,654).

FIG. 1 shows a RARE pulse sequence, and FIG. 2 shows a GRASE pulse sequence. In these drawings, RFex denotes an RF excitation pulse, and RFre1 to RFre5 denote RF refocusing pulses. The RF refocusing pulses RFre1 to RFre5 are applied consecutively succeeding the RF excitation pulse RFex. Gss denotes a slice-selective magnetic field gradient. Gpe denotes a phase-encoding magnetic field gradient. Gro denotes a readout magnetic field gradient. Furthermore, E(1) to E(5) (or E(l1) to E(5,3)) denote NMR echoes (waveforms subjected to phase detection) produced by a CPMG pulse sequence. As for phases φ by which rotation is made with applications of the RF pulses RFex and RFre1 to RFre5, the phase 4) for the RF excitation pulse RFex is set to 00, and that for the RF refocusing pulses RFre1 to REre5 is set to 90°. As for a flip angle 0 by which the magnetization of spins is leveled by an RF pulse, the flip angle 0 by the RF excitation pulse RFex is a (generally 90° ), and those 0 by the RF refocusing pulses RFre1 to RFre5 are 131 to B5 (generally 1800). In either FIG. 1 or 2, a CPMG pulse sequence is used to generate a plurality of echoes. Phase-encoding of a different quantity is then performed on each of the echoes (a phase-encoding gradient pulse (Gpe) of a different strength (pulse area) is applied to each of the echoes), and thus echo data required to reconstruct a one-frame image is acquired. Thus, compared with a known spin echo technique, this technique requires one-fifth or -sixth or one-hundredth of the scan time needed for spin echo imaging.

For a pulse sequence using a plurality of RF refocusing pulses; such as, the CPIVIG pulse sequence and phase reversal CP pulse sequence, it is certain that each echo acquired between RF refocusing pulses is a total sum of echo components depicted to trace a plurality of paths on a phase diagram (Refer to, for example, literature 2 "Journal of Magnetic Resonance Imaging" (Vol.78, P.397–407, 1988) and literature 3 "Magnetic Resonance in Medicine" (Vol.30, P.183–191, 1993)).

For using these pulse sequences, a phase shift exhibiting a different spatial distribution occurs in each echo component because of such major causes as eddy currents that are derived from switching of gradient pulses and induced in a conductor of an MRI system, an error in a gradient coil caused during manufacturing, and imperfect calibration of any other facility of the MRI system. This is described particularly in, for example, patent publication 1, Japanese Patent Laid-Open No. 6-1 21 777; patent publication 2, Japanese Patent Laid-Open No. 6-54827; and patent publication 3, U.S. Pat. No. 5,378,985. Consequently, ghost artifacts may occur in a direction of phase-encoding in a reconstructed image, a signal level for an image may decrease locally, a signal-to-noise ratio for a whole image may deteriorate, or any other phenomenon may occur. This results in markedly deteriorated image quality. This drawback becomes outstanding in, especially, imaging with a high spatial resolution in which the strength of a gradient pulse must be varied greatly during a short switching time, or imaging in which a great many echoes are acquired.

One of the techniques for resolving the drawback of deteriorated image quality (first prior art) is described in the aforesaid patent publication 3; U.S. Pat. No. 5,378,985. Prior to an actual diagnostic scan (hereinafter simply a scan) intended to acquire data of an MR image from a patient, a scan referred to as a prescan is carried out. In the prescan, scanning is performed with the strength of a phase-encoding gradient pulse made nil. Each of the resultant echoes is subjected to a one-dimensional Fourier transform. Zero-order and first-order components of a resultant phase distribution are calculated as correction data, whereby waveforms of gradient pulses to be applied during the scan and phases by which rotation is made with applications of RF pulses (hereinafter application phases) are corrected. The application phase is, as shown in FIG. 3, expressed as a phase φ of a magnetization M, which is rotated with application of an RF pulse, with respect to an axis of coordinates serving as a reference on $X^1$ and $Y^1$ planes in a rotary coordinate system $X^1, Y^1, Z^1$.

Incidentally, it has been found that an imaging technique using a pulse sequence composed of a plurality of RF refocusing pulses, such as the CPMG pulse sequence or phase reversal CP pulse sequence, has another physical nature. That is to say, when a transverse magnetization undergoes a phase error between applications of an RF excitation pulse and a first RF refocusing pulse or a transverse magnetization undergoes a phase error of the same magnitude between applications of adjoining RF refocusing pulses succeeding the first RF refocusing pulse, each echo (total sum of echo components depicted to trace a plurality of paths) is split into two groups of echoes. This nature is described in, for example, literature 4 "Magnetic Resonance in Medicine" (Vol.30, P.251–255, 1993).

When the RARE or GRASE pulse sequence or any other pulse sequencers used, as described previously, since a gradient pulse having substantially the same waveform is applied repeatedly, not only the gradient pulse but also an eddy magnetic field that has the nature of being proportional in strength to a gradient pulse causes a phase error based on the pulse repetition pattern. This presumably results in the split into two groups of echo components. Consequently, a pattern of phase shifts (regarded as phase error components) of echoes and quality deterioration in a reconstructed image can be thought approximatively to attribute to the cross-interference between two groups of echo components.

Assuming that a phase error occurring in the transverse magnetization of nuclear spins between applications of a RF excitation pulse and a first RF refocusing pulse is $\Delta\phi1$, a phase error occurring uniformly in the transverse magnetization between applications of adjoining RF refocusing pulses succeeding the first RF refocusing pulse is $\Delta\phi2$, one of two groups of echo components observed between applications of the n-th and n+1-th RF refocusing pulses, which includes echo components depicted to trace paths along which the echo components are refocused by all RF refocusing pulses, is regarded as a main echo component Emain (n), and the other echo group of echo components is regarded as a sub-echo component Esub(n). The phases of both the echo components Emain(n) and Esub(n) are expressed as follows:

$$\arg\{E\text{main}(n)\}=(-1)^n\cdot\Delta\phi(1)+\{1+(-1)^{n-1}\}/2\cdot\Delta\phi(2) \quad (1)$$

$$\arg\{E\text{sub}(n)\}=(-1)^{n-1}\cdot\Delta\phi(1)+\{1+(-1)^n\}/2\cdot\Delta\phi(2) \quad (2)$$

The echo components of an echo stemming from each point in a scan area have the above relationship of coincidence. The phases of (observed) echoes each of which is a total sum of the echo components, or the magnitudes of phase variances indicating degrees of phase dispersion have the same relationship of coincidence. FIG. 4 is a phase diagram for explaining graphically a change in magnitude of a phase variance of each echo occurring due to a readout magnetic field gradient between applications of RF refocusing pulses. The axis of ordinates of the drawing indicates the magnitude (relative value) of a phase variance of each echo caused by a readout magnetic field gradient. For better depiction of paths in the drawing indicating changes of echo components exhibiting the same phase variance, a time integral value of a readout magnetic field gradient to be applied between an RIF excitation pulse and a first RF refocusing pulse is intentionally increased by AA over a normal value A (which is a half of a pulse length B in the drawing). As described in the aforesaid literature 2, a transverse magnetization component (i.e., echo component) exhibiting a certain phase variance is known to be split into three components; a transverse magnetization component whose phase variance is reversed, a transverse magnetization component whose phase variance is not reversed, and a component preserved as a longitudinal magnetization by an RF refocusing pulse. An application spacing of succeeding RF refocusing pulses and waveforms of applied magnetic field gradients are so regular that echo components depicted to trace several paths on the phase diagram are superposed on one another because of an equal magnitude of a phase variance. As illustrated, a regular pattern of variances is created. In the drawing, bold lines indicate a group of echo components that are in phase with the main echo component Emain. Thin lines indicate a group of echoes that are in phase with the sub-echo component Esub. During an echo acquisition period, most of the echo components whose magnitudes of phase variances are spreading greatly in a positive or negative direction are in a so-called spoiled state in which the echo components cannot be observed as an echo because of the phase interference among spins associated with echo components of the group to which the echo components belong. Consequently, a portion of echo components actually acquired as an echo is an area indicated by an arrow in the drawing (components exhibiting a phase variance of nil during data acquisition).

On the other hand, when the phase of an echo is discussed, since the phases of echoes and the application phases for RF pulses each have the relationship of coincidence, assuming that the conditions of application phases for the CPMG pulse sequence or phase reversal CP pulse sequence are met and there is not an error between phases of spins deriving from imperfect hardware, the phases of the main echo component Emain(n) and sub-echo component Esub(n) coincide with each other. An actually-acquired echo is a sum of both the echo components and expressed as follows:
E(n)=Emain(n)+Esub(n)
The $\Delta A$ value in FIG. 4 is sufficiently small even in an unadjusted state, the peaks of the two echo components are often seen coincident with each other.

Incidentally, it has been verified that the amplitudes of both the echo components Emain(n) and Esub(n) are dependent on the number of RF refocusing pulses n, the slice-dependent characteristic of an RF pulse, and a flip angle (Refer to, for example, literature 5 and literature 6 "Society of Magnetic Resonance in Medicine, Pro. of Annual Meeting in 1992 No. 4508 and in 1991 No. 1025").

As long as the ratio R(n) of the amplitude of the echo component Emain(n) to that of Esub(n) is unknown, a phase error cannot be detected in an acquired echo.

Under these circumstances, another prior art reference (second prior art) for resolving the aforesaid drawback has been disclosed in relation to a magnetic resonance imaging method and system in patent publication 2; Japanese Patent Laid-Open No. 6-54827. Correction of the disclosure is expressed using the same symbols as those used above as follows:
Esub(1)=0
When the flip angle caused by a first RF refocusing pulse is 180°,
Esub(2)=almost zero
Consequently,
E(1)=Emain(1), E(2)=Emain(2)
$\arg\{E(2)\}-\arg\{E(1)\}=2\cdot\Delta\phi(1)-A\phi(2)$.
Using this expression, waveforms of magnetic field gradients and application phases for RF pulses, which are set for a scan, are corrected on the basis of only the information given by a first echo and second echo acquired during a prescan that is performed in the same manner as the aforesaid one. An attempt is thus made to achieve correction relatively simply.

The second prior art will be described in conjunction with FIGS. 5 to 7. FIG. 5 shows a pulse sequence used for a prescan. FIG. 6 shows a pulse sequence used for a scan. FIG. 7 is a flowchart describing correction.

As described in FIG. 7, first, a prescan is executed according to a pulse sequence shown in FIG. 5 (step 101). During the prescan, a phase-encoding magnetic field gradient is always nil (Gpe=O). If dephasing occurs for some reasons, as illustrated, each echo except a first echo E(1) is split into two echo components Emain(n) and Esub(n). In reality, a shift between two echo components Emain(n) and Esub(n) is so small that the peak of an echo is not halved. A displacement p(n) and phase shift $\phi(n)$ of an echo peak vary alternately echo by echo as if echoes vibrated. According to the second prior art, displacements p(1) and p(2) of echo peaks and phase shifts $\phi(1)$ and $\phi(2)$ of first and second echoes E(1) and E(2) are measured (step 102). Assuming that a distance of a selected slice plane from a positional center of a magnetic field is xs, a quantity of correcting an application phase for RF pulses, $\Delta\phi$, (or $\Delta$Gss*xs when a quantity $\Delta$Gss of correcting a slice-selective gradient pulse Gss is taken into consideration) is proportional to a difference between the phase shifts $\phi(1)$ and $\phi(2)$. A $\Delta$Gro value is proportional to a difference between the displacements p(1) and p(2). Based on this relationship, the measured p(1), p(2), Δ(1), and Δ(2) values are used to calculate either the quantity ΔGro of correcting an application phase for RF pulses or the quantity ΔGss of correcting a slice-selective gradient pulse Gss, and the quantity ΔGro of correcting a readout gradient pulse Gro (step 103). Thereafter, the pulse sequence is corrected by these quantities of correction Δφ(or ΔGss) and ΔGro (See FIG. 6). A scan is then executed according to the resultant pulse sequence (step 104).

The aforesaid first and second prior art references attempt to resolve the drawback of artifacts occurring in a phase-encoding direction attributable to phase shifts of respective echoes exhibiting different spatial distributions. There are still the following problems that must be solved:

(1) First, there is a problem that if the flip angle caused by an RF refocusing pulse is deviated from 180°, precision in correcting application phases for RF pulses and waveforms of magnetic field gradients for successful execution of a scan decreases.

For example, when Emain(n) equals Esub(n), however large a phase difference between the two echo components Emain(n) and Esub(n) is, the phase of an echo, that is, a sum of vectors representing the two echo components Emain(n) and Esub(n) and that is acquired as the n-th echo, does not vary. For this reason, whichever of the techniques of the first and second prior art references is implemented, correction cannot be achieved properly. The quality of MR images does not improve at all, or the improvement is insufficient.

The situation that a flip angle deviates from or is intentionally deviated from 180° is not at all special. For example, as described even in the aforesaid literature 5 "Society of Magnetic Resonance in Medicine, Pro. of Annual Meeting in 1992 No. 4508," it has been reported that even when the existing fast SE (FSE) imaging is employed, the echo components Emain(n) and sub-echo component Esub(n) of any of the fourth to eighth echoes have substantially the same amplitude. Moreover, literature 3 "Magnetic Resonance in Medicine" (Vol.30, P. 183–191, 1993) describes that slice-dependent characteristics of RF refocusing pulses and flip angles caused by them are made different from one another in order to stabilize the amplitudes of echoes. Furthermore, an attempt of using this art to reduce the decay of each echo in a transverse relaxation time T2 has been reported (Refer to "Society of Magnetic Resonance, Pro. of 2nd Annual Meeting in 1994 No. 27"). Furthermore, there is a report saying that as far as multiple slice imaging is concerned, when the flip angle to be caused by an RF refocusing pulse is set to a value of 180° or smaller, an SAR (RF exposure) can be diminished and a change in tissue contrast deriving from an MTC effect can be reduced (Refer to "Society of Magnetic Resonance in Medicine, Pro. of Annual Meeting in 1993 No.1244").

As described above, the flip angle caused by an RF refocusing pulse often deviates from 180°. Even if correction in accordance with the aforesaid first or second prior art references is performed under these circumstances, correction is achieved insufficiently in terms of precision and stability.

This problem has been pointed out in the aforesaid patent publication 2; Japanese Patent Laid-Open No. 6-54827 (Refer to the 18th to 27th lines in page 11). The patent publication provides a method for avoiding the problem by dephasing one echo component using a slice-selective magnetic field gradient. However, there is a problem that since the waveforms of gradient pulses are deformed, the method is prone to the influence of imperfect calibration of a system. The method is therefore often unsuitable for automation of sequence adjustment.

(2) The second problem is that any existing method can correct phase shifts attributable to only some of a plurality of factors but cannot correct phase shifts attributable to all of them. Even in the aforesaid first or second prior art references, a phase-encoding gradient pulse Gpe to be applied during a prescan is always nil. Echoes given by the prescan do not contain a dephased component attributable to a phase-encoding gradient pulse to be applied during a scan. In other words, a) a phase shift of a phase-encoding gradient pulse itself and b) a phase shift exhibiting zero-order or first- or higher-order spatial distribution and deriving from an eddy magnetic field induced by a phase-encoding gradient pulse cannot be corrected from the viewpoint of principles. The advancement of a spatial resolution for a scan and the speedup of the scan are progressing. For some kinds of pulse sequences, a dephased component attributable to a phase-encoding magnetic field gradient cannot therefore be ignored at present. This restriction on correction must be lifted.

(3) The third problem is that the precision of a correction value varies depending on the state of an object of scanning. In the aforesaid first or second prior art references, correction information is acquired on the basis of echoes stemming from an object of scanning. An accurate phase error (i.e., phase shift) cannot be measured depending on the shape or state of the object of scanning. This poses a problem in terms of correction stability.

Taking a diagnostic system for medical use for instance, a main signal source providing a T2-weighted image of an axial plane of the cervical vertebrae is cerebral spinal fluid (CSF) flowing in a direction substantially perpendicular to a section. A change occurs in the phases of nuclear spins, which have influenced a flow velocity, due to gradient pulses employed in a pulse sequence. When an attempt is made to correct the phase change according to a technique provided by the first or second prior art references, since the phase change emerges substantially in its entirety during a prescan, quantities of correction given by the prescan are devoid of accuracy and low in reliability. An intended phase change may be mistakenly corrected. Thus, the technique is low in correction precision and poor in stability. Consequently, artifacts may appear in an image of a region in which nuclear spins are still or a signal level for the image may decrease. This eventually leads to degradation of a signal-to-noise ratio or other drawback. Moreover, when a region producing high-level echoes makes a violent motion, image quality may deteriorate. This may be unavoidable to some extent for a correction technique characterized in that correction information (quantities of correction) used to correct a pulse sequence to be employed in a scan is acquired in advance from an object of scanning whose shape or state is unknown. However, it poses a problem in terms of clinical diagnosis.

SUMMARY OF THE INVENTION

The present invention attempts to solve the aforesaid drawbacks and problems.

(1) The first object of the present invention is to realize magnetic resonance imaging that preconditions execution of the process for calculating quantities of correction needed to correct a pulse sequence to be employed in a scan by executing a prescan, and to provide an automatic correction method for an MRI pulse sequence and an MRI system which can execute a prescan in a manner that is more durable to a variation of flip angle caused by an RF refocusing pulse and more stable than a conventional manner, can correct a pulse sequence employed in a scan with higher precision, and can suppress deterioration in image quality of reconstructed MR images.

Moreover, (2) the second object of the present invention is to realize magnetic resonance imaging that preconditions execution of the process for calculating quantities of correction needed to correct a pulse sequence to be employed in a scan by executing a prescan, wherein a dephased component attributable to a phase-encoding gradient pulse can be corrected with high precision and thus the image quality of reconstructed MR images can be improved.

Moreover, (3) the third object of the present invention is to realize magnetic resonance imaging that preconditions execution of the process for calculating quantities of correction needed to correct a pulse sequence to be employed in a scan by executing a prescan, wherein even when a major signal source is moving at a high speed, the decrease of the precision in correcting a pulse sequence to be employed in a scan can be prevented and the deterioration in image quality of reconstructed MR images can be suppressed.

Furthermore, (4) the fourth object of the present invention is to provide an MR imaging method and MR[ system which can accomplish the first to third objects at a time without the necessity of correcting a pulse sequence to be employed in a scan using correction data given by a prescan.

In short, an object of the present invention is to accomplish at least one of the foregoing first to fourth objects, and to realize imaging using a pulse sequence composed of a plurality of RF refocusing pulses; such as, a CPMG pulse sequence, phase reversal CP pulse sequence, or the like, wherein acquisition and correction of necessary correction information are performed more systematically than they are conventionally in order to improve the precision and stability of correction, or the influence of phase error distribution is avoided by means of any approach other than the correction, and thus MR images that are of high quality in terms of spatial resolution, ghost artifacts, and image contrast are produced.

In order to accomplish the above objects, according to one aspect of the present invention, there is provided a method of correcting in a magnetic resonance imaging (MRI) process an imaging pulse sequence magnetically applied by an imaging scan to an object to be imaged in order to obtain a magnetic resonance (MR) image, the method comprising the steps of: performing a first prescan applied to the object with a first preliminary pulse sequence including a first RIF excitation pulse and a plurality of first RF refocusing pulses each of which has an application phase set to a specified phase value, thereby the first prescan provides a first echo data group consisting of a plurality of echoes responsive to the plurality of first RF refocusing pulses; performing a second prescan applied to the object with a second preliminary pulse sequence including a second RF excitation pulse and a plurality of second RF refocusing pulses of which even-numbered second RF refocusing pulses are given with an application phase set to another specified phase value differed by 180° from the specified phase value, thereby the second prescan providing a second echo data group consisting of a plurality of echoes responsive to the plurality of second RF refocusing pulses; and correcting the imaging pulse sequence on the basis of the first and second echo data groups prior to the imaging scan.

It is preferred that each of the first and second preliminary pulse sequences and the imaging pulse sequence is formed on either one of a CPMG pulse train and a phase reversal CP pulse train.

It is preferred that each of the first and second preliminary pulse sequences and the imaging pulse sequence is formed in accordance with a GRASE sequence and a fast SE sequence.

It is also preferred that a phase encode gradient is set to zero in each of the first and second preliminary pulse sequences.

In this case, preferably, the correcting step further comprises the steps of: separating and extracting from the first and second echo data groups a main ecno data family consisting of a main echo component and a sub-echo data family consisting of components other than the main echo component by at least either one of addition and subtraction executed between two sets of echo data each belonging to a specified echo mapping block common to the first and second echo data groups; obtaining correction data on the basis of the main echo and sub-echo data families; and correcting the imaging pulse sequence using the correction data.

Still preferably, the correcting step further comprises the steps of: separating and extracting from the first and second echo data groups a main echo data family consisting of a main echo component and a sub-echo data family consisting of components other than the main echo component by at least either one of addition and subtraction executed between two sets of echo data each belonging to a specified echo mapping block common to the first and second echo data groups; computing a phase shift and a position displacement of echo peaks formed by echo data sets odd-numbered and even-numbered in at least either one of the main echo and sub-echo data families; obtaining a correction data on the basis of at least either one of the phase shift and the position displacement; and correcting the imaging pulse sequence using the correction data.

Still it is preferred that the correcting step further comprises the steps of: separating and extracting from the first and second echo data groups a main echo data family consisting of a main echo component and a sub-echo data family consisting of components other than the main echo component by at least either one of addition and subtraction executed between two sets of echo data each belonging to a specified echo mapping block common to the first and second echo data groups; comparing with each other either one of zero-th order and first-order phase distributions of two sets of echo data sampled at least partly from each of the main echo and sub-echo data families; obtaining a correction data on the basis of compared results in the comparing step; and correcting the imaging pulse sequence using the correction data.

Preferably, the object to be imaged is different when performing the first and second prescans and in performing the imaging scan, the object being a phantom in performing the first and second prescans.

Further preferably, the correcting step further comprises the steps of: first obtaining inherent phase error information for a combination of imaging channels and physical channels of gradient coils on the basis of the first and second echo data groups; second obtaining imaging condition information associated with gradients; and computing a correction data used for correcting the imaging pulse sequence using the inherent phase error information and the imaging condition information.

For example, the specified application phase value is 90° and another specified application phase value is 270°.

According to another aspect of the present invention, there is provided a method of magnetic resonance imaging by which an MR echo data is emanated from an object to be imaged, the method comprising the steps of: first performing a first imaging scan to the object with a first imaging pulse sequence including an RF excitation pulse, a plurality of RF refocusing pulses each having an application phase set to a first specified phase value, and a phase encode gradient phase-encoding in a k-space in which the echo data are mapped, thereby the first imaging scan provides a first echo data group; second performing a second imaging scan to the object with a second imaging pulse sequence including an RF excitation pulse, a plurality of RF refocusing pulses of which even-numbered RF refocusing pulse each has an application phase set to a second specified phase value differed by 180° from the first specified phase value, and a phase encode gradient phase-encoding in another k-space, thereby the second imaging scan provides a second echo data group; separating and extracting from the first and second echo data groups a first k-space data being mapped over a plurality of mapping blocks of the k-space and consisting of a group of main echo components and a second k-space data being mapped over a plurality of mapping blocks of the k-space and consisting of a group of echo components other than the main echo components by performing addition and subtraction between the first and second echo data groups; exchanging to each other and block by block echo data positioned at either one of an even-numbered mapping block of the first and second k-space data and an odd-numbered mapping block of the first and second k-space data; reconstructing each of the first and second k-space data which has been data-exchanged in the exchanging step, thereby two real-space MR images are provided; and producing a single real-space MR image from the two real-space MR images.

For example, the exchanging step is composed of a step exchanging block by block echo data residing in either of an even-numbered and an odd-numbered echo mapping blocks for mapping an echo signal emanating from an interval formed between an adjacent two of the plurality of RF refocusing pulses applied by each of the first and second imaging scans.

As another preferred example, the imaging method further comprises the steps of: third performing a first prescan to the object with a first preliminary pulse sequence including an RF excitation pulse and a plurality of RF refocusing pulses each having an application phase set to a third specified phase value, thereby the first prescan provides a third echo data group; fourth performing a second prescan to the object with a second preliminary pulse sequence including an RF excitation pulse and a plurality of RF refocusing pulses of which even-numbered RF refocusing pulses each has an application phase set to a fourth specified phase value differing by 180° from the third specified phase value, thereby the second prescan provides a fourth echo data group; second separating and extracting first amplitude information of a first group consisting of a main echo component and second amplitude information of a second group consisting of an echo component other than the main echo component by performing addition and subtraction between the third and fourth echo data groups; and correcting amplitudes of each of the first and second k-space data using each of the first and second amplitude information, the amplitude correcting step being interposed between the k-space data reconstructing step and the single real-space MR image producing step.

Preferably, the single real-space MR image producing step includes a step for equalizing phases of each pair of pixel signals residing at the same positions common to two sample areas selected from entire areas of the two real-space MR images, respectively, with absolute values of the pixel signals unchanged.

As still another aspect of the present invention, provided is a system for magnetic resonance imaging (MRI) in which an imaging pulse sequence is magnetically applied to an object to be imaged by an imaging scan, the system comprising: first means for performing a first prescan to the object with a first preliminary pulse sequence including an RIF excitation pulse and a plurality of RIF refocusing pulses each having an application phase set to a first specified value, thereby the first prescan provides a first echo data group; second means for performing a second prescan to the object with a second preliminary pulse sequence including an RF excitation pulse and a plurality of RIF refocusing pulses of which even-numbered RIF refocusing pulses have an application phase set to a second specified value differing by 1800 from the first specified value, thereby the second prescan provides a second echo data group; and means for correcting the imaging pulse sequence on the basis of the first and second echo data groups prior to the imaging scan.

DETAILED DESCRIPTION OF THE PREFERRED EMBODIMENTS

Various embodiments of the present invention will be described below with reference to the drawings. The relationship of correspondence between the embodiments to be described in detail below and the first to fourth objects of the present invention will be described.

A first embodiment attempts to accomplish the first object. A second and third embodiments attempt to accomplish the second object. A fourth embodiment also attempts to accomplish the second object. A fifth and sixth embodiments attempt to accomplish the third object. A seventh embodiment attempts to accomplish the fourth object.

(First Embodiment)

The first embodiment of the present invention will be described in conjunction with FIGS. 8 to 15.

Figure 8:
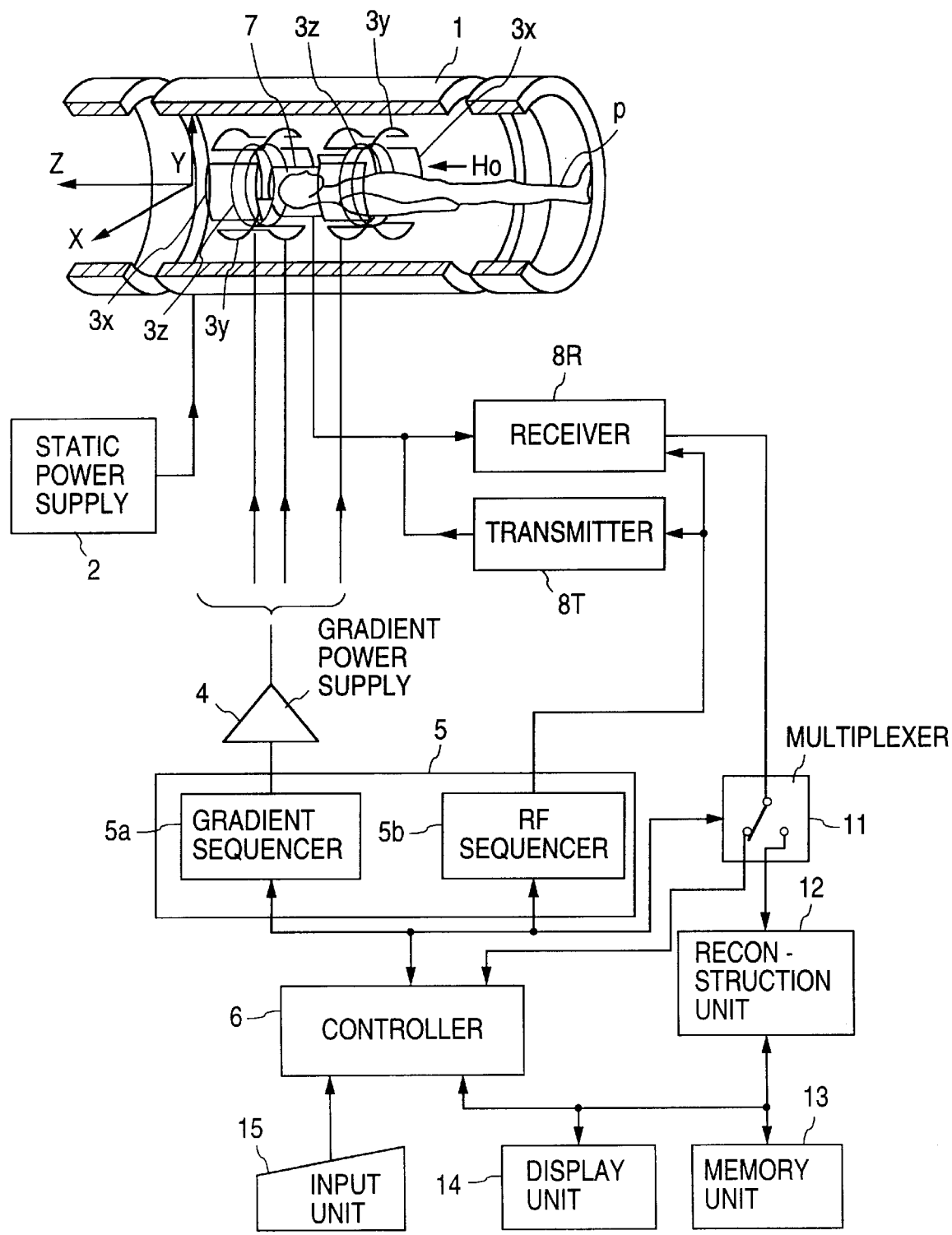
FIG. 8 is a block diagram showing an MRI system employed in embodiments in accordance with the present invention.

FIG. 8 shows the outline configuration of a magnetic resonance imaging (MRI) system in accordance with this embodiment and the other embodiments described later. The MRI system comprises a magnet unit for generating a static magnetic field, a magnetic field gradient unit for appending position information to the static magnetic field, a transmitting and receiving unit for receiving selective excitation and MR signals, and a control and arithmetic unit responsible for system control and image reconstruction.

The magnet unit includes a magnet 1 that is, for example, of a superconducting type, and a static power supply 2 for supplying a current to the magnet 1, and generates a static magnetic field $H_o$ in a Z-axis direction in a cylindrical diagnostic space into which a patient P or an object of scanning is inserted.

The magnetic field gradient unit includes three sets of gradient coils 3x to 3z that are incorporated in the magnet 1 and designed to produce magnetic field gradients that change in strength in X-axis, Y-axis, and Z-axis directions, a gradient power supply 4 for supplying a current to the gradient coils 3x to 3z, and a gradient sequencer 5a for controlling the power supply 4. The gradient sequencer 5a includes a computer. When receiving a signal commanding an acquisition pulse sequence used to execute a prescan and a scan; such as, an FSE or GRASE pulse sequence from a controller 5 responsible for control of the entire system (including a computer), the gradient sequencer 5a executes processing described in FIG. 9 in response to the command. The gradient sequencer 5a thus controls the applications and strengths of magnetic field gradients that change in strength in the X-axis, Y-axis, and Z-axis directions according to the commanded pulse sequence, so that the magnetic field gradients can be superposed on the static magnetic field $H_o$. In this embodiment, a magnetic field gradient changing in strength in the Z-axis direction of three axial directions that are orthogonal to one another is regarded as a slice-selective magnetic field gradient $G_S$. A magnetic field gradient changing in the X-axis direction is regarded as a readout magnetic field gradient $G_R$. A magnetic field gradient changing in the Y-axis direction is regarded as a phase-encoding magnetic field gradient $G_E$.

The transmitting and receiving unit includes an RF coil 7 placed in the vicinity of the patient P in the scanning space within the magnet 1, a transmitter 8T and receiver 8R connected to the RF coil 7, and an RF sequencer 5b (including a computer) for controlling the timing of operating the transmitter 8T and receiver 8R. The RF sequencer 5b and gradient sequencer 5a constitute a sequencer 5. The RF sequencer 5b can command application of an RF pulse in a state synchronous with the gradient sequencer 5a. The transmitter 8T and receiver 8R supply a pulsating RF current with a Larmor frequency at which nuclear magnetic resonance (NMR) can be excited under the control of the RF sequencer 5b. Besides, the transmitter 8T and receiver 8R perform various kinds of signal processing on an MR signal (RF signal) received by the RF coil 7 to produce an echo.

Furthermore, the control and arithmetic unit includes the controller 6 as well as a multiplexer 11 for receiving an echo that is a digital quantity produced by the receiver 8R. The multiplexer 11 switches over its output path selectively to the controller or reconstruction unit in response to a control signal sent from the controller 6. Furthermore, a reconstruction unit 12 for reconstructing an image by performing a Fourier transform, a memory unit 13 for storing reconstructed image data, a display unit 14 for displaying an image, and an input unit 15 are located on one output stage of the multiplexer 11. The controller 6 includes, as mentioned above, a computer so as to control the contents and timing of operations of the entire system.

Next, the operations of this embodiment will be described. Herein, a FSE (fast SE) pulse sequence is adopted.

Figure 9:
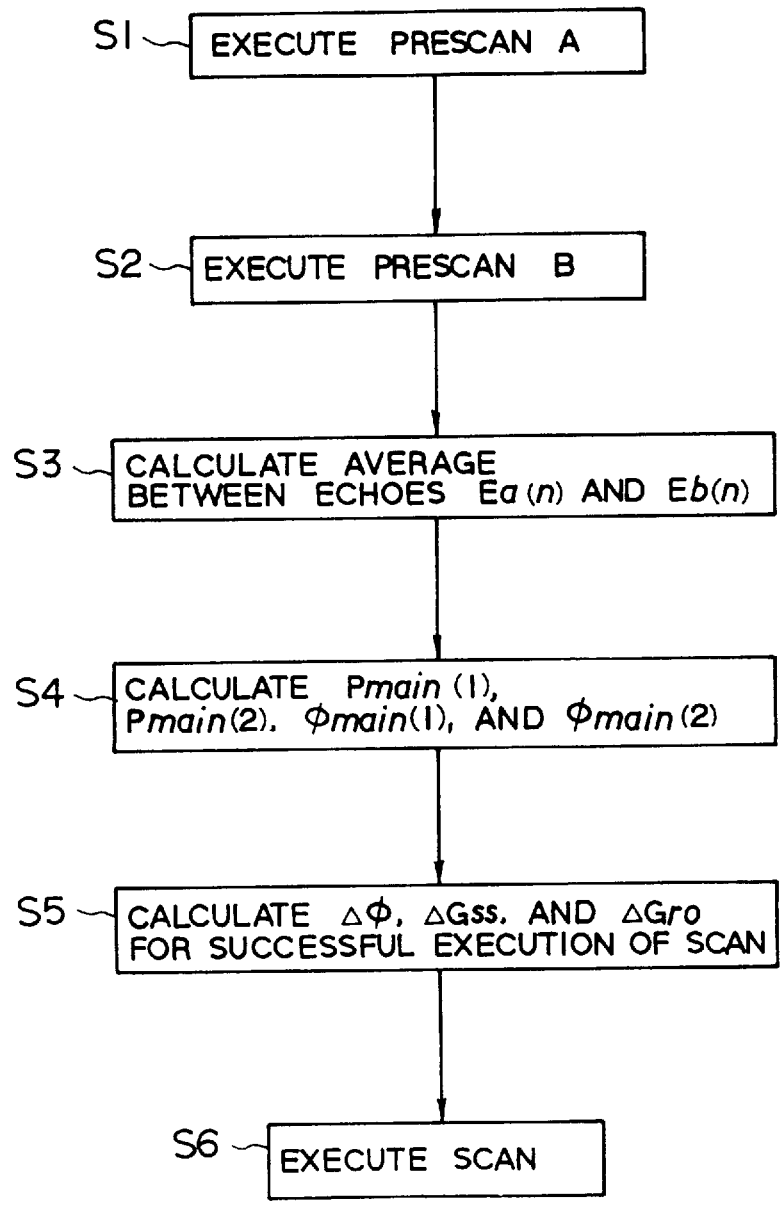
FIG. 9 is a flowchart showing processing executed by a controller in a first embodiment of the present invention.

The controller 6 executes the processing described in FIG. 9. This processing includes two kinds of prescans A and B. First, the controller 6 switches over the switch path of the multiplexer 11 to the controller 6, allows the sequencer 5 to execute prescan A according to a pulse sequence shown in FIG. 10, and inputs resultant echoes (step S1 in FIG. 9).

During prescan A, first, an RF excitation pulse RFex (application phase $\phi=0°$, flip angle $\theta=a$ (90° in this example)) is applied together with a slice-selective gradient pulse Gss. In a time $\tau/2$, a first RF refocusing pulse RFre1 (application phase $\phi=90°$, flip angle $\theta=\beta 1$ (180° in this example) is applied together with a slice-selective gradient pulse Gss. In a time $\tau$ after the application of the first RF excitation pulse RFex, an echo E(1) is read out along with application of a readout gradient pulse Gro. Thereafter, second and subsequent RF refocusing pulses RFre2, RFre3, etc. are applied together with a slice-selective gradient pulse Gss at intervals of a time $\tau$ after the application of the first RF refocusing pulse RFre1. Echoes E(2), E(3), etc. are read out in the same manner. In the prescan A, as illustrated, a phase-encoding gradient pulse Gpe is always nil.

In prescan A, if nuclear spins are dephased for some reasons, as mentioned above, each of the echoes E(2), E(3), etc. except the first echo E(1) is split into two echo components; that is, a main echo component Emain(2) (Emain (3), etc.) and a sub-echo component Esub(2) (Esub(3), etc.) (See FIG. 10). When there is no cause of dephasing, the phase arg{Emain(n)} of the main echo component Emain(n) and the phase arg{Esub(n)} of the sub-echo component Esub(n) are coincident with each other (n=2, 3, etc.).

Figure 11:
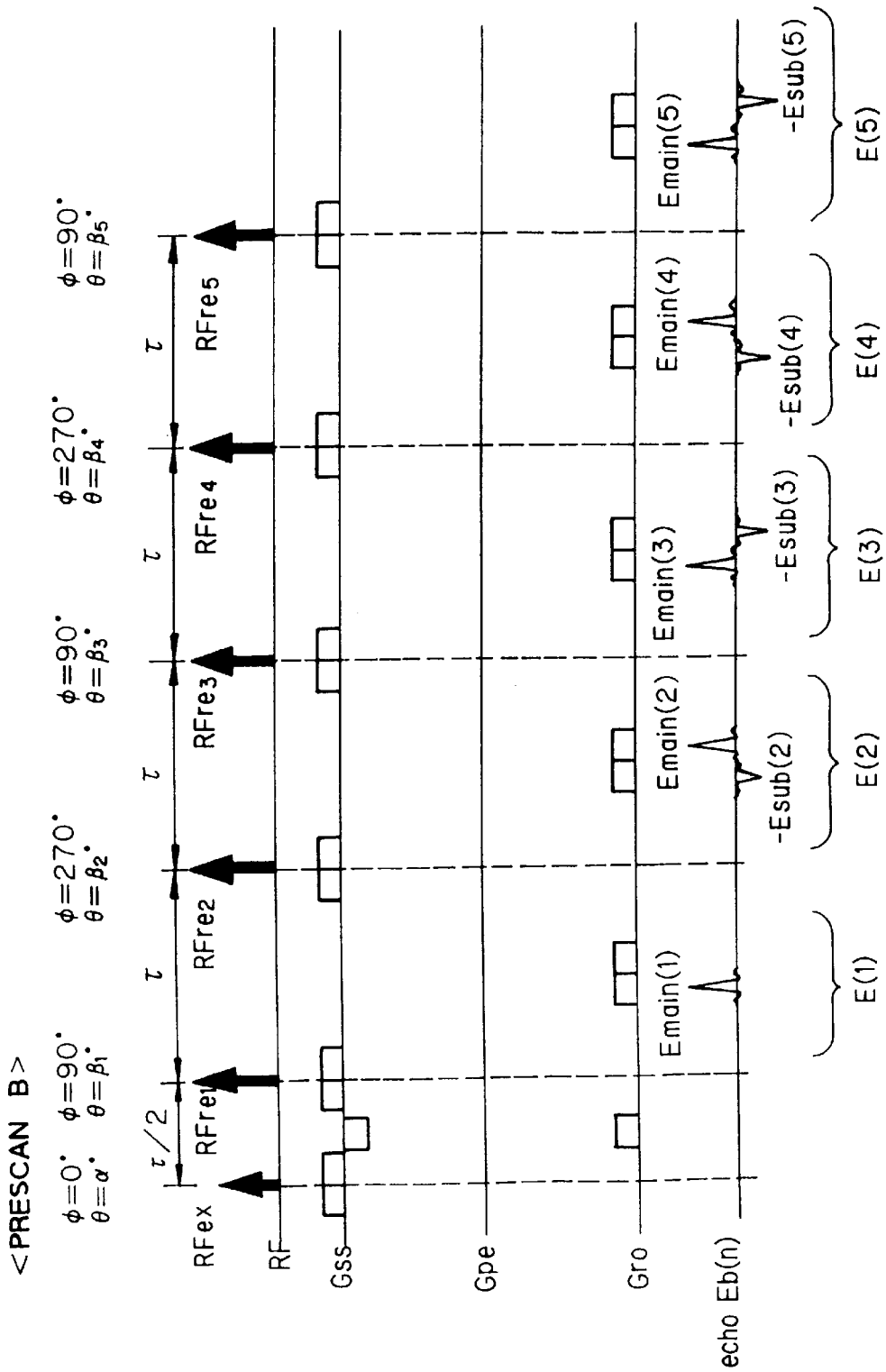
FIG. 11 is a pulse sequence illustrating the other prescan B in the first embodiment.
Figure 12A:
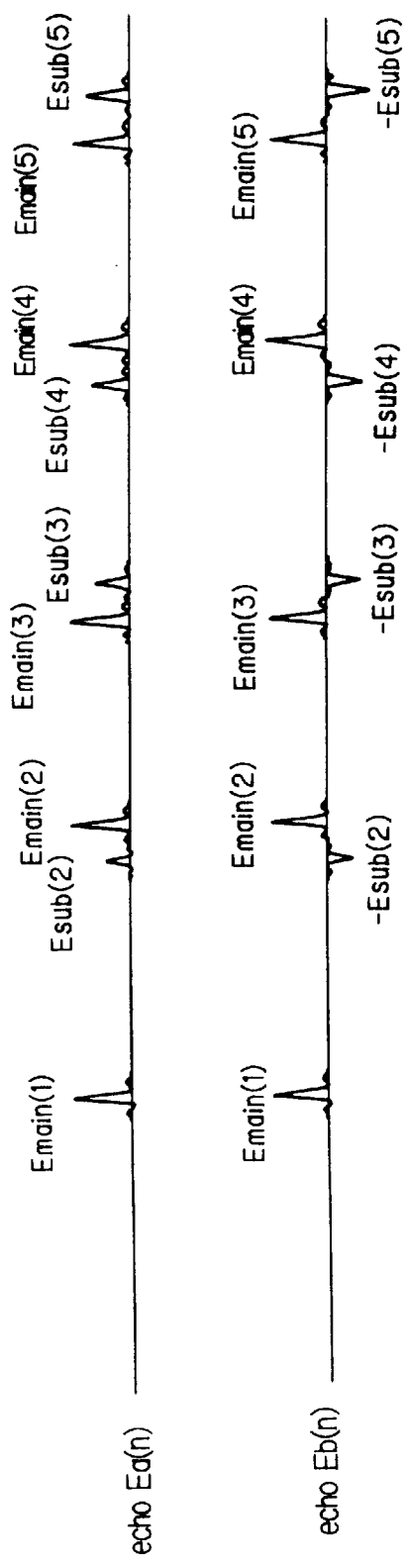
FIGS. 12A and 12B are illustrations of separation and extraction of a main echo component.
Figure 12B:
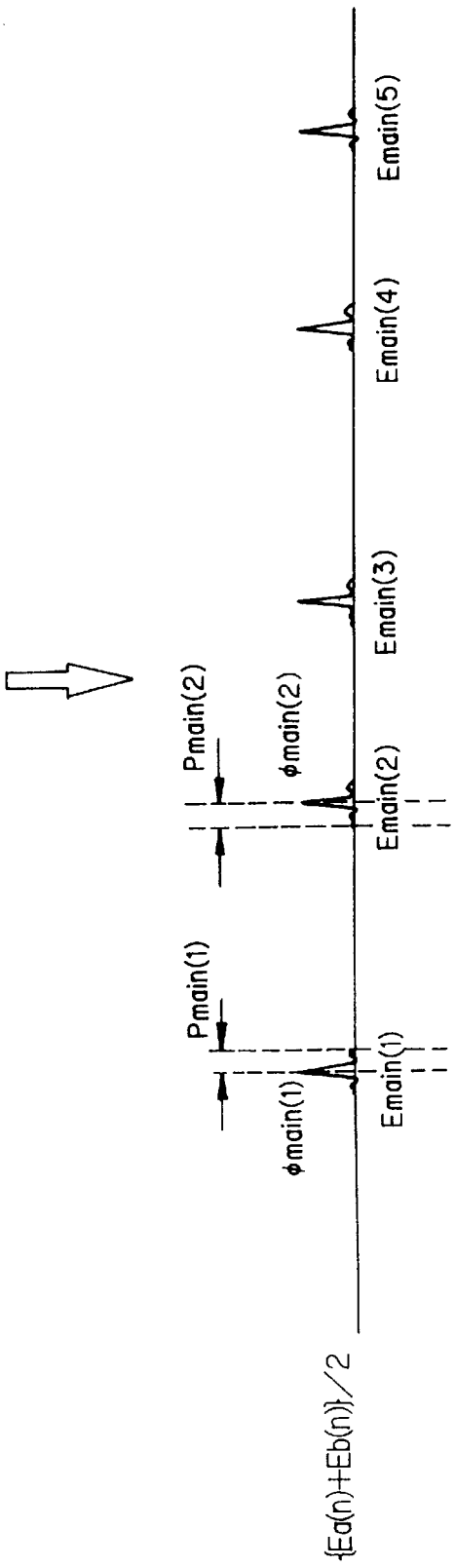
Figure 13:
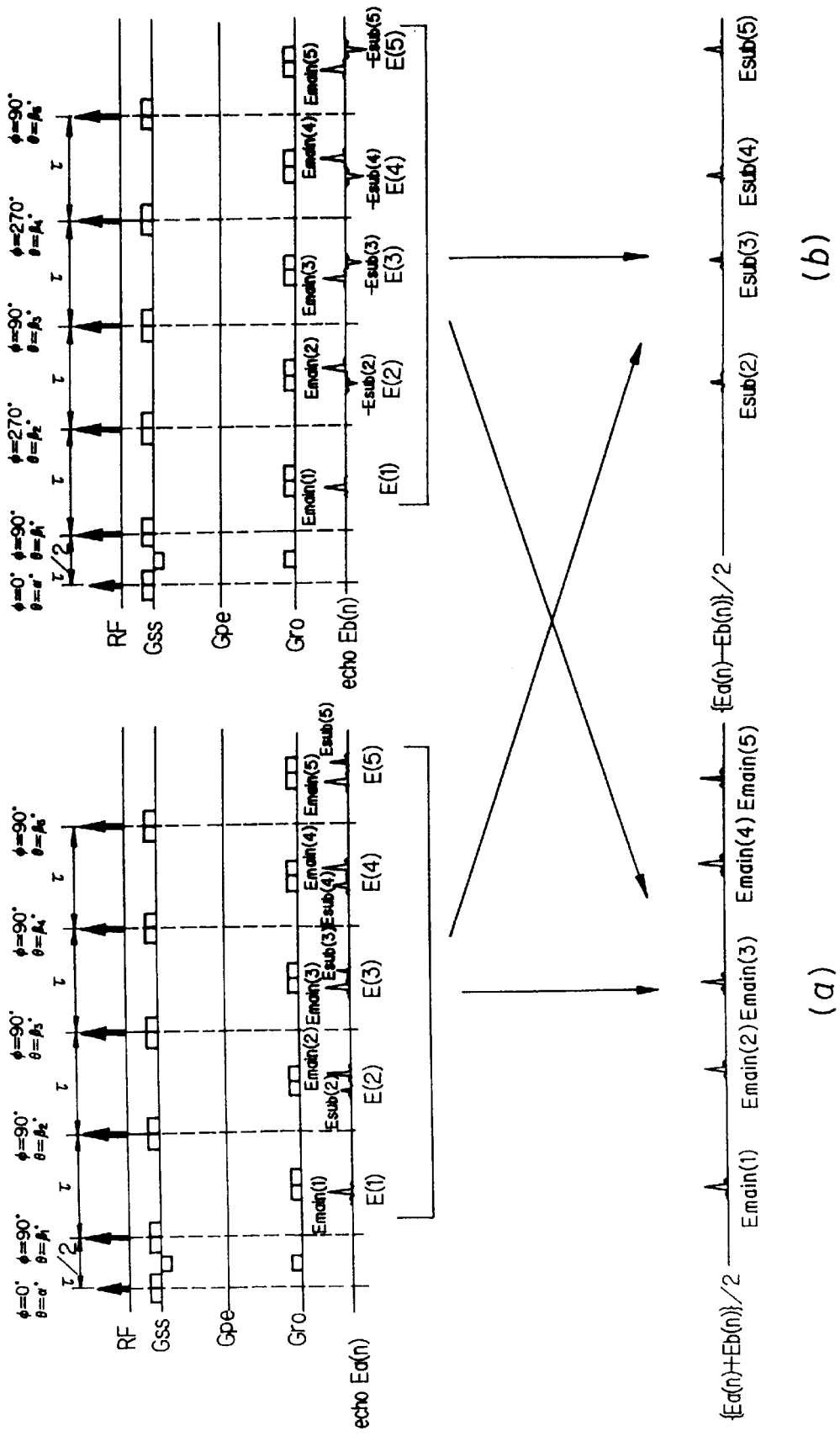
FIG. 13 is an illustration of a separation and extraction of main echo and sub-echo components.

The controller 6 then allows the sequencer 5 to execute the second prescan B shown in FIG. 11 and inputs resultant echoes (step S2 in FIG. 9).

Even during prescan B, first, an RF excitation pulse RFex (application phase $\phi=0°$, flip angle $\theta=a$ (90° in this example) is applied together with a slice-selective gradient pulse Gss. In a time $\tau/2$ an RF refocusing pulse RFre1 (application phase $\phi=90°$, flip angle $\theta=a$ (180° in this example) is applied together with a slice-selective gradient pulse Gss. In a time $\tau$ after the application of the first RF excitation pulse RFex, an echo E(1) is read out along with application of a readout gradient pulse Gro. Thereafter, second and subsequent RF refocusing pulses RFre2, RFre3, etc. are applied together with a slice-selective gradient pulse Gss at intervals of a time $\tau$ after the application of the first RF refocusing pulse RFre1. Echoes E(2), E(3), etc. are then read out in the same manner.

In the prescan B, the application phase $\phi$ for even-numbered RF refocusing pulses RFre2, RFre4, etc. are set to a value ($\theta=270°$) that is advanced by an extra 180° from the application phase for odd-numbered RF refocusing pulses RFre3, RFre5, etc. Incidentally, a phase-encoding gradient pulse Gpe is always nil in the same manner as that in the prescan A.

If nuclear spins are dephased for some reasons, each of the echoes E(2), E(3), etc. except the first echo E(1) is split into two echo components; that is, a main echo component Emain(2) (Emain(3), etc.) and a sub-echo component Esub (2) (Esub(3), etc.) in the same manner as mentioned above (See FIG. 10). Moreover, since the application phase for the even-numbered RF refocusing pulses RFre2, RFre4, etc. are advanced by extra 180°, the phases arg{Esub(n)} of only the sub-echo components Esub(2), Esub(3), etc. are advanced by 180° from the corresponding phases attained in prescan A.

This reason will be described in conjunction with FIG. 15. As illustrated, assuming that the phase of the n-th echo is $\theta_n$, and the phases of the n+1-th and n+2-th RF refocusing phases are $\phi_{n+1}$ and $\phi_{n+2}$ respectively, the phase $\theta_{n+2,SE}$ and phase $\theta_{n+2,STE}$ of a spin echo (SE) of stimulated echo (STE), which are induced by the n+2-th RF refocusing pulse, are expressed as follows:

$$\theta_{n+2,SE}=2\phi_{n+2}-\phi_{n+1}+\theta_n$$

$$\theta_{n+2,STE}=\phi_{n+2}+\phi_{n+1}-\theta_n \quad (*)$$

Figure 10:
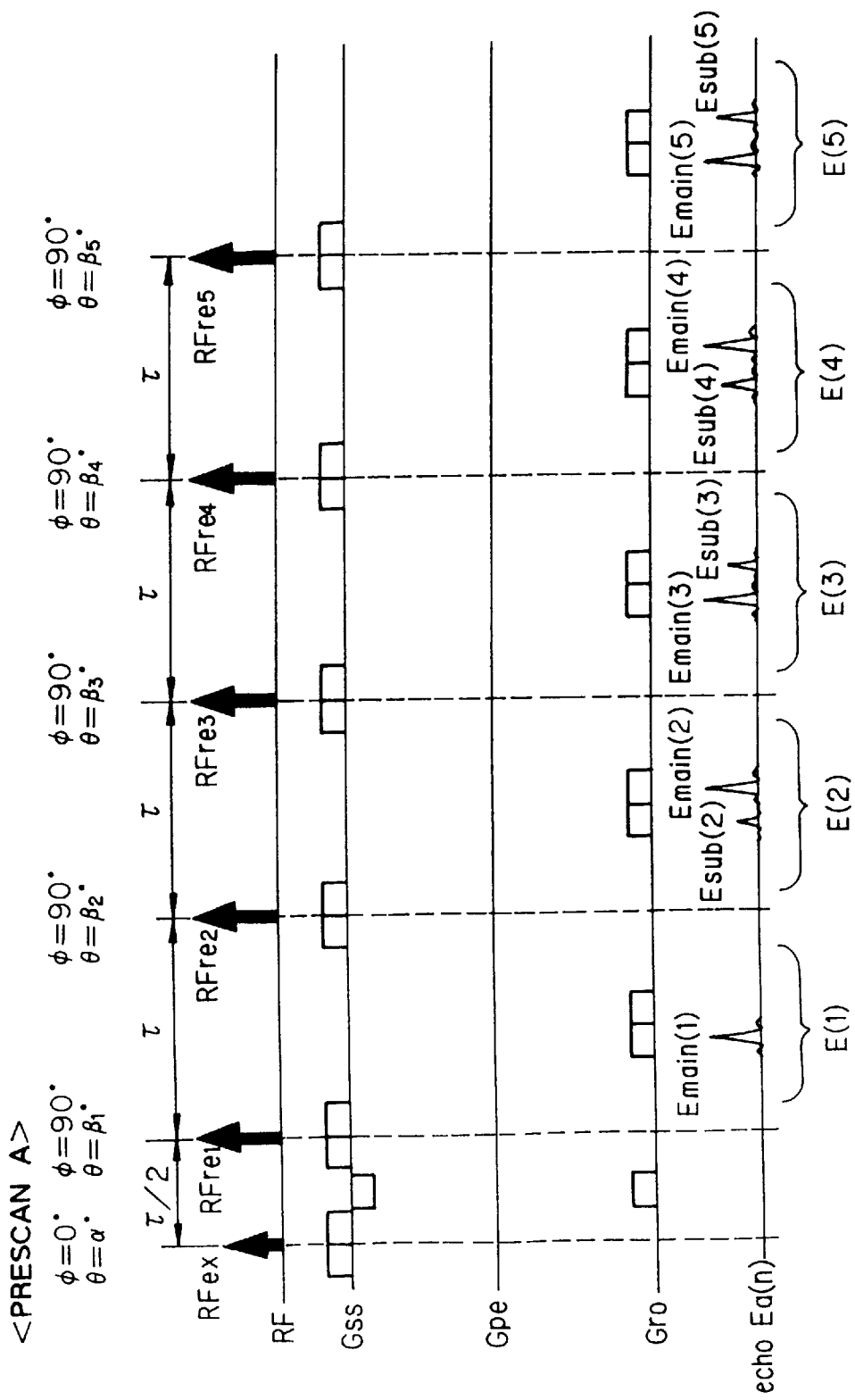
FIG. 10 is a pulse sequence illustrating one prescan A in the first embodiment.

In the example of FIG. 10, $\phi_n$ equals 90°, $\theta_n$ equals 90°, $\theta_{n+2,SE}$ equals 90°, and $\theta_{n+2,STE}$ equals 90°, where n denotes an integer of 1 or larger. The phases of the components Emain(n) and Esub(n) each of which is regarded as a synthesis of a plurality of echo paths on a phase diagram are therefore equal to each other and set to 90°.

In the example of FIG. 11, n is thought to assume two different values.

Assume that n equals 2m (where m denotes an integer of 1 or larger).

$$\phi_{n+2}=\phi_{EVEN}=270°, \phi_{n+1}=\phi_{ODD}=90°$$

$$\phi_{n+2,SE}=\theta_{EVEN,SE}=90°$$

$$\theta_{n+2,STE}=\theta_{EVEN,STE}=270°$$

Assume that n equals to 2m+1 (where m denotes an integer of 1 or larger).

$$\phi_{n+2}=\phi_{ODD}=90°, \phi_{n+1}=\phi_{EVEN}=270°$$

$$\theta_{n+2,SE}=\theta_{ODD,SE}=90°$$

$$\theta_{n+2,STE}=\theta_{ODD,STE}=270°$$

The stimulated echo component stemming from the n-th main echo component with the phases $\phi_{n+1}$ and $\phi_{n+2}$ set is expressed as Esub(n+2). As mentioned above, the phase of a Sub-echo component Esub(n) shown in FIG. 11 is 270°, where n denotes any integer of 2 or larger. That is to say, the sub-echo component is reversed 180° from the corresponding one shown in FIG. 10.

Figure 4:
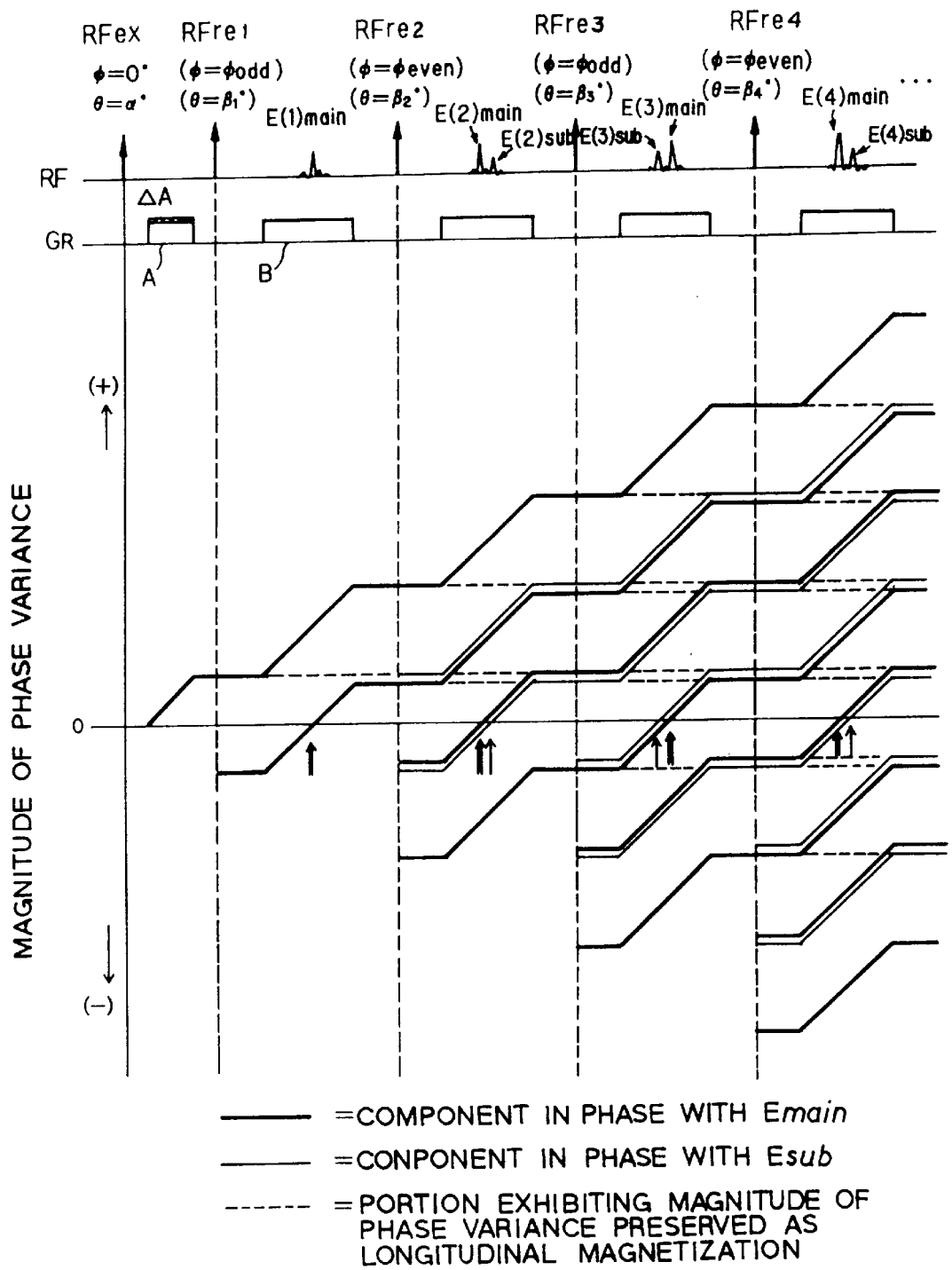
FIG. 4 illustrates one example of a phase dispersion diagram.
Figure 5:
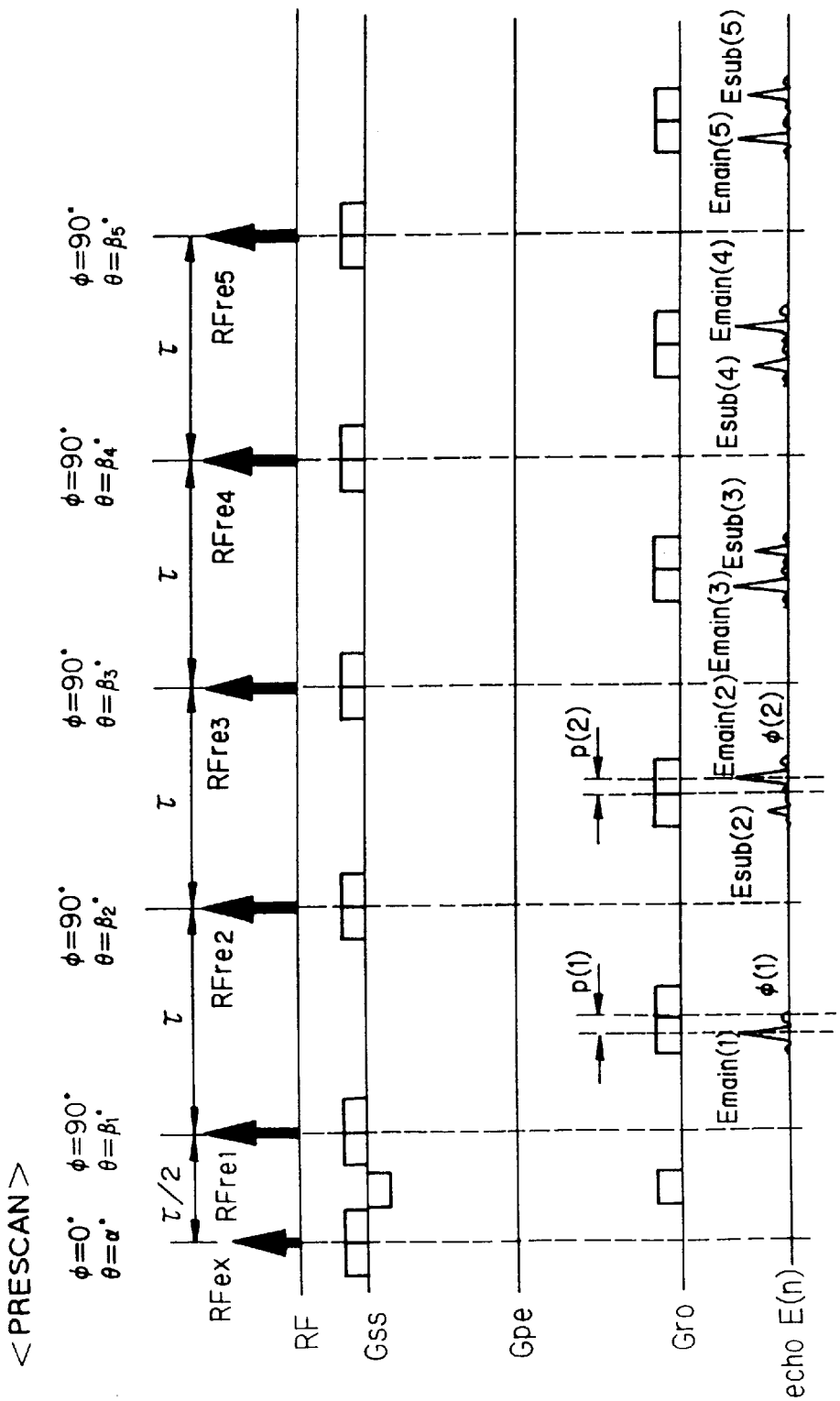
FIG. 5 exemplifies a pulse sequence of a prescan in accordance with prior art.
Figure 6:
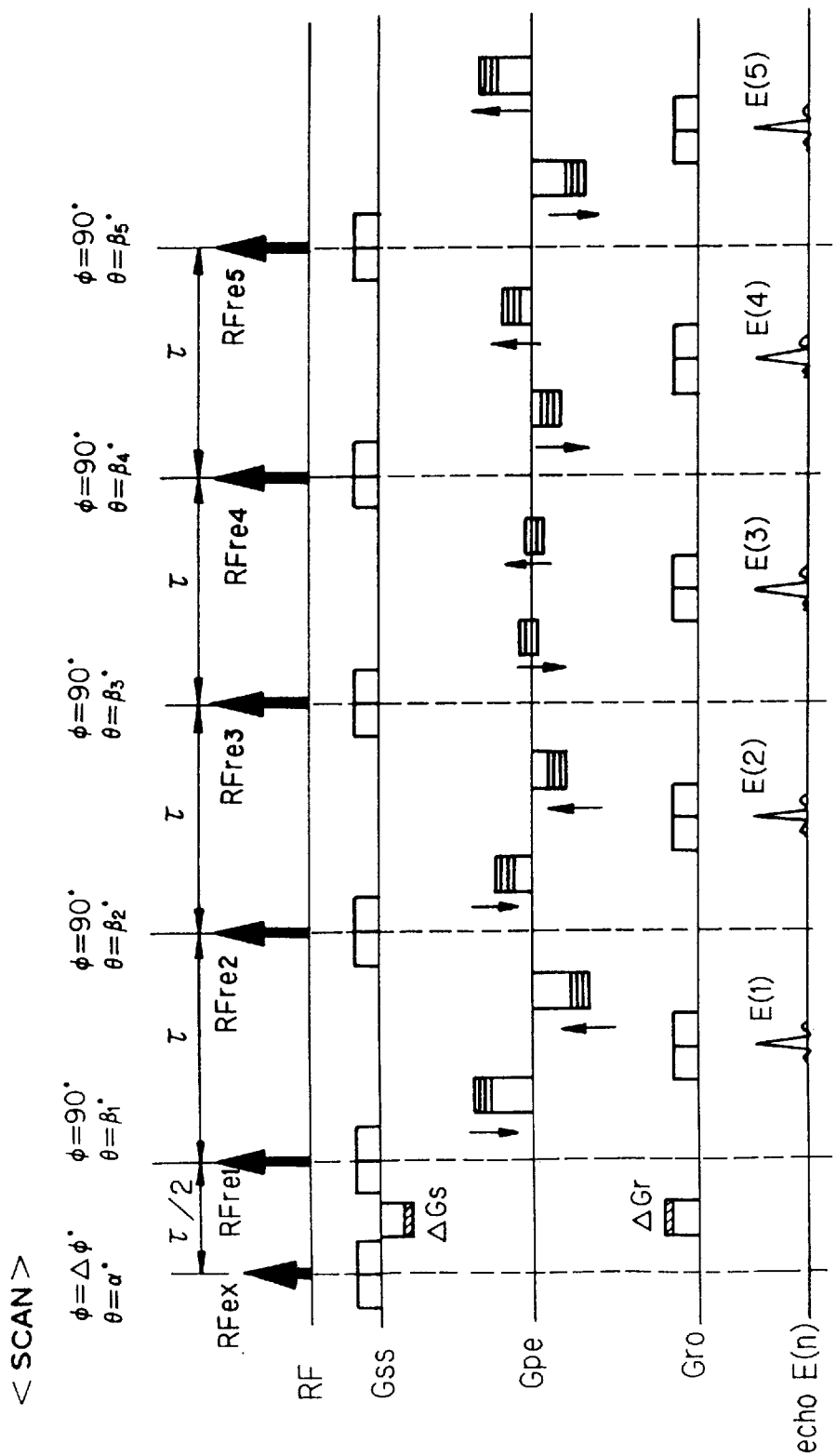
FIG. 6 is one example of a pulse sequence in a scan in accordance with prior art.
Figure 7:
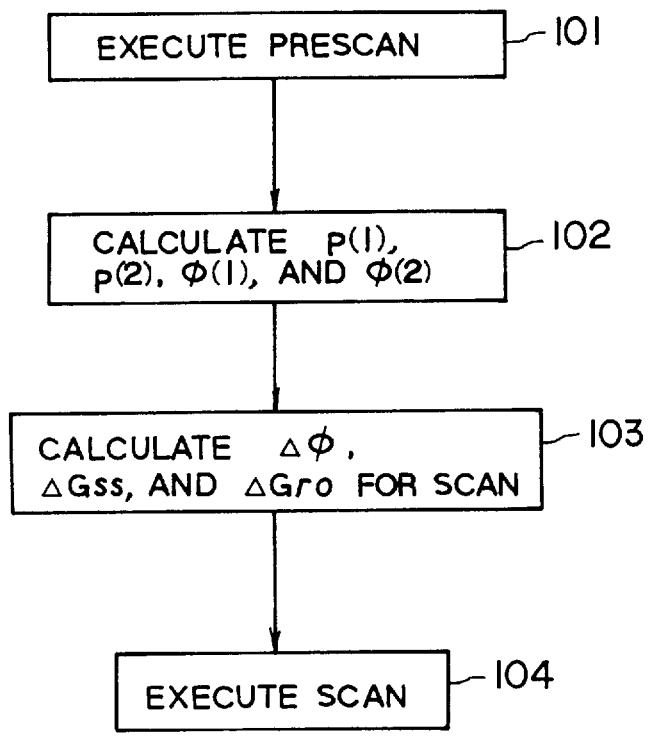
FIG. 7 shows a conceptual flowchart illustrating procedures from a prescan to an imaging scan.
Figure 15:
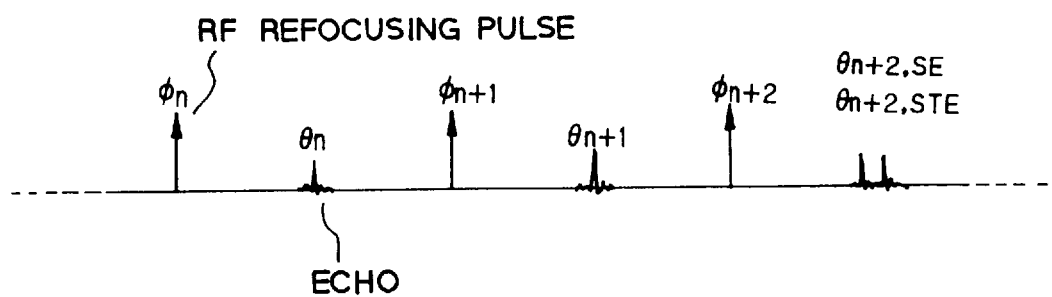
FIG. 15 illustrates a phase rotation of 180° of sub echo signals.

FIG. 15 shows only the relationship of coincidence between each pair of phases of echo components of echoes each occurring between applications of adjoining RF refocusing pulses which are depicted to trace a limited number of paths on a phase diagram. Since the relationship of coincidence between phases of echo components of an echo has the regularity shown in FIG. 4, the phases of sub-echo components produced during prescan B are advanced by 180° from those of corresponding ones produced during prescan A.

In this embodiment, a combination of application phases set in the CPMG pulse sequence is used as a reference for correction. The present invention is not limited to this combination. As long as the foregoing expression (*) is satisfied and either the main echo component Emain(n) or sub-echo component Esub(n) has a 180° phase difference between two prescans, any combination of application phases will do.

Figure 1:
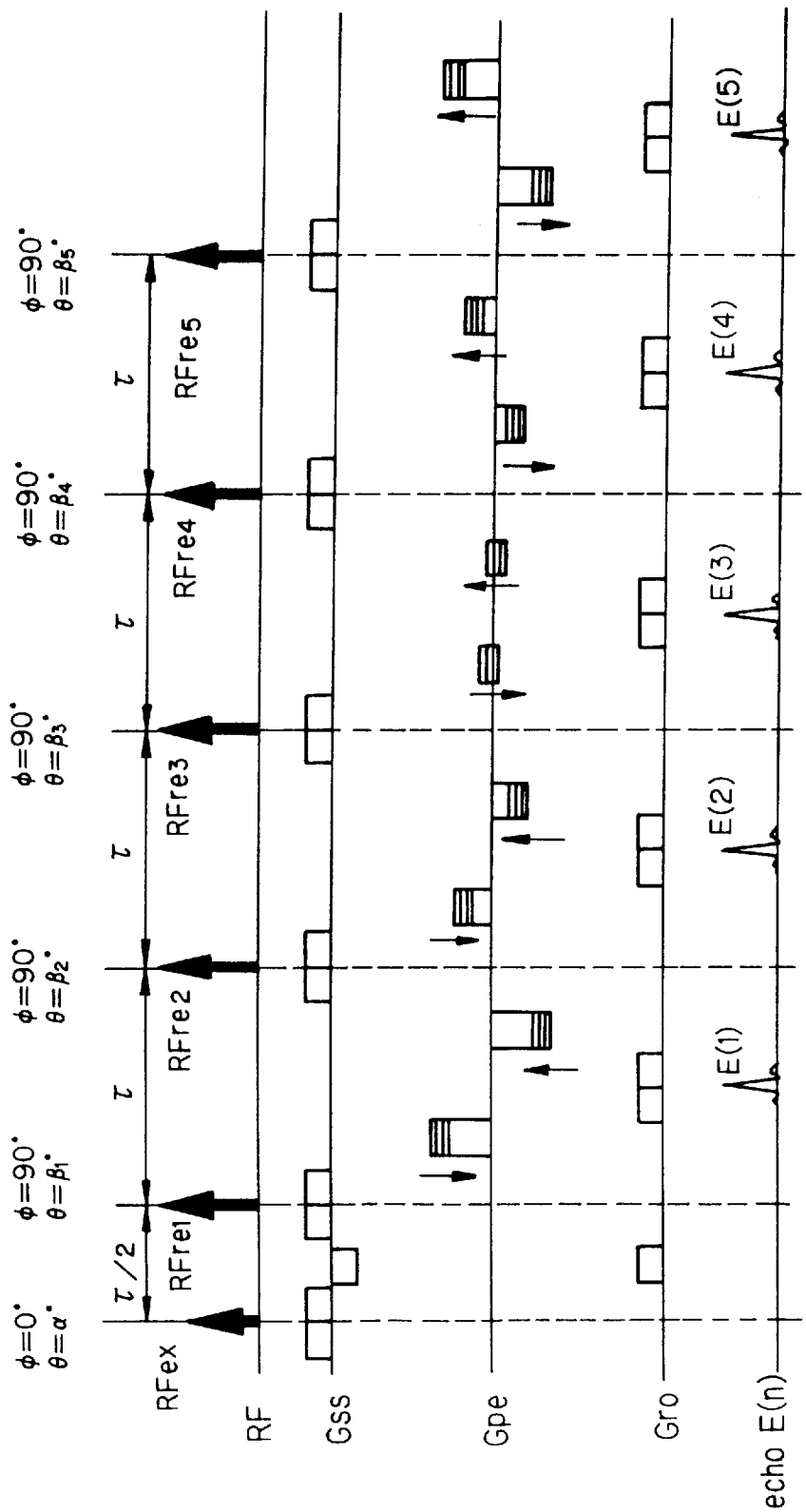
FIG. 1 is a pulse sequence showing one example of FSE in accordance with prior art.
Figure 2:
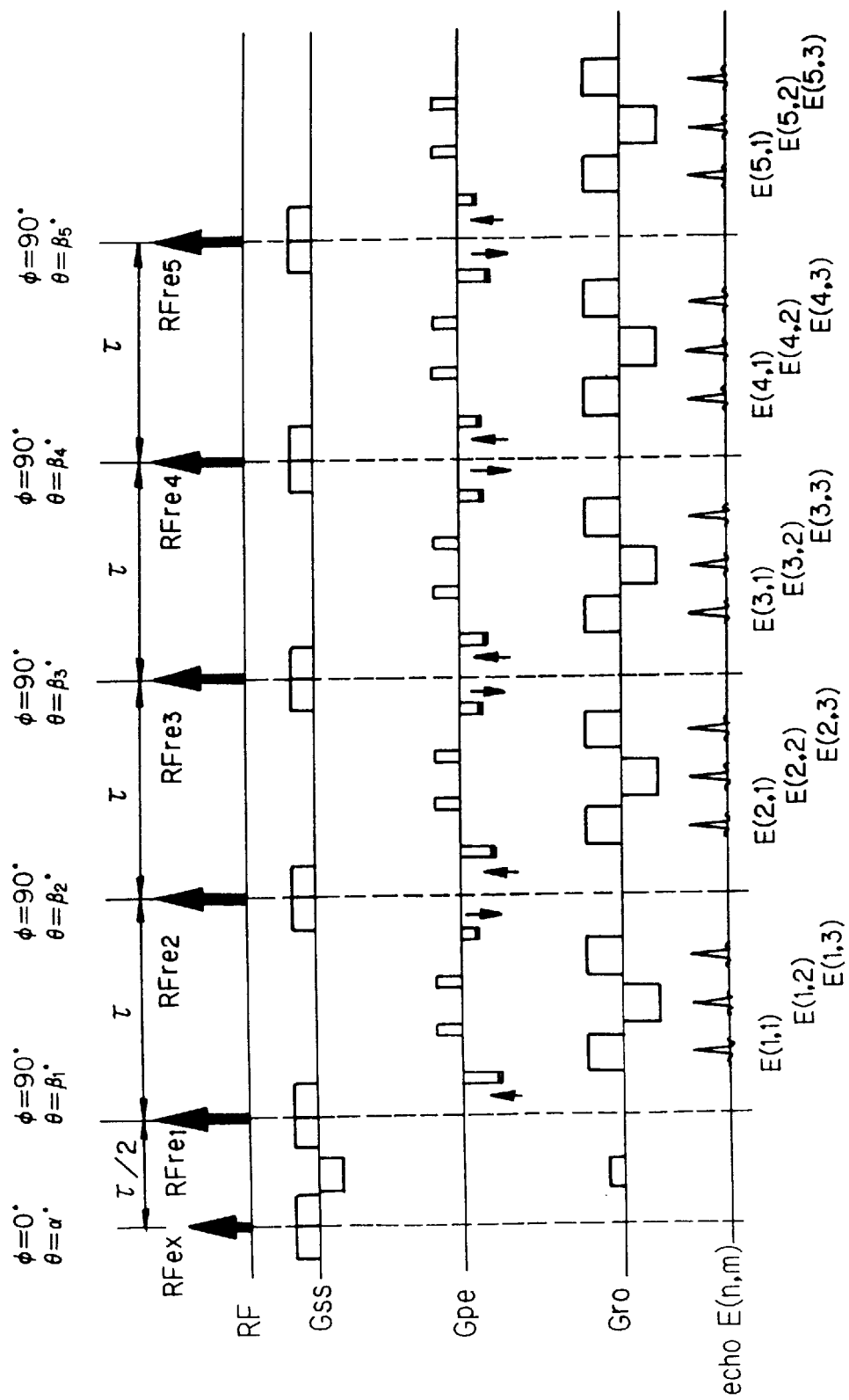
FIG. 2 is a pulse sequence showing one example of GRASE in accordance with prior art.
Figure 3:
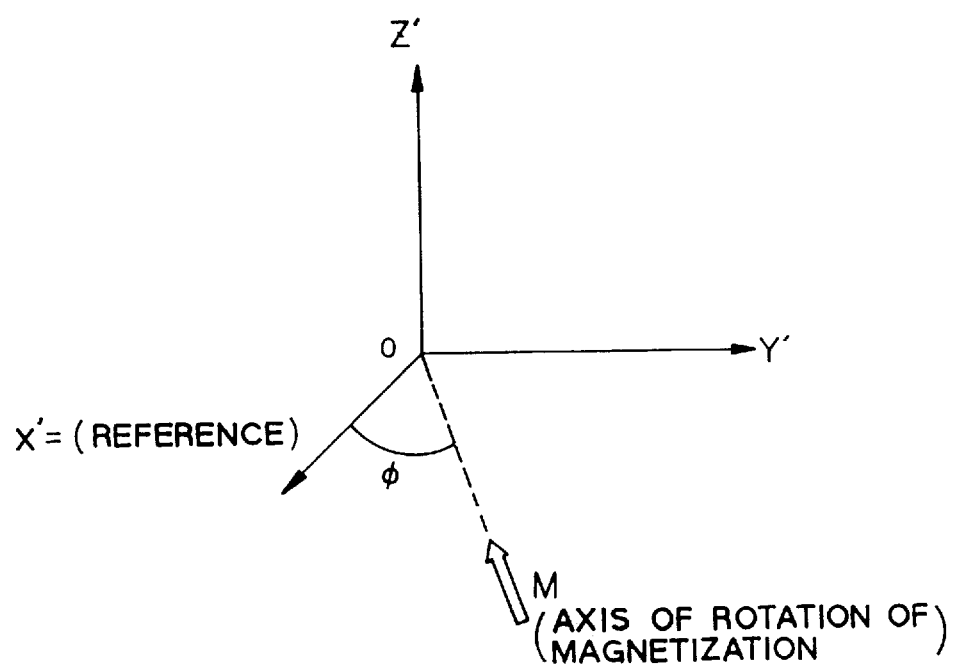
FIG. 3 illustrates pictorially an application phase of an RF pulse.

Returning to FIG. 2, description will proceed. Assuming that an echo given by prescan A is Ea(n) and an echo given by prescan B is Eb(n) (n=2, 3, etc.), the following relationships are established:

$$Ea(n)=Emain(n)+Esub(n) \quad (3)$$

$$Eb(n)=Emain(n)-Esub(n) \quad (4)$$

The controller 6 executes an averaging of echoes given by prescans A and B (step S3 in FIG. 9). That is to say, the following calculation is performed:

$$\{Ea(n)+Eb(n)\}/2$$

where n equals 1, 2, etc. The concept of the averaging is shown graphically in FIGS. 12A and 12B and 13. As shown in these drawings, each pair of sub-echo components Esub (2), Esub(3), etc. of the second and subsequent echoes E(2), E(3), etc. given by two prescans A and B are 180° out of phase mutually and therefore canceled out. Only main echo components Emain(n) (n=1, 2, etc.) are sampled.

FIG. 13(b) graphically shows sampling of only sub-echo components Esub(n) (n=2, 3, etc.) as a result of the following calculation:

{Ea(n)–Eb(n)}/ 2

The controller 6 computes authentic phase shifts ($\phi$main (1) and $\phi$main(2) and displacements pmain(1) and pmain(2) of peaks of main echo components of first and second echoes (step S4 in FIG. 9).

Next, similar to the prior art, a quantity $\Delta\phi$ for correcting an application phase $\phi$ for RF pulses RF, or a quantity $\Delta$Gss for correcting a slice-selective gradient pulse Gss, and a quantity $\Delta$Gro for correcting a readout gradient pulse Gro, which are needed for execution of a scan, are computed on the basis of values given by the following expressions (step S5 in FIG. 9):

$\phi$main(1)–$\phi$main(2), and pmain(1) pmain(2)

Figure 14:
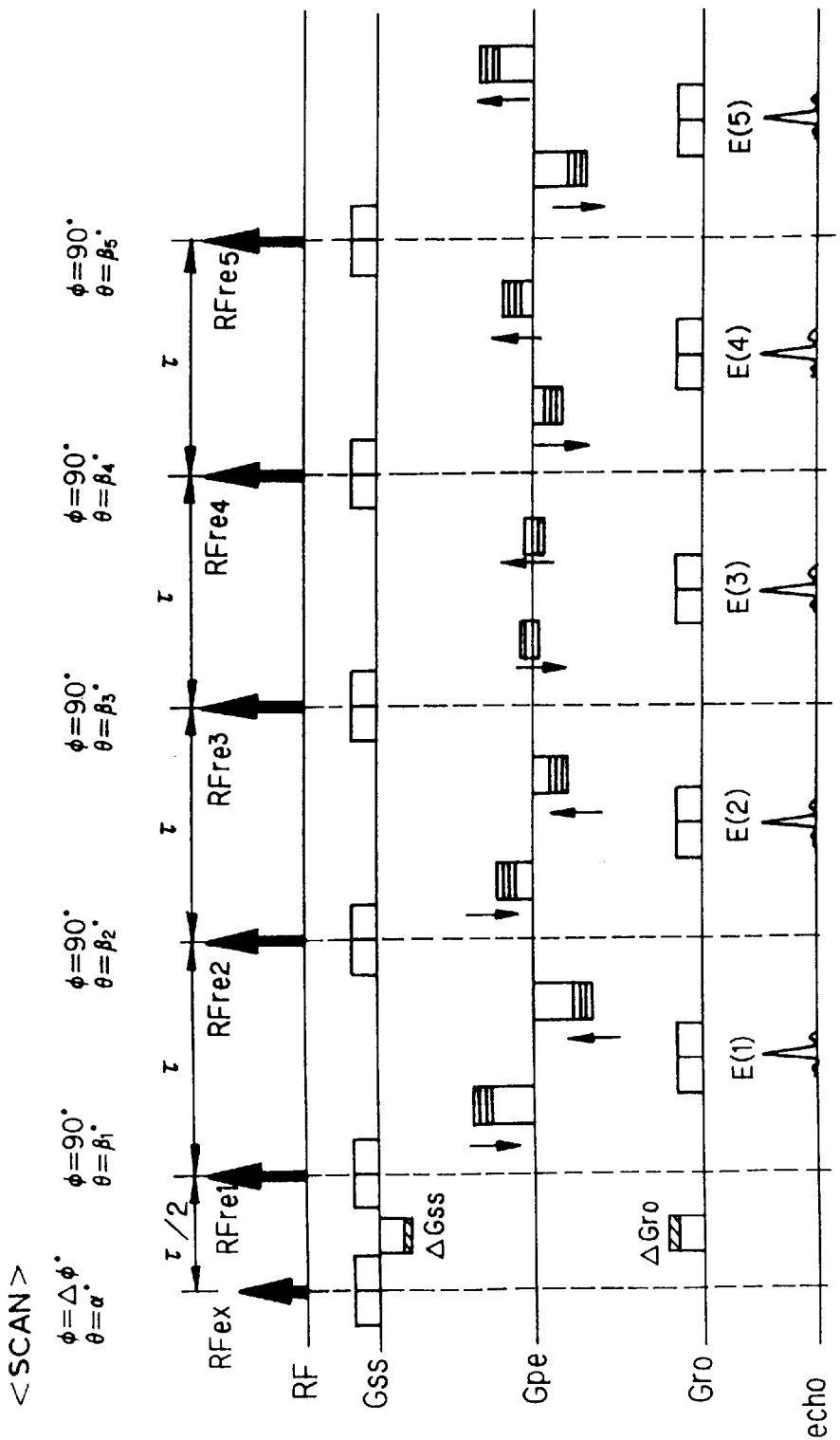
FIG. 14 shows a pulse sequence of a scan in the first embodiment.

Finally, the controller 6 switches over the switch path of the multiplexer 11 to the reconstruction unit 12 and allows the sequencer 5 to execute a scan according to a pulse sequence shown in FIG. 14 (step S6 in FIG. 9).

For the scan, as illustrated, a pulse sequence in which the results of the above computation are reflected is employed. Specifically, the application phase for an RF excitation pulse RFex to be applied together with a slice-selective gradient pulse Gss is equal to $\Delta\phi$, or the strength of a slice-selective gradient pulse Gss, which is applied succeedingly to the slice-selective gradient pulse Gss, reversed in polarity, and used to prevent dephasing, is corrected by $\Delta$Gss. At the same time, the strength of a readout gradient pulse Gro to be applied in parallel with the slice-selective gradient pulse Gss used to prevent dephasing is corrected by $\Delta$Gro.

In a time $\tau$/2 after the first excitation, a first RF refocusing pulse RFre1 (application phase $\phi$=90°, flip angle $\phi$=B1 (180° in this example) is applied together with a slice-selective gradient pulse Gss. This results in a refocusing of spins. A phase-encoding gradient pulse Gpe whose strength (pulse area) is adjusted at every implementation of this pulse sequence is then applied. A readout gradient pulse Gro is then applied with the passage of a time $\tau$ after a first selective excitation. A first echo E(1) is acquired in the meantime.

Thereafter, RF refocusing pulses RFre2, RFre3, etc. (application phase $\phi$=90°, flip angle $\phi$=B2, B3, etc. (180° in this example)) are applied consecutively together with a slice-selective gradient pulse Gss. In the meantime, echoes E(2), E(3), etc. are acquired consecutively as a result of refocusing of spins. In FIG. 14, after acquisition of each echo, a phase-encoding gradient pulse Gpe that is reversed in polarity is applied as a rewinding pulse. With this application, occurrence of stimulated echoes can be prevented during a scan.

Echoes E(n) acquired by executing the scan are received consecutively by the receiver 8R, and then converted into echo data. This processing includes orthogonal detection and A/D conversion which are performed on the echoes E(n). The echo data are arranged in a memory defining a k-space (Fourier space) in order of quantity of encoding by means of the reconstruction unit 12. The resultant echo data is subjected to a Fourier transform and thus reconstructed into an MR image.

As mentioned above, in this embodiment, sub-echo components of second and subsequent echoes (as far as the second echo is concerned, stimulated echo component), which cannot be removed by any existing technique, can be removed almost perfectly. Main echo components alone can be sampled properly. This brings about the advantages that the precision in correcting a pulse sequence employed in a scan improves markedly, and that the scan can be executed in a stable manner.

A procedure for calculating the quantities of correction $\Delta\phi$, $\Delta$Gss, and $\Delta$Gro in this embodiment is not limited to the foregoing one. Alternatively, as apparent from the expression (1), the phase differences between even-numbered main echo components and odd-numbered main echo components of the third and subsequent echoes rather than the first and second echoes, and displacements of echo peaks may be used for calculation of the quantities of correction $\Delta\phi$, $\Delta$Gss, and $\Delta$Gro. Moreover, a one-dimensional Fourier transform may be performed in a kr direction on echo data given by prescans in order to depict a curve showing distribution of phases in a readout direction. In this case, the slope and intercept of the curve; that is, first-order and zero-order components of a phase indicated by the phase distribution curve in the readout direction, are calculated; and then a displacement and phase shift of an echo peak is calculated on the basis of the first-order and zero-order components.

(Second Embodiment)

The second embodiment of the present invention will be described in conjunction with FIGS. 16 to 20. In this embodiment and subsequent embodiments, component elements identical to or equivalent to those in the first embodiment will be assigned the same reference numerals. The description of the component elements will be omitted or briefed.

An MRI system in accordance with this embodiment is identical to the aforesaid one. The controller 6 executes a series of operations described in FIG. 16.

Figure 16:
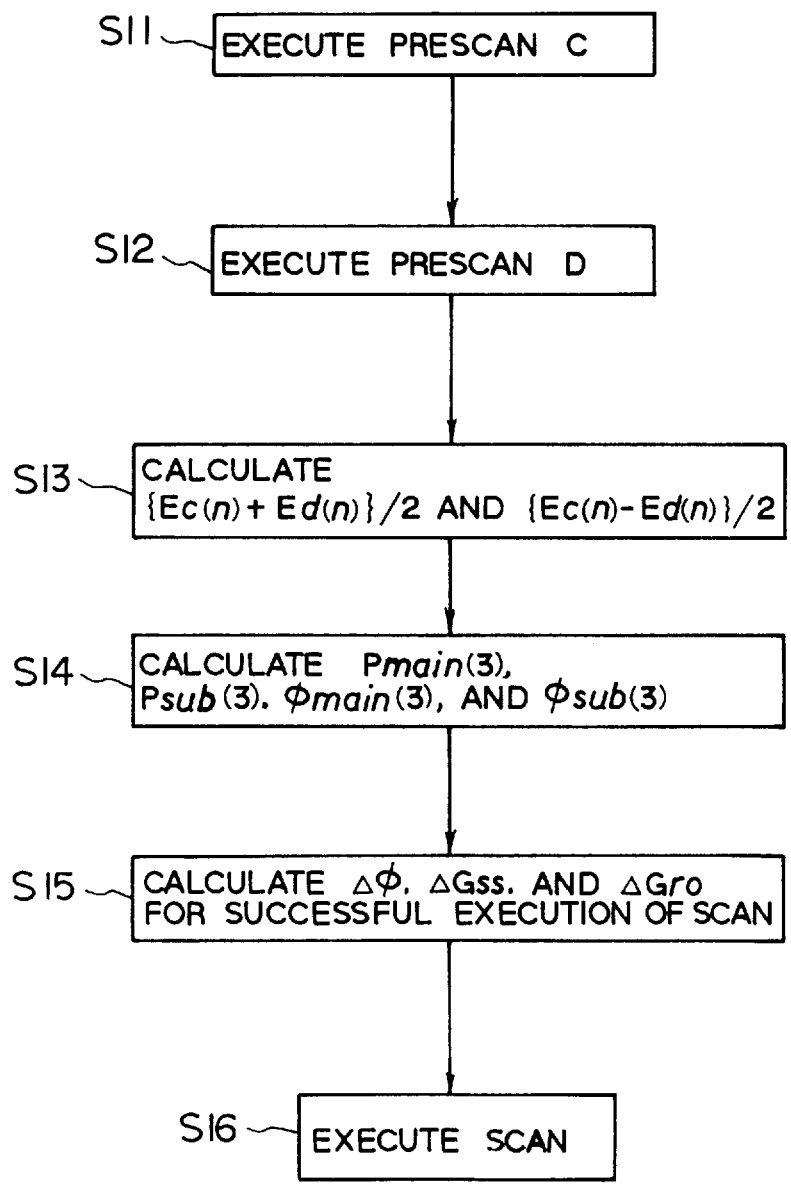
FIG. 16 is a flowchart showing processing executed by a controller in a second embodiment.

First, the controller 6 switches over the switch path of the multiplexer 11 to the controller 6, commands the sequencer 5 to successively execute two kinds of prescans C and D according to FSE imaging, and inputs resultant echoes (steps S11 and S12 in FIG. 16). A pulse sequence used for the first prescan C is shown in FIG. 17, and a pulse sequence used for the succeeding prescan D is shown in FIG. 18.

During the first prescan C, a plurality of RF refocusing pulses RFre1, RFre2, etc, (application phase $\phi$=90°, flip angle $\phi$=B1, B2, etc. (180° in this example)) are applied consecutively together with a slice-selective gradient pulse Gss succeedingly to one RF excitation pulse RFex (application phase $\phi$=0°, flip angle $\phi$=a(90° in this example)). Echoes Ec(n) are then acquired along with application of a readout gradient pulse Gro. A phase-encoding gradient pulse Gpe is set to exhibit the same strength change as that for a shot intended to acquire data corresponding to a data line in a k-space containing the center of the k-space during a scan. As a result. RF pulses and gradient pulses employed in prescan C are set to have the same waveforms as those for a shot intended to acquire the data corresponding to a data line containing the center of k-space during the scan (this pulse sequence is different in this point from the pulse sequence employed in a prescan in accordance with the prior art and the first embodiment alike).

Figure 17:
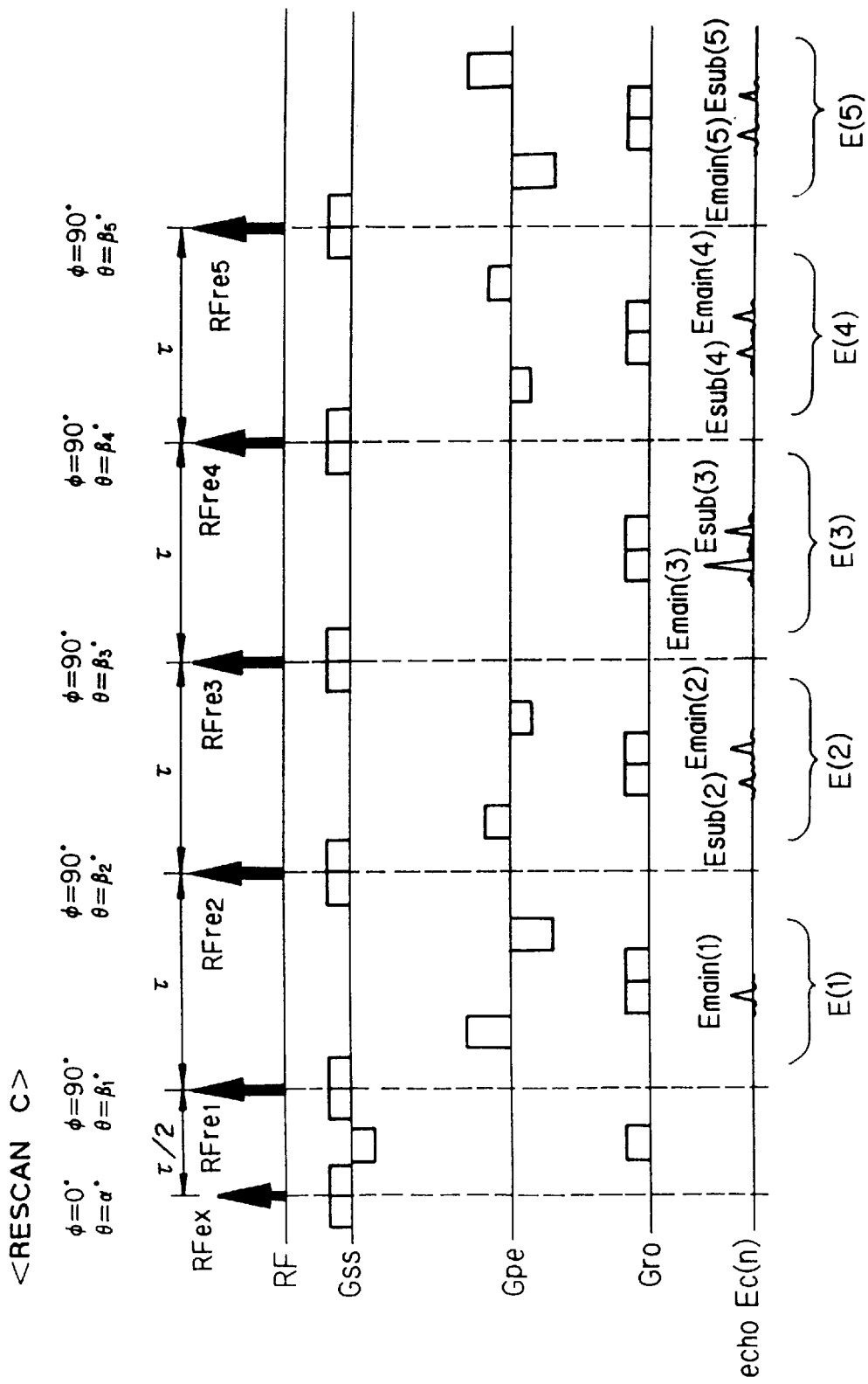
FIG. 17 is a pulse sequence illustrating one prescan C in the second embodiment.
Figure 18:
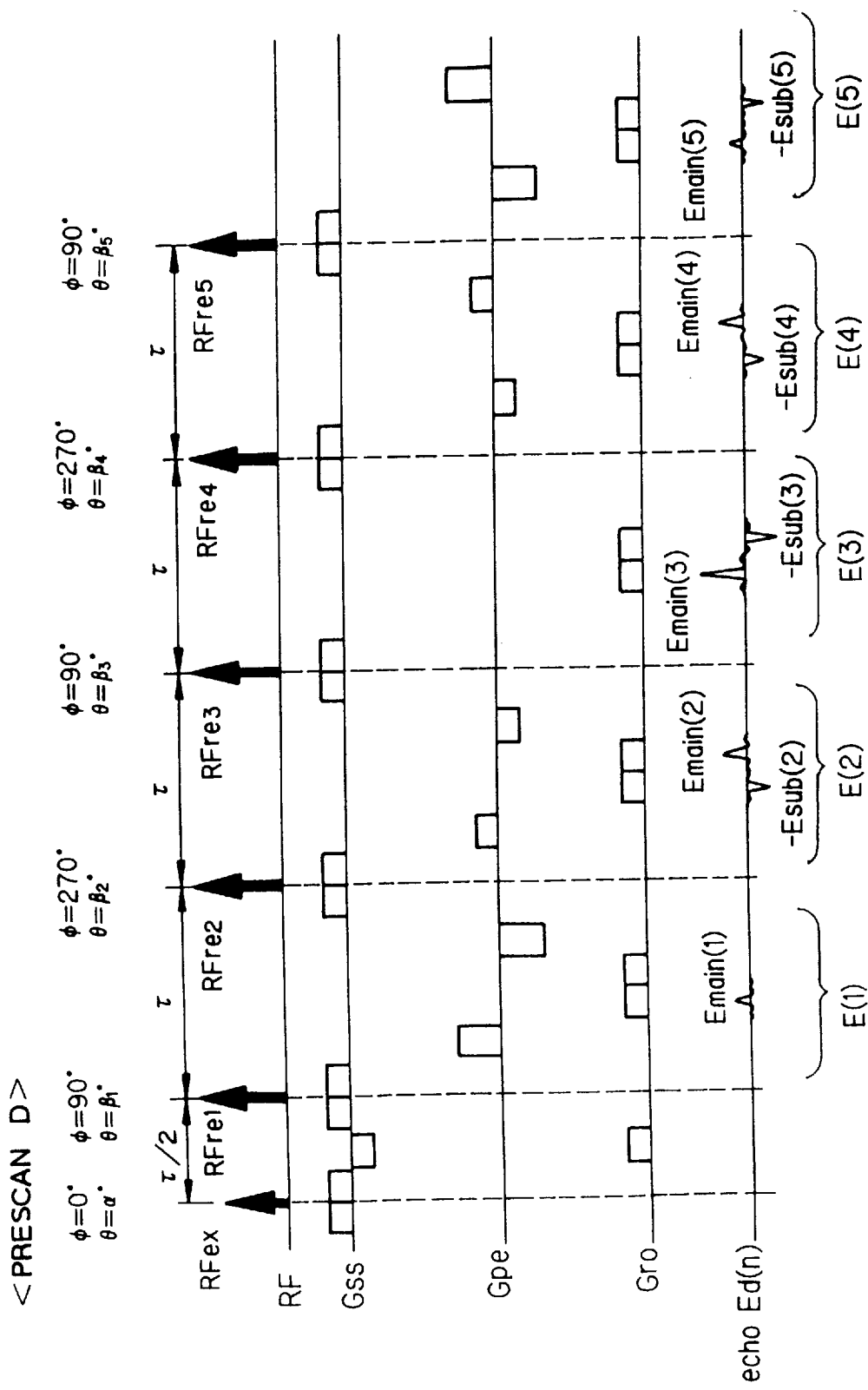
FIG. 18 is a pulse sequence illustrating the other prescan D in the second embodiment.

If nuclear spins are dephased for some reason, each of echoes E(2), E(3), etc. except the first echo E(1) is split into two echo components; that is, a main echo component Emain(2) (Emain(3), etc.) and a sub-echo component Esub (2) (Esub(3), etc.) in the same manner as the aforesaid one (See FIG. 17).

During the succeeding prescan D, a plurality of RF refocusing pulses RFre1, REre2, etc. (application phase φ=90° or 270°, flip angle φ=B1, B2, etc. (180° in this example) are applied consecutively together with a slice-selective gradient pulse Gss succeedingly to one RF excitation pulse RFex (application phase 0°, flip angle φ=a(90° in this example)). Echoes Ed(n) are then acquired along with the application of a readout gradient pulse Gro. A phase-encoding gradient pulse Gpe is set to exhibit the same strength change as that for a shot intended to acquire data corresponding to a data line in a k-space containing the center of the k-space during a scan. As a result, gradient pulses employed in prescan D are set to have the same waveforms as those for the shot intended to acquire data corresponding to the data line containing the center of k-space during a scan (this pulse sequence is different in this point from the one employed in a prescan in accordance with the prior art and the first embodiment). However, as for RF pulses, similarly to prescan B in the aforesaid first embodiment, an application phase for even-numbered RF refocusing pulses RFre2, RFre4, etc. is further advanced by 180° and set to 270°.

If nuclear spins are dephased for some reason, each of echoes E(2), E(3), etc. except the first echo E(1) is split into two echo components; that is, a main echo component Emain(2) (Emain(3), etc.) and a sub-echo component Esub (2) (Esub(3), etc.) (See FIG. 18). Besides, the application phase φ for even-numbered RF refocusing pulses RFre2, RFre4, etc. is advanced by an extra 180°. The phases arg{Esub(n)j of the even-numbered sub-echo components Esub(2), Esub(4), etc. are therefore advanced by 180° from the corresponding ones attained in prescan C.

Assume that an echo given by prescan C is Ec(n) and an echo given by prescan D is Ed(n). Phase encoding is performed on echoes except an echo produced in an effective echo time during each of the prescans; that is, an $n_{eff}$-th echo $E(n_{eff})$ (in the example of FIG. 17 or 18, the third echo E(3)). Echoes usable for calculating quantities of correction needed for execution of a scan are only the echoes produced in the effective echo time; that is, the third echoes Ec(3) and Ed(3)

The controller 6 then computes a main echo component Emain(3) and a sub-echo component Esub(3) of the third echo E(3) corresponding to the $n_{eff}$-th echo $E(n_{eff})$ by calculating the following expressions (step S13 in FIG. 16):

$$\text{Emain } (n_{eff}) = \{Ec(n_{eff}) + Ed(n_{eff})\}/2 \quad (5)$$

$$\text{Esub } (n_{eff})\{Ec(n_{eff}) - Ed(n_{eff})\}/2 \quad (6)$$

that is, $$\text{Emain } (3) = \{Ec(3) + Ed(3)\}/2 \quad (5)'$$

$$\text{Esub } (3) = \{Ec(3) - Ed(3)\}/2 \quad (6)'$$

Figure 19:
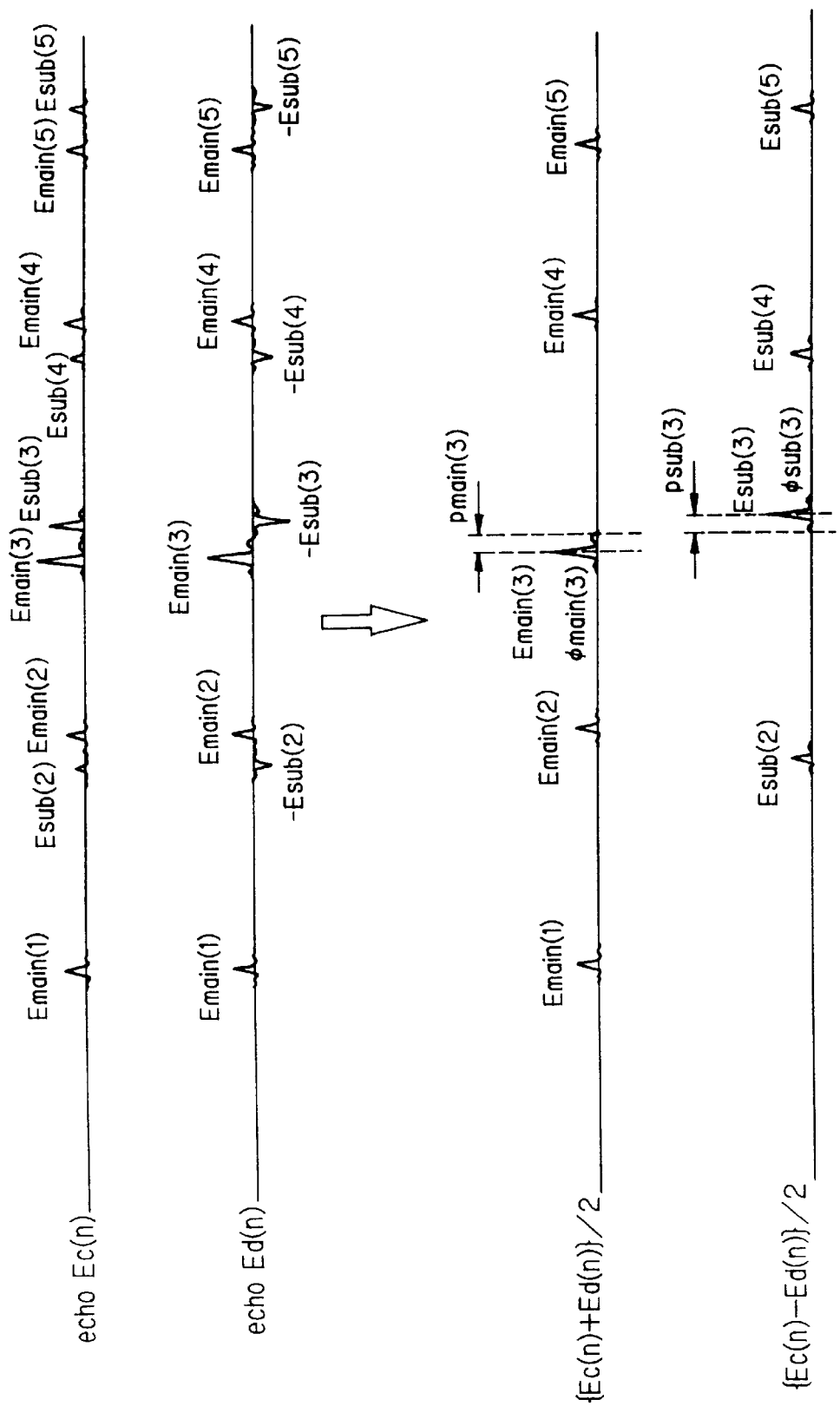
FIG. 19 is an illustration of separation and extraction of main echo and sub-echo components.
Figure 20:
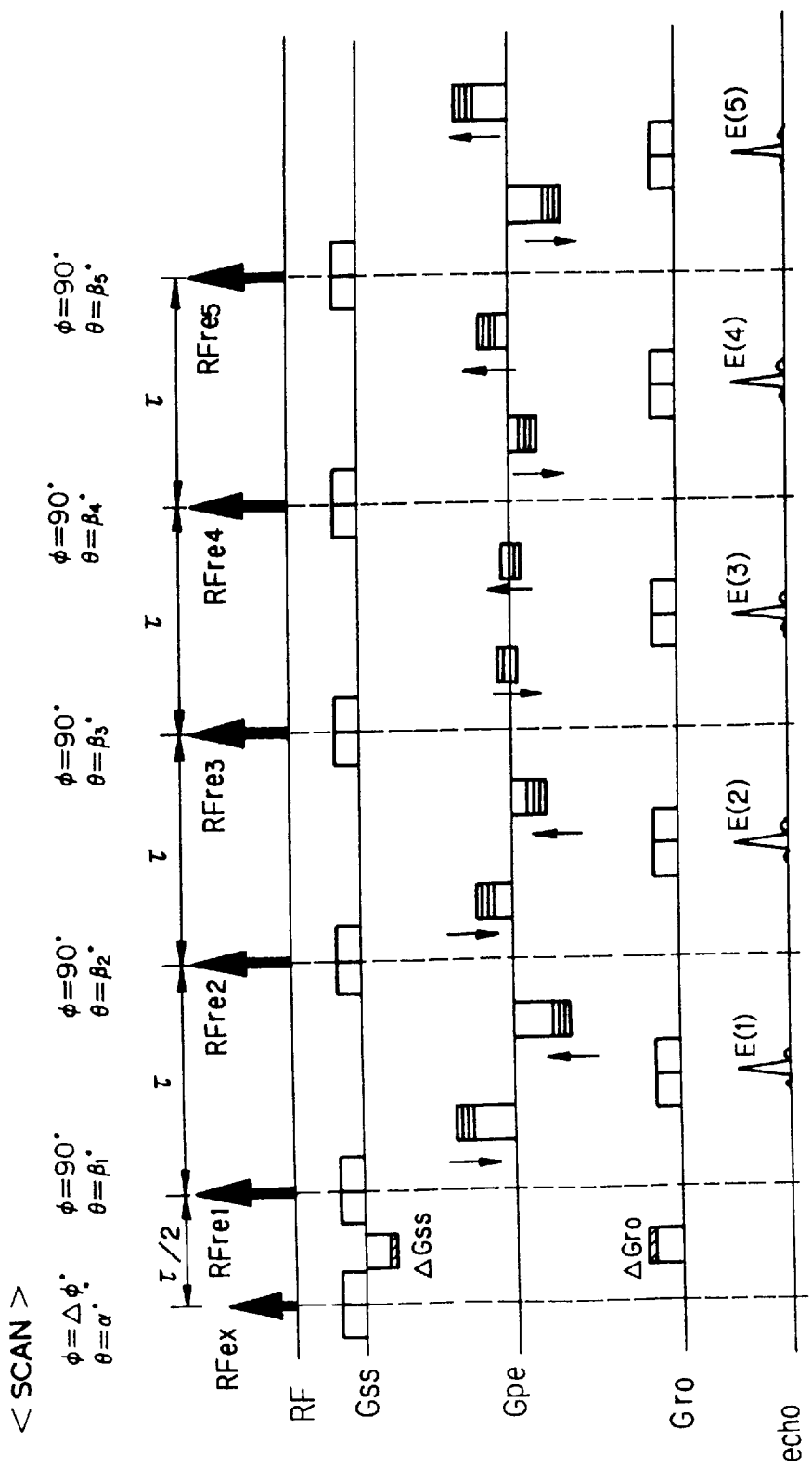
FIG. 20 shows a pulse sequence of a scan in the second embodiment.

The main echo component Emain(3) and sub-echo component Esub(3) given by the computation are shown in FIG. 19. In this embodiment, the phase of the sub-echo component Esub(3) of the third echo E(3) corresponding to the $n_{eff}$-th echo $(E(n_{eff})$ is different by 180° between two prescans. Therefore, as mentioned above, the main echo component Emain(3) is computed by performing additive averaging, that is, division of a sum by 2, and the sub-echo component Esub(3) is computed by performing subtractive averaging, that is, division of a difference by 2.

Furthermore, the controller 6 computes a phase shift φmain(3) and displacement pmain(3) of the peak of the main echo component of the third echo E(3) and a phase shift φsub(3) and displacement psub(3) of the peak of the sub-echo component thereof on the basis of the above echo data (step S14 in FIG. 16).

Next, similarly to the known techniques, based on a phase difference between the main echo component and sub-echo component of the n-th echo, which is provided as follows:

φmain($n_{eff}$)−psub($n_{eff}$) and a difference between peak positions which is provided as follows:

pmain($n_{eff}$)−psub($n_{eff}$) that is:
φmain(3)−φsub(3)
pmain(3)−psub(3), a quantity Δφ for correcting an application phase φ for RF pulses RF or a quantity ΔGss for correcting a slice-selective gradient pulse Gss and a quantity ΔGro for correcting a readout gradient pulse Gro are computed (step S15 in FIG. 16). Since the polarity of a result of the corrective computation is reversed depending on whether the $n_{eff}$-th numeral is odd or even, the order of subtraction should be made uniform in order to attain the same polarity all the time.

Finally, the controller 6 switches over the switch path of the multiplexer 11 to the reconstruction unit 12 and allows the sequencer 5 to execute a scan according to a pulse sequence shown in FIG. 19 (step S16 in FIG. 16).

For the scan, as illustrated, a pulse sequence in which the results of the computation are reflected is employed. Specifically, the application phase φ for an RF excitation pulse RFex (flip angle φ=a(90° in this example) to be applied first together with a slice-selective gradient pulse Gss equal to Δφ, or the strength of a slice-selective gradient pulse Gss to be applied succeedingly to the slice-selective gradient pulse Gss, reversed in phase, and used to prevent dephasing is a value corrected by ΔGss. At the same time, the strength of a readout gradient pulse Gro to be applied in parallel with the slice-selective gradient pulse Gss used to prevent dephasing is a value corrected by ΔGro.

Thereafter, similarly to the aforesaid pulse sequence in FIG. 14, a plurality of RF refocusing pulses RFre1, RFre2, etc. are used to consecutively acquire echoes E(1), E(2), etc. produced as a result of refocusing of nuclear spins. The echoes (n) acquired by executing the scan are consecutively input as echo data to the reconstruction unit 12 via the receiver 8R, and reconstructed into an MR image through a Fourier transform.

As mentioned above, according to this embodiment, in addition to the advantages of the aforesaid first embodiment, an advantage that a spatially-uniform dephased component of dephased components caused by a phase-encoding gradient pulse has is that a zero-order component can be corrected preferably, and that a precision in correcting a pulse sequence used for a scan improves further.

A procedure for calculating the quantities of correction Δφ, ΔGss, and ΔGro in this embodiment is not limited to the aforesaid one. Alternatively, a one-dimensional Fourier transform may be performed in a kr direction on echo data given by prescans in order to depict a curve showing distribution of phases in a readout direction. In this case, the slope and intercept of the curve; that is, first-order and zero-order components of a phase indicated by the phase distribution curve in the readout direction, are calculated. A displacement and phase shift of an echo peak are then calculated on the basis of the first-order and zero-order components.

(Third Embodiment)

The third embodiment will be described in conjunction with FIGS. 21 to 25. In this variant, the GRASE imaging is employed on behalf of the FSE imaging. The sequencer 5 can command a GRASE pulse sequence for either a prescan and a scan in response to a command sent from the controller 6.

Figure 21:
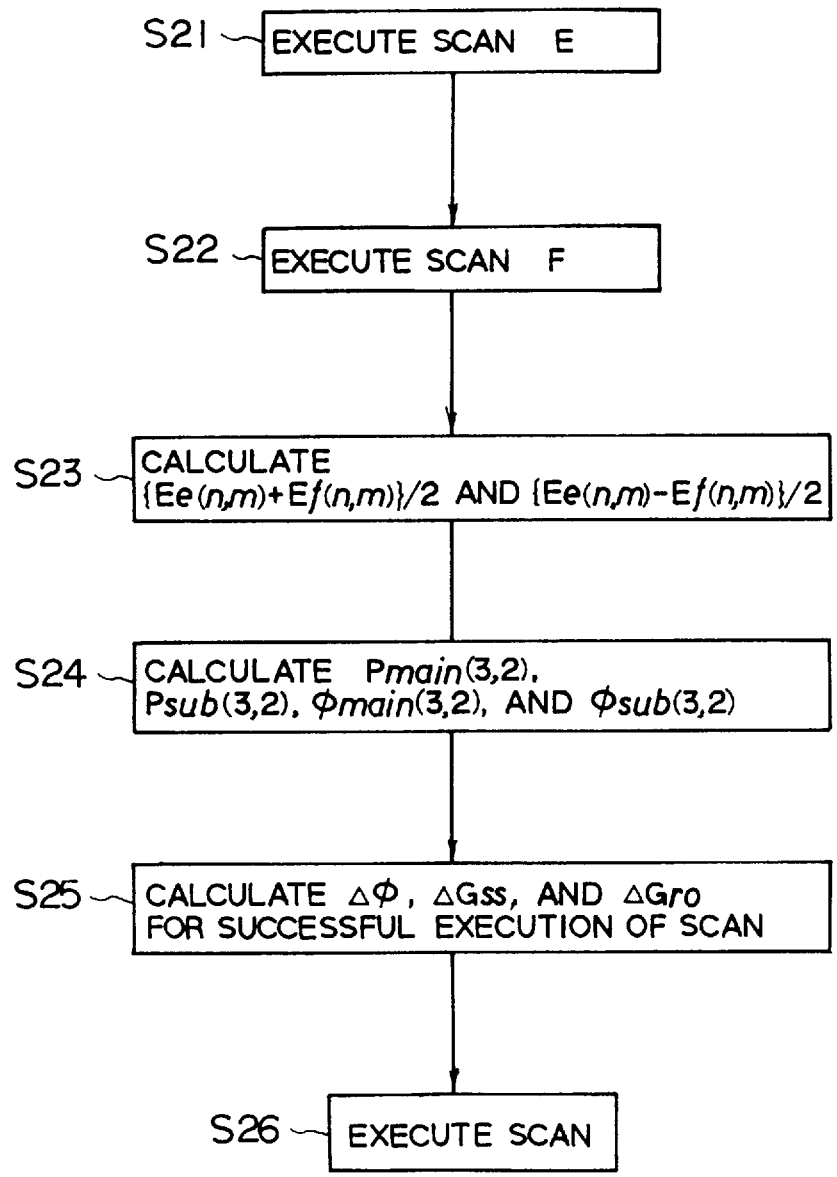
FIG. 21 is a flowchart showing processing executed by a controller in a third embodiment.

The controller 6 executes a series of operations described in FIG. 21.

Figure 22:
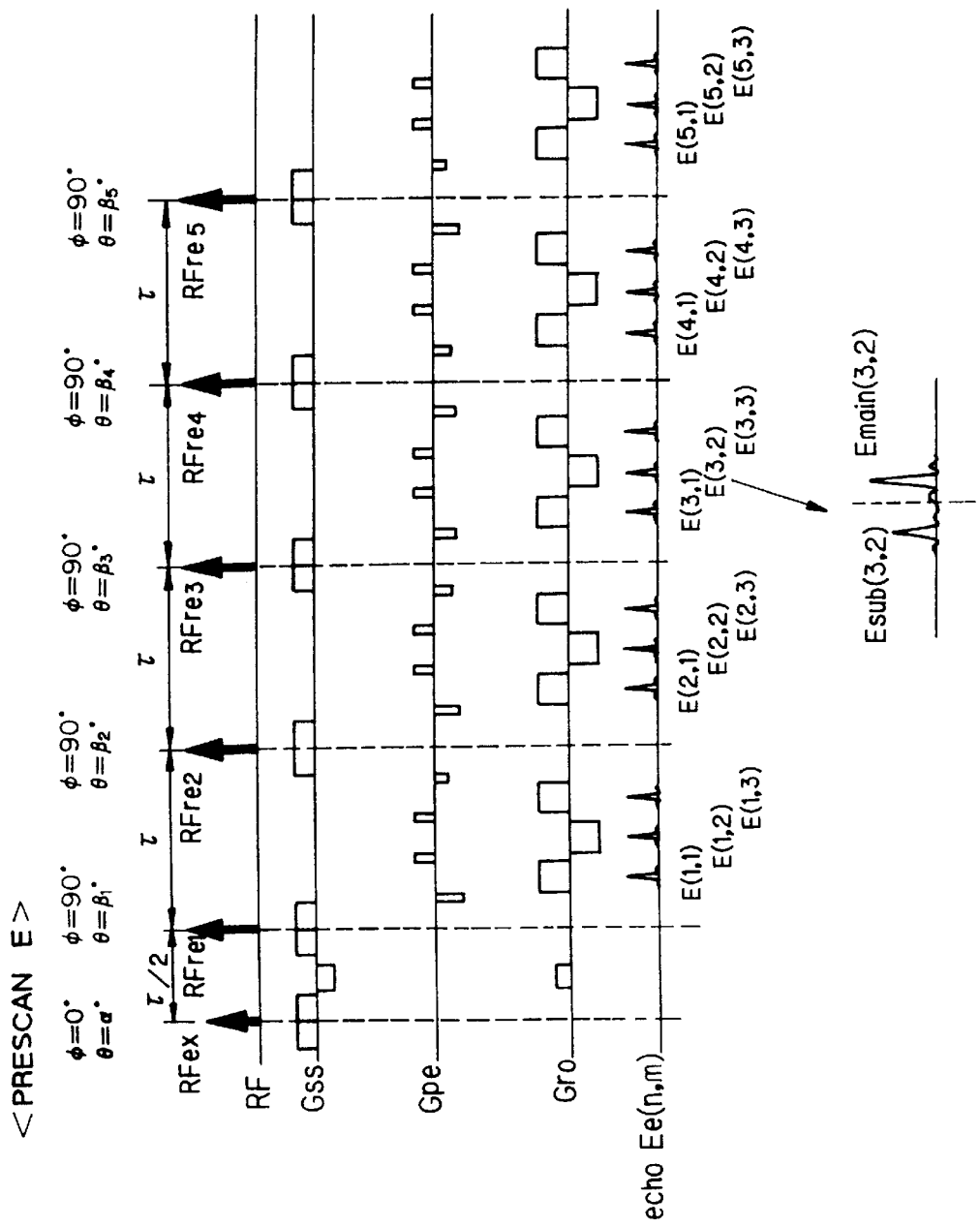
FIG. 22 is a pulse sequence illustrating one prescan E in the third embodiment.
Figure 23:
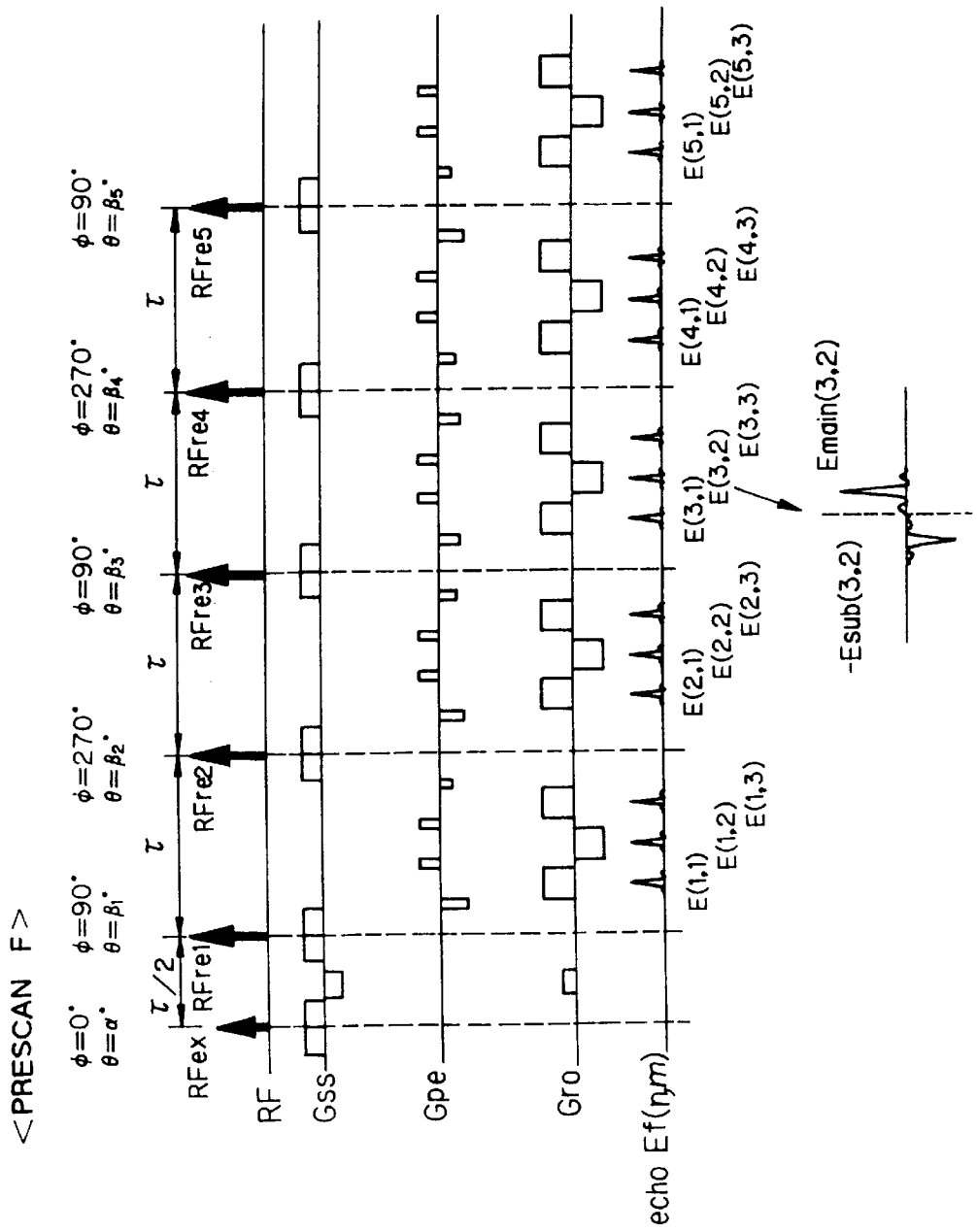
FIG. 23 is a pulse sequence illustrating the other prescan F in the third embodiment.

First, the controller 6 switches over the switch path of the multiplexer 11 to the controller 6, commands the sequencer 5 to successively execute two kinds of prescans E and F according to the GRASE imaging, and inputs acquired echoes (steps S21 and S22 in FIG. 21). A pulse sequence employed in the first prescan E is shown in FIG. 22, and a pulse sequence employed in the succeeding prescan F is shown in FIG. 23.

The pulse sequences employed in two kinds of prescans E and F use one RF excitation pulse RFex and a plurality of RF refocusing pulses RFre1, RFre2, etc. which are identical to those shown in FIGS. 17 and 18 concerning the second embodiment. A readout gradient pulse Gro is applied with its polarity reversed three times during interpulse times of RF refocusing pulses, whereby echoes Ee(m.n) and Ef(m,n) are acquired. At this time, each phase-encoding gradient pulse Gpe is set to exhibit the same strength change as that for a shot intended to acquire data corresponding to a data line containing the center of the k-space during a scan.

Figure 24:
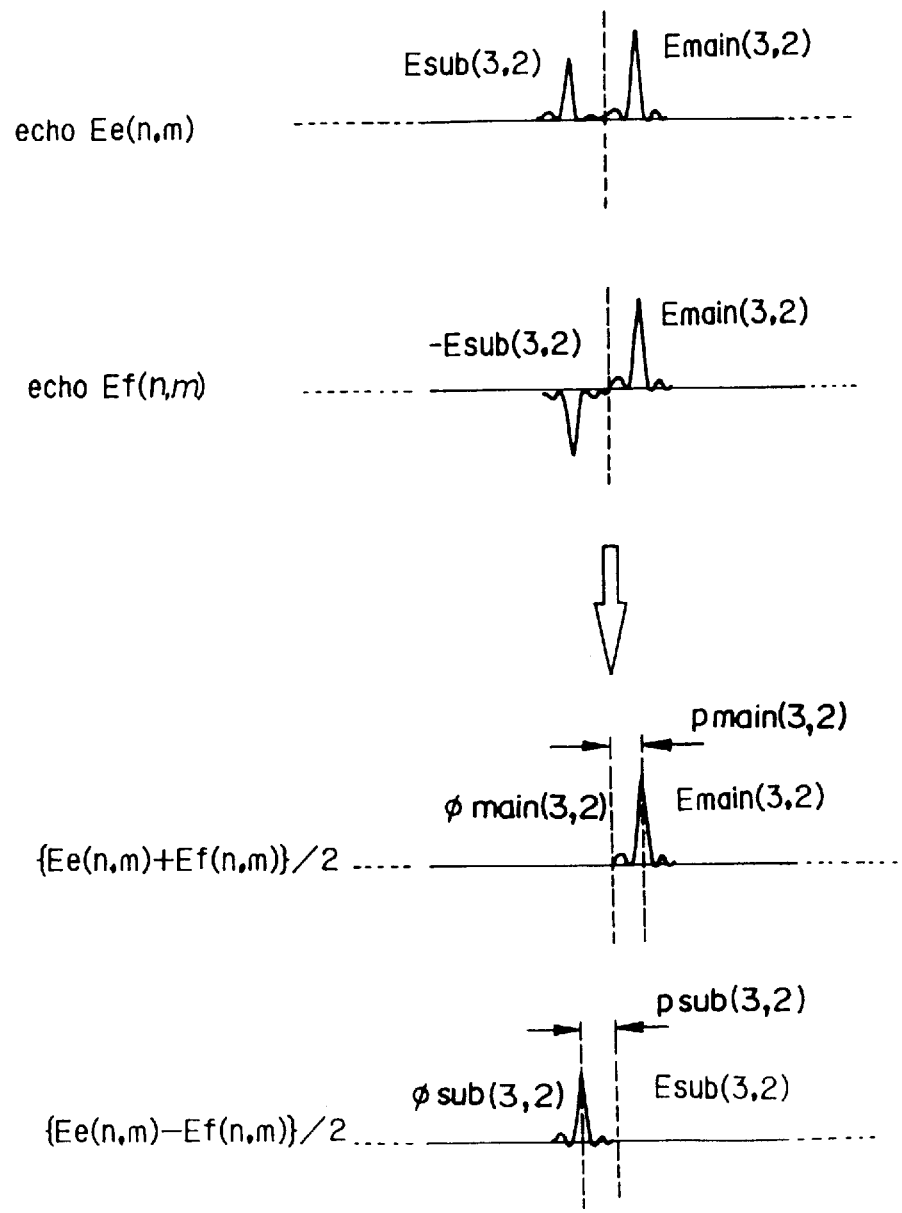
FIG. 24 is an illustration of a separation and extraction of main echo and sub-echo components.

In both prescans E and F, if nuclear spins are dephased, each of echoes E(2,1), E(2,2), E(2,3), E(3,1), etc. except the first echoes E(1,1) to E(1,3) is split into two echo components; that is, a main echo component Emain(2,1) (Emain (2,2), Emain(2,3), Emain(3,1), etc.) and a sub-echo component Esub(2,1) (Esub(2,2), Esub(2,3), Esub(3,1), etc.) (an example is shown in FIGS. 22 to 24 by taking an echo E(3,2)). Besides, during the succeeding prescan F, the application phase (@ for even-numbered RF refocusing pulses RFre2, REre4, etc. is advanced by an extra 180° and thus set to 270°. The phases of sub-echo components alone of even-numbered echoes are therefore advanced by 180° from the associated ones attained during prescan E.

Assume that an echo given by prescan E is Ee(n,m) and an echo given by prescan F is Ef(n,m). During both the prescans, phase encoding is performed on echoes except an echo produced in an effective.echo time; that is, an $n_{eff}$-th echo E($n_{eff}$, m') (an echo E(3,2) of the third echoes in the example shown in FIGS. 22 and 23). An echo usable for computing quantities of correction needed for execution of a main scan is only the echo produced in the effective echo time; that is, the echo E(3,2) of the third echoes.

Next, the controller 6 calculates a main echo component Emain(3,2) and a sub-echo component Esub(3,2) of the echo E(3,2) by performing the computation expressed as follows (step S23 in FIG. 21):

Emain(3,2)={Ee(3,2)+Ef(3,2)}/2

Esub(3,2)={Ee(3,2)−Ef(3,2)}/2

The main echo component Emain(3,2) and sub-echo component Esub(3,2) calculated by performing the computation are shown in FIG. 24.

Furthermore, the controller 6 computes a phase shift φmain(3,2) and displacement pmain(3,2) of the peak of the main echo component of the echo E(3,2) and a phase shift φsub(3,2) and displacement psub(3,2) of the peak of the sub-echo component thereof (step S24 in FIG. 21).

Next, similarly to known techniques, based on a phase difference between the main echo component and sub-echo component of the n-th echo; a value is given by the following expression:

φmain(3,2)−φsub(3,2)

pmain(3,2)−psub(3,2), and a quantity Δφ for correcting the application phase φ for RF pulses RF or a quantity ΔGss for correcting a slice-selective gradient pulse Gss and a quantity ΔGro for correcting a readout gradient pulse Gro, which are needed for execution of a scan, are computed (step S25 in FIG. 21).

Figure 25:
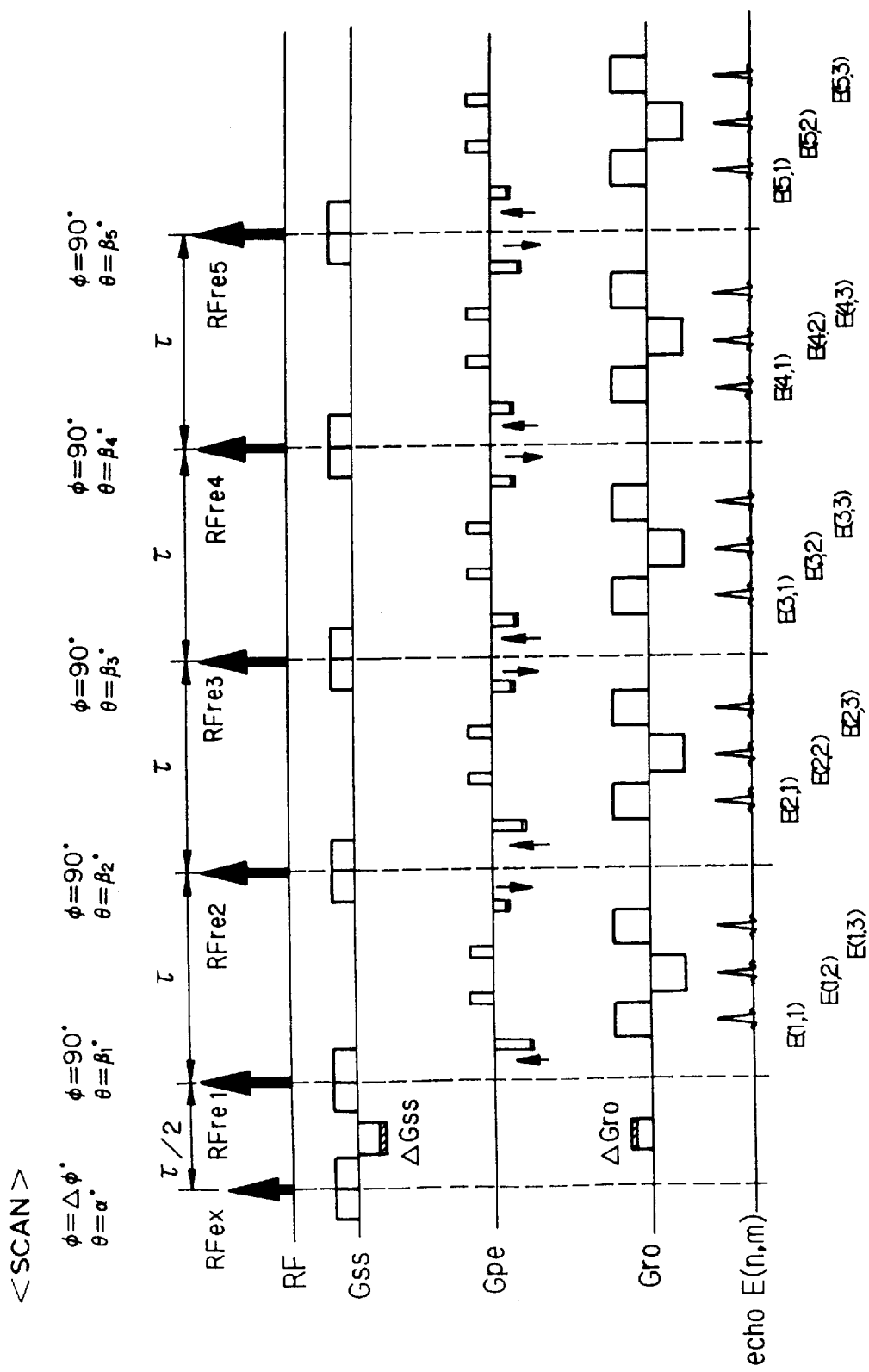
FIG. 25 shows a pulse sequence of a scan in the third embodiment.

Finally, the controller 6 switches over the switch path of the multiplexer 11 to the reconstruction unit 12, and allows the sequencer 5 to execute a scan according to a pulse sequence shown in FIG. 25 (step S26 in FIG. 21). For the scan, as illustrated, the application phase φ for an RF excitation pulse RFex to be applied first together with a slice-selective gradient pulse Gss is equal to Δφ or the strength of a slice-selective gradient pulse Gss to be applied succeedingly to the slice-selective gradient pulse Gss, reversed in polarity, and used to prevent dephasing is a value corrected by ΔGss. At the same time, the strength of a readout gradient pulse Gro to be applied in parallel with the slice-selective gradient pulse Gss used to prevent dephasing is a value corrected by ΔGro.

As mentioned above, according to this embodiment, the advantages of the first and second embodiments are available. In addition, unlike the FSE imaging, the GRASE imaging does not vary the waveform of a phase-encoding gradient pulse very much among RF refocusing pulses. The pattern of occurrence of a phase error deriving from phase encoding becomes regular. Consequently, corrections by ΔGss and ΔGro which are shown as hatched areas in FIG. 18 make it possible to minimize artifacts effectively.

(Fourth Embodiment)

An MRI system in accordance with the fourth embodiment will be described with reference to FIGS. 26 to 30. Even in this embodiment, two kinds of prescans G and H are used. However, phase encoding is performed on each echo during the prescans in the same manner as it is during a scan. Herein, description will proceed on the assumption that a GRASE pulse sequence is employed.

The MRI system has the same configuration as those of the aforesaid embodiments. The controller 6 executes processing described in FIG. 26.

Figure 26:
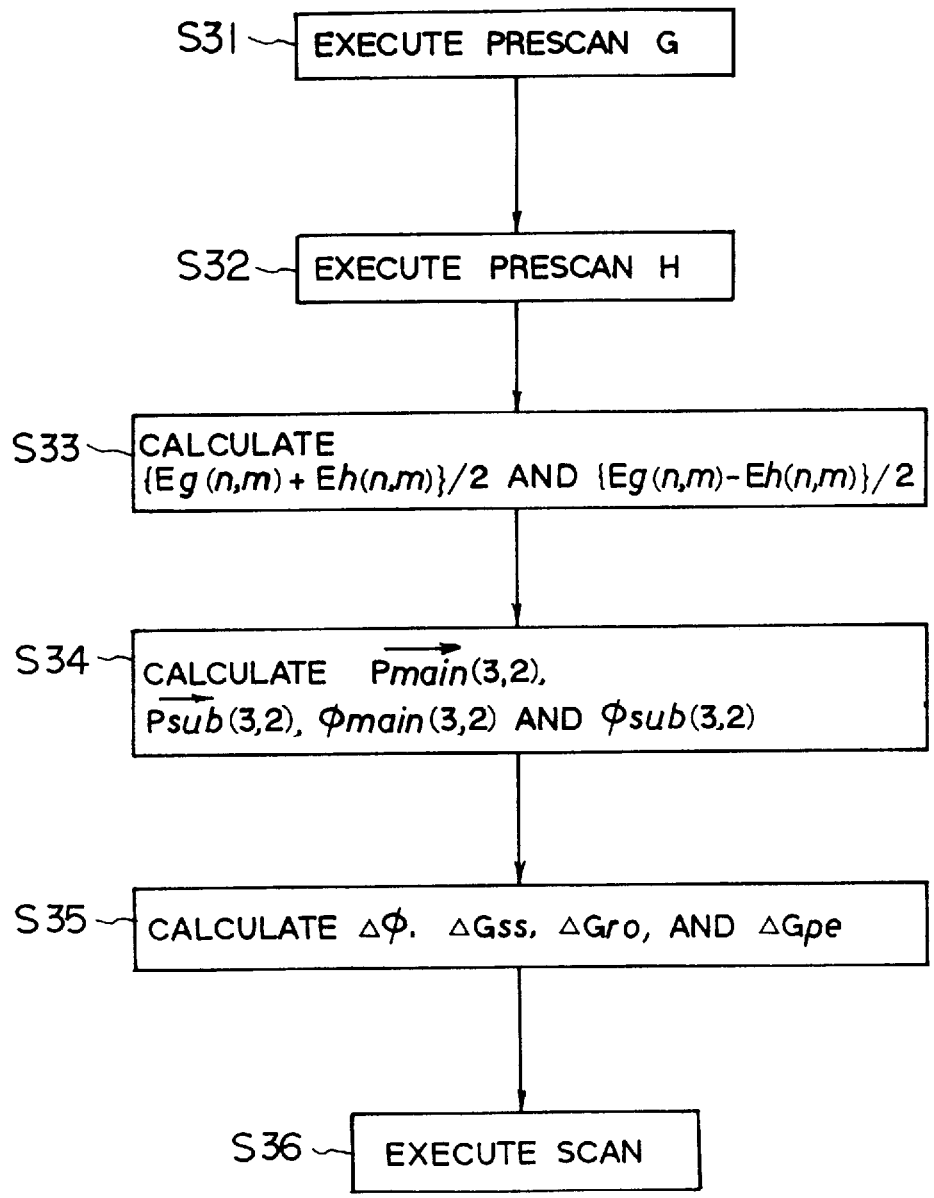
FIG. 26 is a flowchart showing processing executed by a controller in a fourth embodiment.

The controller 6 switches over the switch path of the multiplexer 11 to the controller 6, commands the sequencer 5 to successively execute two kinds of prescans G and H according to the GRASE imaging, and inputs acquired echoes (step S31 in FIG. 26).

Figure 27:
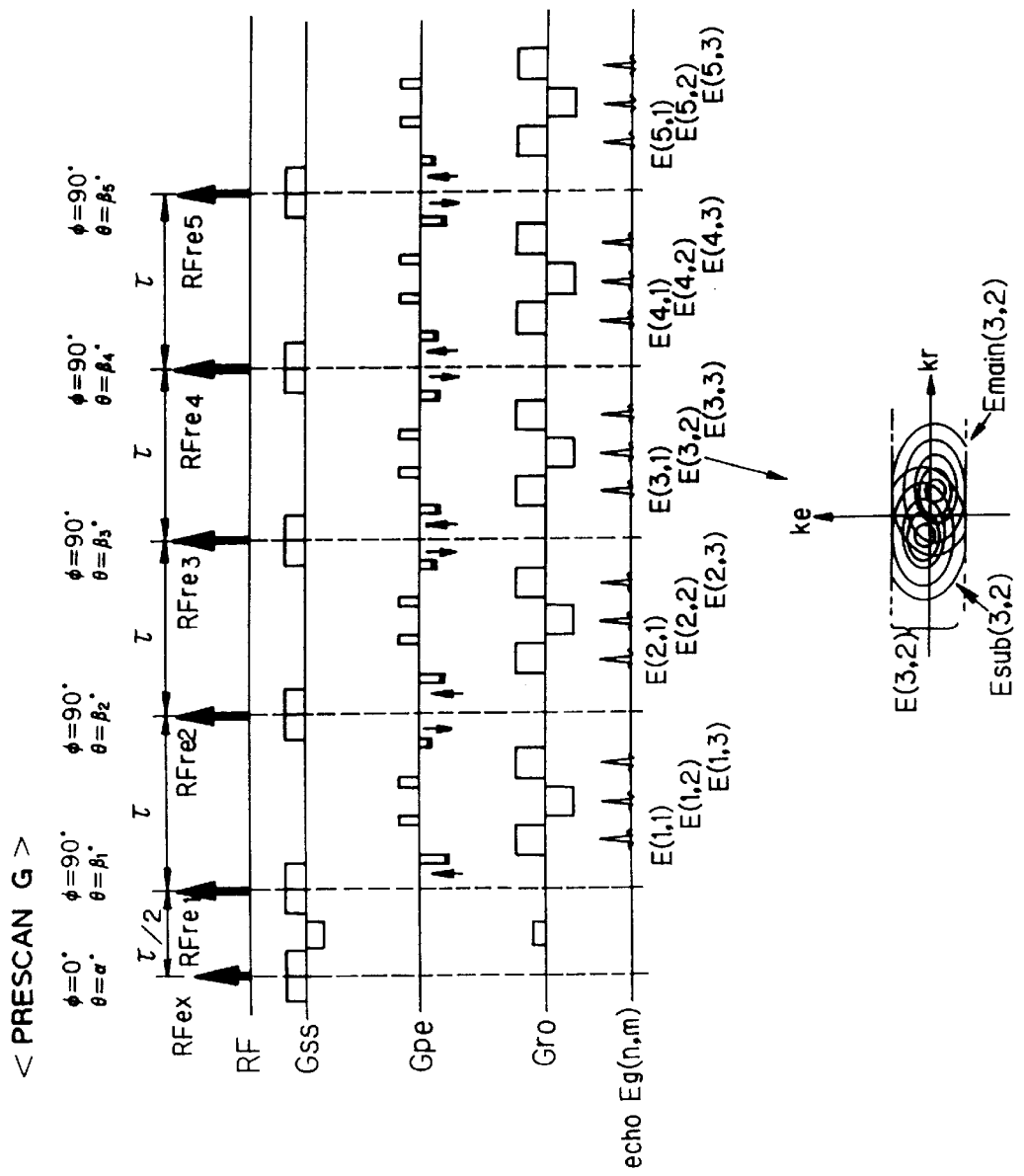
FIG. 27 is a pulse sequence illustrating one prescan G in the fourth embodiment.
Figure 28:
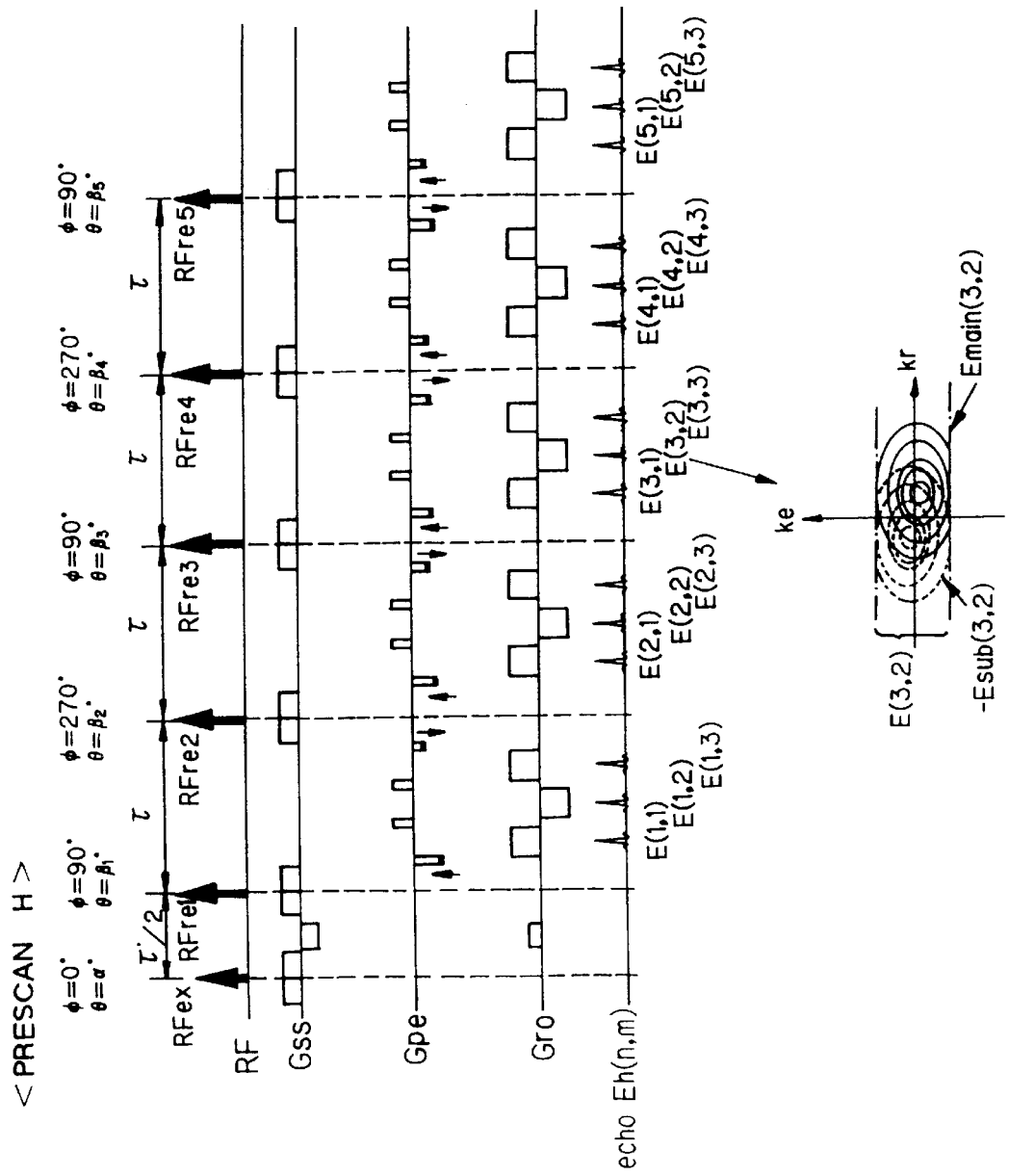
FIG. 28 is a pulse sequence illustrating the other prescan H in the fourth embodiment.

Unlike the aforesaid prescans, the first prescan G shown in FIG. 27 and the succeeding prescan H shown in FIG. 28 vary the strength of a phase-encoding gradient pulse Gpe or a quantity of phase encoding, which is performed on each echo Eg(n,m) or Eh(n, m) in the same manner as it is during a scan, at every shot. The addition of phase encoding is intended to acquire two-dimensional unadjusted echo data covering the whole or part of a k-space. The application phases for RF pulses RFex, and RFre1, REre2, etc. are varied in the same manner as those set for the two kinds of prescans A and B in the first embodiment. Two two-dimensional echo data sets; Eg(n,m) and Eh(n,m), are therefore acquired by changing the combination of application phases for RF pulses.

For the prescans G and H, a GRASE pulse sequence in which the number of RF refocusing pulses is 5, the number of gradient echoes to be acquired between adjoining RF refocusing pulses is 3, and the total number of echoes per shot is 15, is taken for instance. Shown in the drawings are, for the sake of representation, waveforms of magnetic field gradients attained when the number of shots is two and the number of matrix elements in a phase-encoding direction in an image is 30. The number of shots is preferably set to a value permitting stable measurement of a first-order phase change in a phase-encoding direction in a screen by analyzing only the $n_{eff}$-th echo corresponding to an echo produced in an effective echo time, for example, 8 or more(in terms of data in a k-space, this is comparable to 8 or more adjoining echo data lines with a data line containing the center of the k-space as a center data line).

If nuclear spins are dephased, each of echoes E(2,m), E(3,m), etc. except the first echo E(1,m) is split into two echo components; that is, a main echo component Emain (2,m) (Emain(3,m), etc.) and a sub-echo component Esub (2,m) (Esub(3,m), etc.) (See, for example, echoes Eg(3,2) and Eh(3,2) in FIGS. 27 and 28). During the succeeding prescan H, the application phase for even-numbered RF refocusing pulses RFre2, RFre4, etc. is advanced by an extra 180°. The phases of even-numbered sub-echo components Esub(2,m), Esub(4,m), etc. alone are therefore advanced by 180° from the corresponding ones attained during prescan G.

Figure 29:
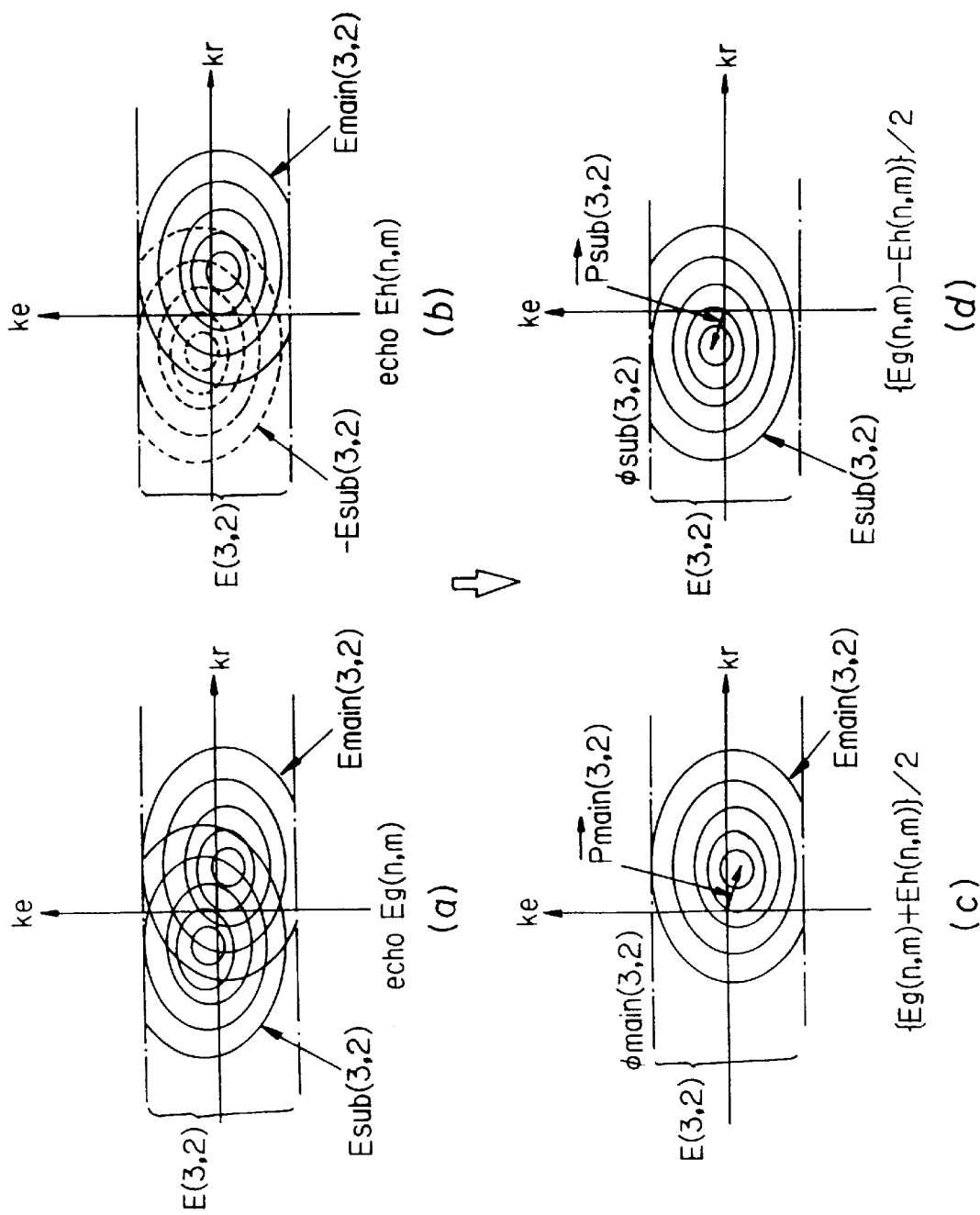
FIG. 29 is an illustration of separation and extraction of main echo and sub-echo components.

Similarly to the aforesaid embodiments, as shown in FIG. 29, assuming that a two-dimensional echo given by the first prescan G is Eg(n,m) and an echo given by the succeeding prescan H is Eh(n,m), a two-dimensional main echo component Emain(n,m) developed in a k-space and a two-dimensional sub-echo component Esub(n,m) developed therein are provided as follows:

$$\text{Emain }(n,m)=\{Eg(n,m)+Eh(n,m)\}/2 \quad (7)$$

$$\text{Esub }(n,m)=\{Eg(n,m)-Eh(n,m)\}/2 \quad (8)$$

Assuming that an $n_{\mathit{eff}}$-th echo E(n,m) corresponding to an echo produced in an effective echo time during either of the prescans is, for example, E(3,2), a main echo component Emain(3,2) and a sub-echo-component Esub(3,2) are provided according to the following expressions (step S33 in FIG. 26):

Emain(3,2)={Eg(3,2)+Eh(3,2)} / 2

Esub(3,2)={Eg(3,2)−Eh(3,2)} / 2

The provided echo components Emain(3,2) and Esub(3,2) are shown in FIGS. 29(c) and 29(d). Among two pairs of echo components of a two-dimensional echo E(3,2) corresponding to the $n_{\mathit{eff}}$-th echo, a pair of pub-echo components Esub(3,2) are 180° out of phase mutually (one of the components is shown with dashed lines in FIGS. 28 and 29). As mentioned above, therefore, the main echo component Emain(3,2) is provided by performing additive averaging, that is, division of a sum by 2, and the sub-echo component Esub(3,2) is provided by performing subtractive averaging, that is, division of a difference by 2.

Furthermore, the controller 6 computes a phase shift φmain(3,2) and displacement pmain(3,2) of the peak of the main echo component of the (3,2)-th echo E(3,2) and a phase shift φsub(3,2) and displacement psub(3,2) of the peak of the sub-echo component thereof on the basis of the above two-dimensional echo data Emain(3,2) and Esub(3,2) developed in the k-space (step S34 in FIG. 26). Incidentally, the displacements pmain(3,2) and psub(3,2) are two-dimensional vectors.

Next, a phase difference between the main echo component and sub-echo component of the (3,2)-th echo and a difference between the peak position vectors of the components are computed according to the expressions (1) and (2); that is, by calculating the following expressions:

φmain(3,2)=φsub(3,2) and pmain(3,2)=ρsub(3,2) Based on the resultant values, a quantity Δφ of correcting an application phase φ for RF pulses RF, a quantity ΔGss of correcting a slice-selective gradient pulse Gss, a quantity ΔGro of correcting a readout gradient pulse Gro, and a quantity ΔGpe of correcting a phase-encoding gradient pulse Gpe are computed (step S35 in FIG. 26). Since each result of the corrective computation is reversed in polarity depending on whether the $n_{\mathit{eff}}$-th numeral is odd or even, the order of subtraction should be made uniform in order to attain the same polarity all the time.

Figure 30:
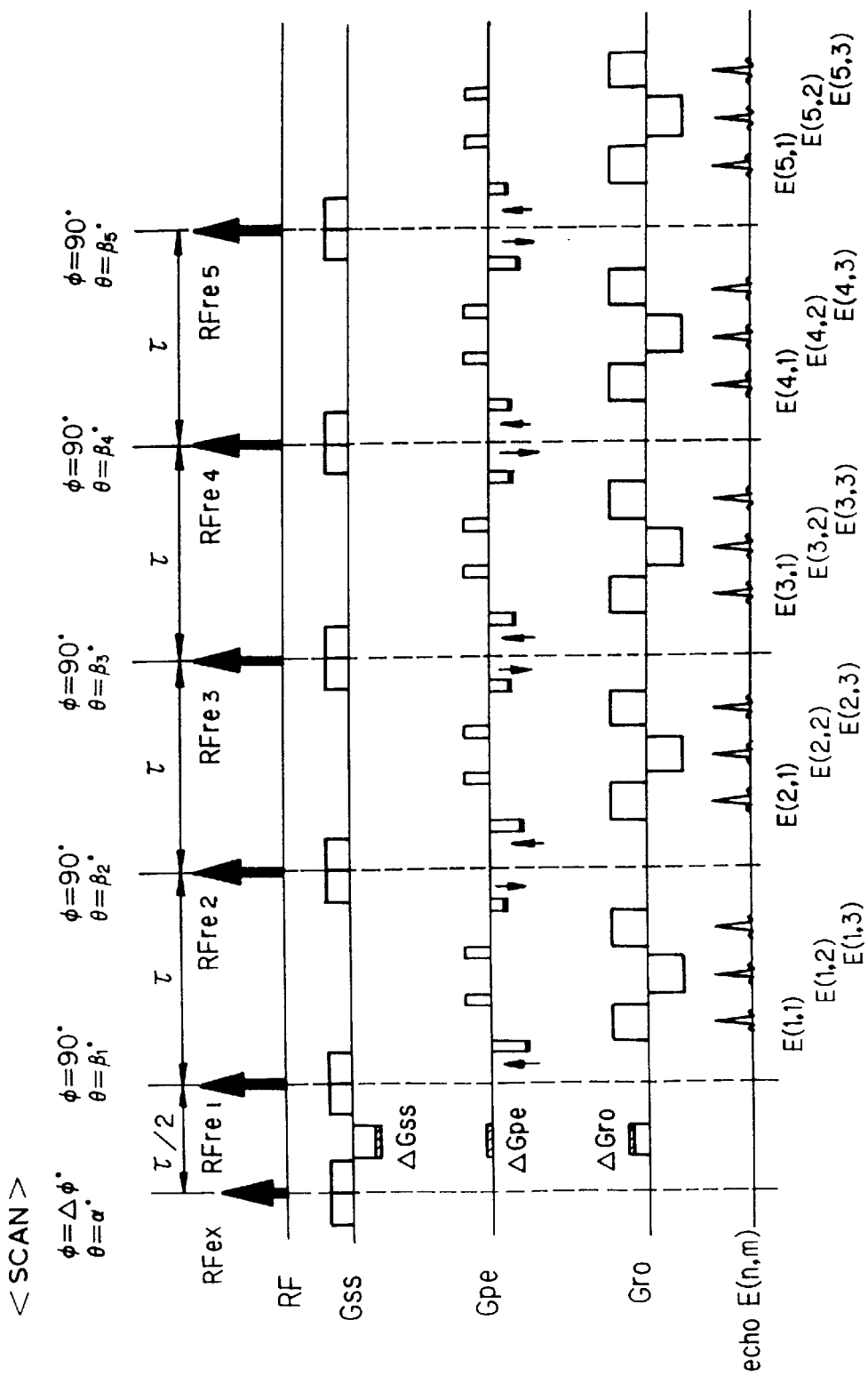
FIG. 30 shows a pulse sequence of a scan in the fourth embodiment.

Finally, the controller 6 switches over the switch path of the multiplexer 11 to the reconstruction unit 12, and allows the sequencer 5 to execute a scan according to a pulse sequence shown in FIG. 30 (step S36 in FIG. 26).

For the scan, as illustrated, a pulse sequence in which the results of the corrective computation are reflected is employed. Specifically, the application phase φ for an RF excitation pulse RFex (flip angle φ=α(90° in this example)) to be applied first together with a slice-selective gradient pulse Gss is equal to Δφ, or the strength of a slice-selective gradient pulse Gss to be applied succeedingly to the slice-selective gradient pulse Gss, reversed in polarity, and used to prevent dephasing is a value corrected by ΔGss. At the same time, the strength of a readout gradient pulse Gro to be applied in parallel with the slice-selective gradient pulse Gss used to prevent dephasing is a value corrected by ΔGro, and the strength of a phase-encoding gradient pulse Gpe is a value corrected by ΔGpe.

Thereafter, similarly to the aforesaid embodiments, a plurality of RF refocusing pulses RFre1, RFre2, etc. are used to consecutively acquire echoes E(n,m) produced as a result of refocusing of nuclear spins, and then reconstructed into an MR image.

As mentioned above, according to this embodiment, in addition to the advantages provided by the first to third embodiments, an advantage that even a dephased component of dephased components caused by a phase-encoding gradient pulse, which exhibits a first-order spatial distribution in a phase-encoding direction, can be corrected preferably, that the precision in correcting a pulse sequence used for a scan is improved markedly, and that high-quality MR images can be produced can be made available.

Incidentally, a procedure of calculating the quantities of correction Δφ, ΔG (ΔGss, ΔGro, and ΔGpe) in this embodiment is not limited to the aforesaid one. Alternatively, two-dimensional images may be reconstructed using the two-dimensional echo data given by prescans. In this case, the slopes and intercepts of curves depicted to show distribution of phases in a readout direction and phase-encoding direction respectively; that is, first-order components and zero-order components of phases indicated by the curves in the readout direction and phase-encoding direction, are then calculated. Displacements and phase shifts of echo peaks are then calculated on the basis of the first-order components and zero-order components. Finally, quantities of correction Δφ and ΔG used to correct a pulse sequence to be employed in a scan are calculated.

The aforesaid embodiments have been described by taking two-dimensional scanning for instance. Alternatively, correction can be made for three-dimensional scanning or larger-dimensional scanning by increasing the dimension of a vector.

(Fifth embodiment)

The fifth embodiment of the present invention will be explained in conjunction with FIGS. 31 and 32. In the embodiment, although two kinds of prescan are performed in the same manner as described above, the prescans use a particular object being prescanned in consideration of the nature of the prescan.

Figure 31:
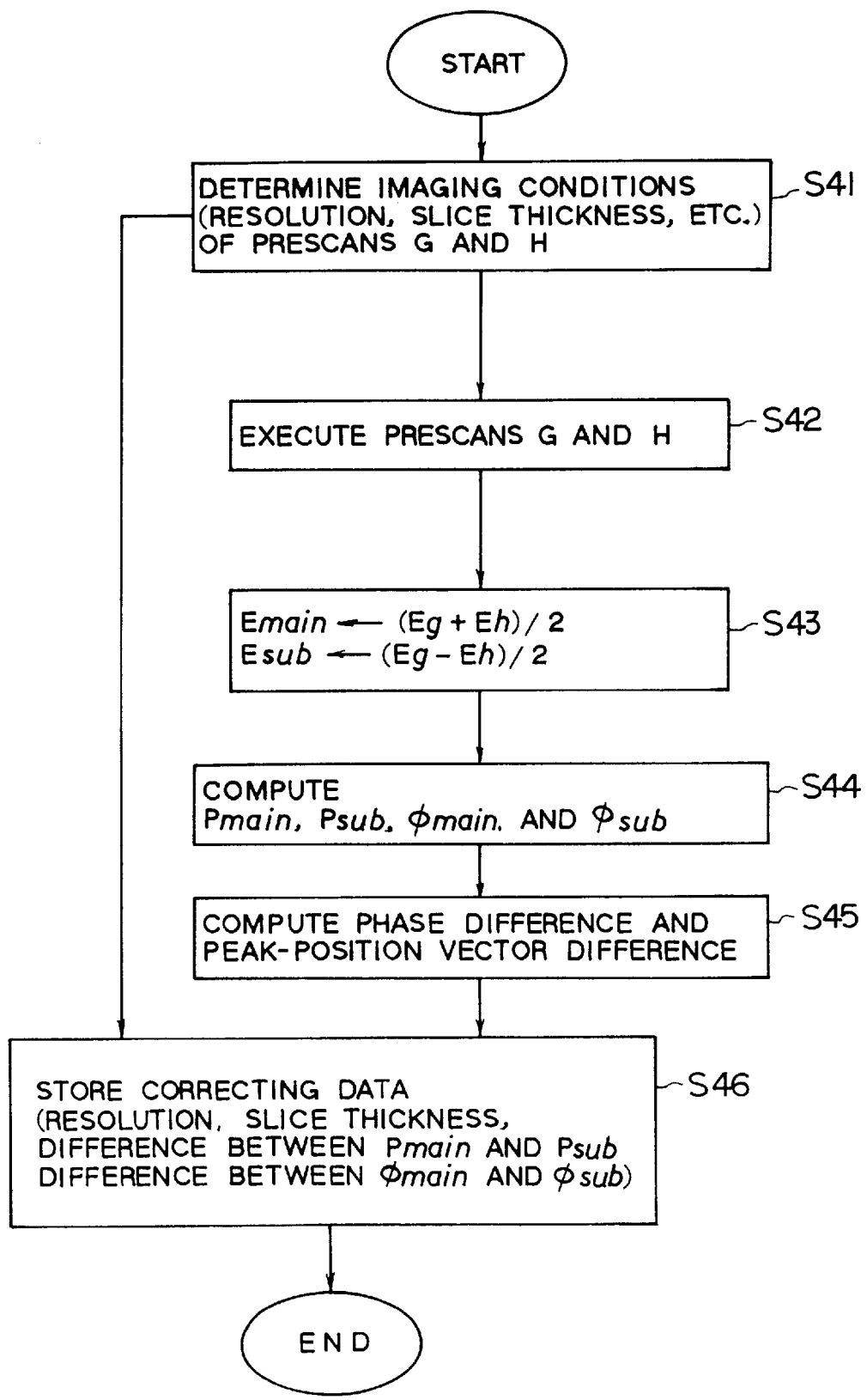
FIG. 31 is a flowchart showing processing of prescans executed by a controller in a fifth embodiment.
Figure 32:
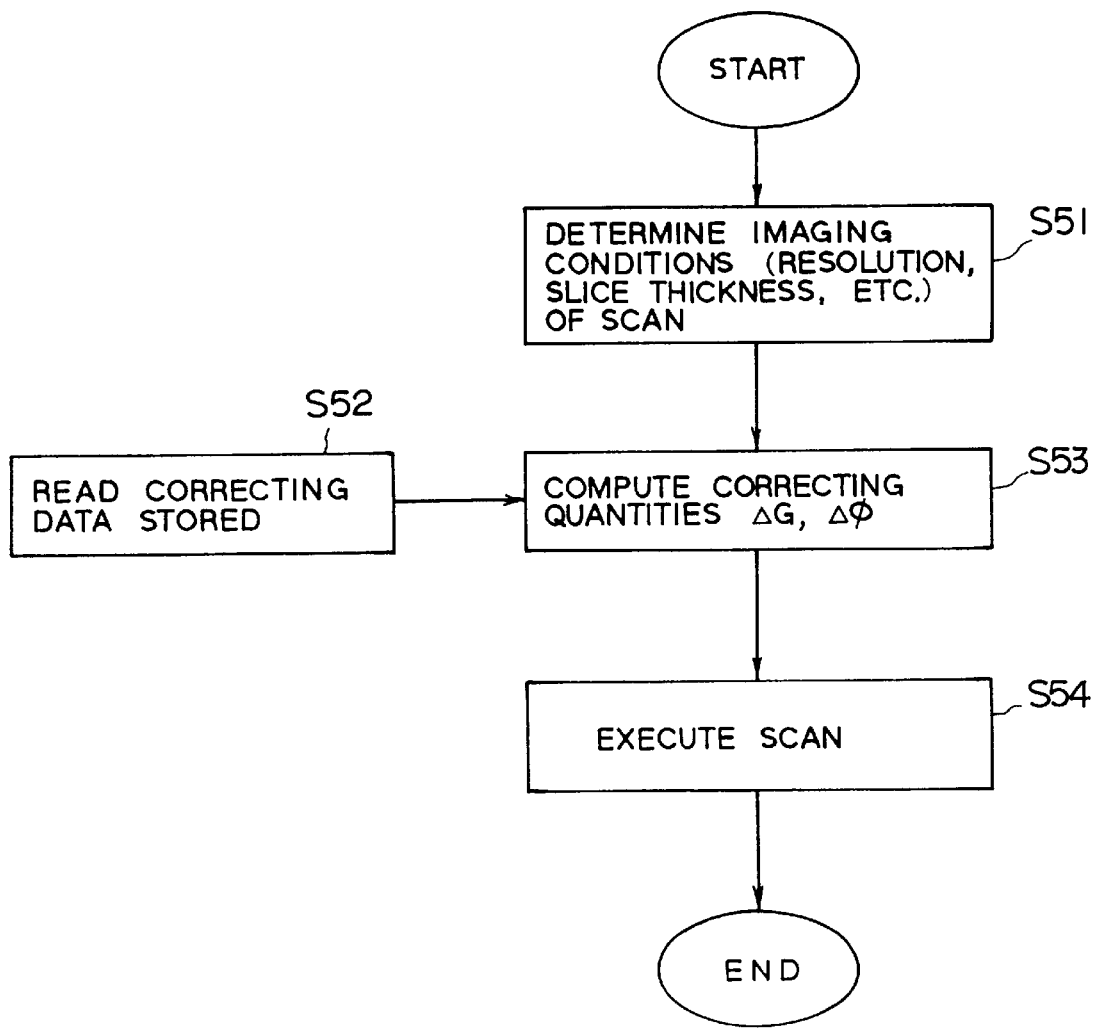
FIG. 32 is a flowchart showing processing of a scan executed by the controller in the fifth embodiment.

The MRI system used in this embodiment is the same in hardware construction as that in the first embodiment, but different in that the controller 6 executes two sets of processes shown in FIGS. 31 and 32. A set of processes in FIG.

31 provides a prescan procedure and a set of processes in FIG. 32 provides a scan procedure.

Performing the prescan is to measure phase errors of the main and sub-echo components resulting from incompleteness of used hardware such as the gradient coils. Accordingly, it is not always necessary that an object to be prescanned be the same as that scanned in the scan obtaining diagnostic MR images. In the present embodiment, a patient as the object is replaced by a phantom. To attain higher measurement accuracy, favorable phantoms should be as uniform as possible in signal spatial distribution. For example, such phantoms include an acrylic-resin-made container filled with copper sulfate aqueous solution.

Such an objective phantom is placed in the diagnostic space of the magnet 1. When a start command is given to the controller 6, the controller 6 initiates the prescanning processes shown in FIG. 31.

First, at Step S41 in FIG. 31, the controller 6 determines resolution and slice thickness which are imaging conditions for two kinds of prescan G and H. The prescans G and H are the same as those described in the fourth embodiment, and uses pulse sequences in compliance with the GRASE technique. At Step S42, the controller 6 performs in turn the two kinds of prescan G and H with the determined imaging conditions. Processing is then moved to Step S43, where computation is carried out in the same manner as in the fourth embodiment, thereby main echo components Emain(n,m) and sub-echo components Esub(n, m) of an echo signal E(n,m) at the $n_{eff}$-th (i.e., the(n,m)-th) are extracted based on the following formulas:

Emain(n,m)={Eg(n,m)+Eh(n,m)}/2

Esub(n,m)={Eg(n,m)−Eh(n,m)}/2

At Step S44, computation is carried out for obtaining the 0-th and first order components of the spatial distribution in which phase errors of each of the main echo component Emain(n,m) and sub-echo component Esub(n,m); φmain(n, m), Pmain(n,m), φsub(n,m), and psub(n,m). The controller 6 executes in turn processes of Steps S45 and S46. At Step S45, computed are differences in phases of the main echo and sub-echo components and differences in peak position vectors of the main echo and sub-echo components, based on the foregoing formulas (1) and (2). At Step S46, information with respect to those differences, together with data of the spatial resolution and slice thickness, as correcting data, are stored into the memory unit 13.

When the scan is instructed to start, the controller 6 begins processes in FIG. 32. Firstly, at Step S51, resolution and slice thickness which are imaging conditions are determined by, for example, making reference to data given from an operator. At Step S52, correcting data are read out which have been obtained and memorized with the prescans. The correcting data are of the imaging conditions (resolution, slice thickness, etc.) and the phase difference and peak positional vector difference for the main echo and sub-echo components.

Further, at Step S53, correcting quantities Δφ and ΔG are computed in the same manner as that described before on the basis of the read-out correcting data. In this computation, the imaging conditions and spatial resolution in each direction of an MR image for the scan are compared with those of the prescan in order to obtain the ratios between them. The correcting quantities Δφ and ΔG are computed correspondingly with the obtained ratios. At next Step S54, the controller 6 instructs the sequencer 5 to execute in the diagnostic a pulse sequence which reflects the computed correcting quantities Δφ and ΔG.

As described above, executing the prescan using the phantom having an ideal signal distribution makes it possible to have more accurate correcting quantities. Specifically, there is no possibility of moving an object (because, it is a phantom) in the prescan, which avoids the accuracy of correction of phase errors from being lowered and signals emanated from the object from being changed. Accordingly, all such merits lead to acquisition of more stable and accurate correcting quantities and make it possible to execute the diagnostic scan in a more stable and accurate manner in acquiring MR data. The prescan for acquiring correcting data of phase errors is not necessary for patients, and a diagnostic scan is solely performed. Hence, there is a decrease in examining time for patients and it makes easier it to provide more medical examinations.

Where the signal error distribution in the phase encode direction is as small as negligible, it may be possible that the prescan is performed in which the phase encode amount is zero, such as the prescans A and B in the foregoing first embodiment, phase error distributions in directions other than the phase encode direction are solely measured, and correction is performed on the basis of information of the phase error distributions. It may also be possible that, as seen in the prescans C and D in the foregoing second embodiment, executed is a prescan which can obtain a phase error distribution including the zero-th phase error component caused by the phase encode gradient.

(Sixth embodiment)

The sixth embodiment of the present invention, which is modified from the fifth embodiment, will be explained in conjunction with FIGS. 33 and 34. In an MRI system according to the sixth embodiment, phase error characteristics of physical channels of gradients are measured with two kinds of prescans G and H which are identical to the fifth embodiment, prior to a diagnostic scan. When the scan is performed, imaging conditions associated with gradients, such as an imaging cross-sectional direction, resolution, and slice thickness, are used to compute the correcting quantities Δφ and ΔG for a pulse sequence of the scan. This eliminates the necessity of executing the prescan which should be directed in the same direction as the scan, and makes it possible to compute the correcting quantities Δφ and ΔG to the scan directed in an arbitrary cross-sectional direction.

Figure 33:
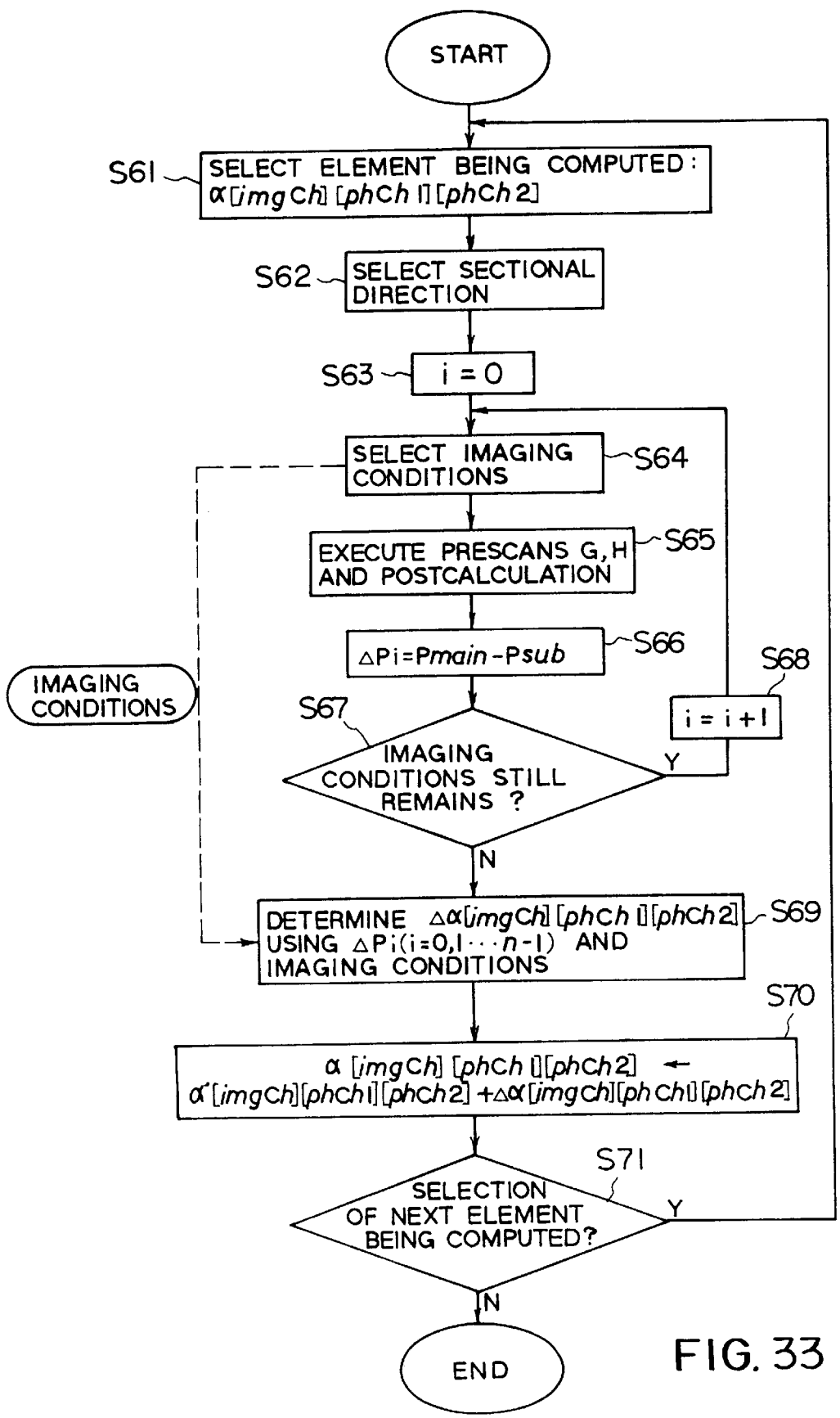
FIG. 33 is a flowchart showing computation of correcting gradient coefficient matrices in prescans in a sixth embodiment.
Figure 34:
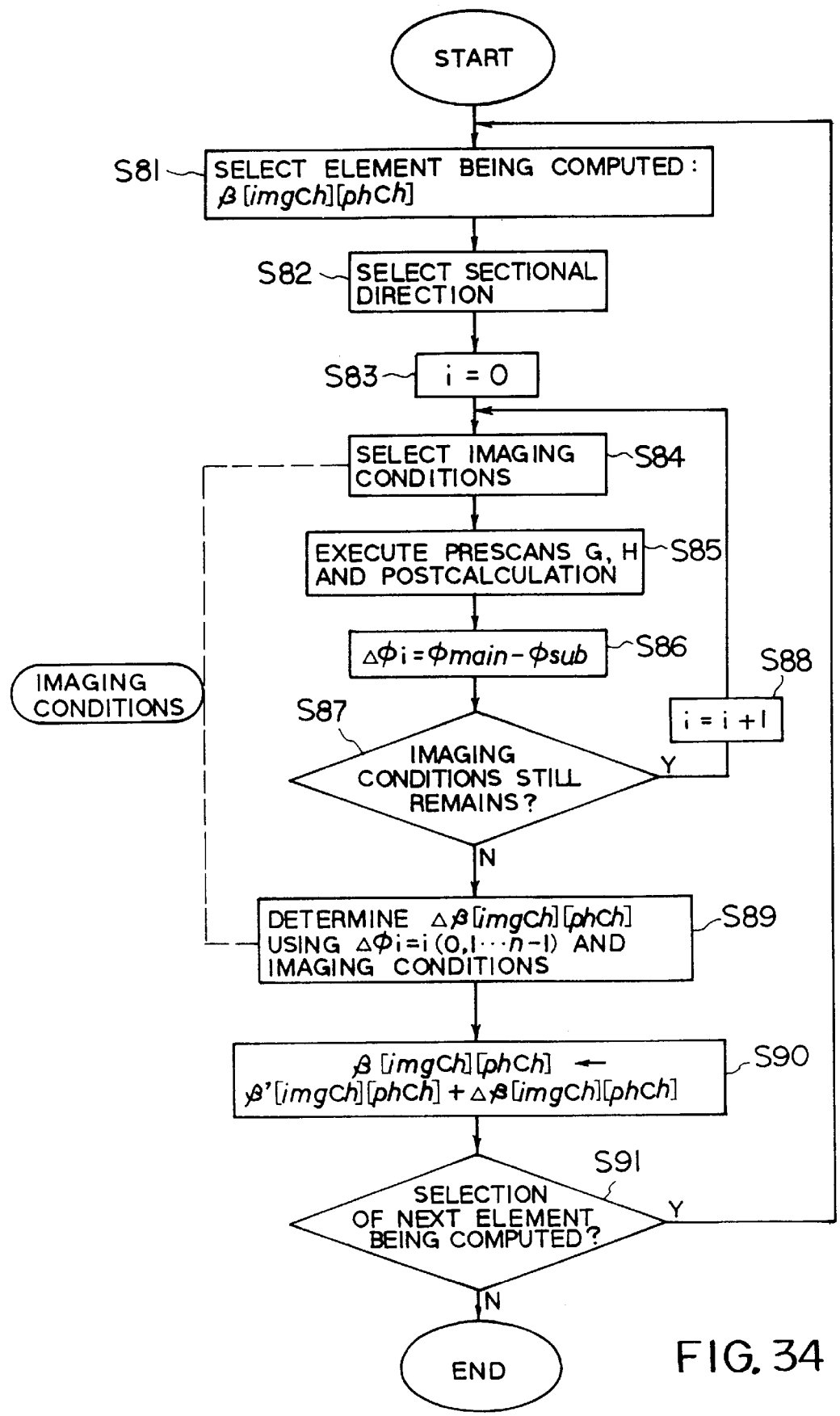
FIG. 34 is a flowchart showing computation of correcting RF phase coefficient matrices in prescans in the sixth embodiment.

The controller 6 executes not only the procedures shown in FIGS. 33 and 34 replaced by FIG. 31 but also the procedures shown in FIG. 32.

The procedures represented in FIG. 33 include prescans and are used for computing the elements (referred to as an "array α") of correcting gradient coefficient matrices Kp,ro, Kp,pe, Kp,ss, while those represented in FIG. 34 are for computing the elements (referred to as an "array B") of correcting RF phase coefficient vector Kφ,ro, Kφ,pe, Kφ,ss.

The relation between each of the correcting gradient coefficient matrices Kp,ro, Kp,pe, Kp,ss and the array a is expressed element by element by the following formula (9).

$$Kp, ro = \begin{pmatrix} \alpha[0][0][0] & \alpha[0][1][0] & \alpha[0][2][0] \\ \alpha[0][0][1] & \alpha[0][1][1] & \alpha[0][2][1] \\ \alpha[0][0][2] & \alpha[0][1][2] & \alpha[0][2][2] \end{pmatrix} \quad (9)$$

$$Kp, pe = \begin{pmatrix} \alpha[1][0][0] & \alpha[1][1][0] & \alpha[1][2][0] \\ \alpha[1][0][1] & \alpha[1][1][1] & \alpha[1][2][1] \\ \alpha[1][0][2] & \alpha[1][1][2] & \alpha[1][2][2] \end{pmatrix}$$

-continued
$$Kp, ss = \begin{pmatrix} \alpha[2][0][0] & \alpha[2][1][0] & \alpha[2][2][0] \\ \alpha[2][0][1] & \alpha[2][1][1] & \alpha[2][2][1] \\ \alpha[2][0][2] & \alpha[2][1][2] & \alpha[2][2][2] \end{pmatrix}$$

The relation between each of the correcting RF phase coefficient vectors Kϕro, Kϕ,pe, Kϕ,ss and the array B is shown element by element below by the following formula (10).

$$\begin{aligned} K\phi, ro &= (\beta[0][0] \quad \beta[0][1] \quad \beta[0][2]) \\ K\phi, pe &= (\beta[1][0] \quad \beta[1][1] \quad \beta[1][2]) \\ K\phi, ss &= (\beta[2][0] \quad \beta[2][1] \quad \beta[2][2]) \end{aligned} \quad (10)$$

The correcting gradient coefficient matrices Kp,ro, Kp,pe, Kp,ss relate to the correcting gradient ΔG through the following formula (11).

$$\Delta M = \tau \Delta G T = Kp, ro \cdot R \cdot \begin{pmatrix} F, ro \cdot Mo, ro \\ 0 \\ 0 \end{pmatrix} + \\ Kp, pe \cdot R \cdot \begin{pmatrix} 0 \\ F, pe \cdot Mo, pe \\ 0 \end{pmatrix} + Kp, ss \cdot R \cdot \begin{pmatrix} 0 \\ 0 \\ F, ss \cdot Mo, ss \end{pmatrix} \quad (11)$$

Further, the correcting RF phase coefficient vectors Kϕjo, Kϕ,pe, Kϕ,ss are coupled with the correcting quantity Δϕ of the application phase of the RIF pulse by the following formula (12).

$$\Delta\phi = K\phi, ro \cdot R \cdot \begin{pmatrix} F, ro \\ 0 \\ 0 \end{pmatrix} + K\phi, pe \cdot R \cdot \begin{pmatrix} 0 \\ F, pe \\ 0 \end{pmatrix} + \\ K\phi, ss \cdot R \cdot \begin{pmatrix} 0 \\ 0 \\ F, ss \end{pmatrix} \quad (12)$$

Still further, a matrix R representing rotation of an imaging sectional direction can be defined as the following formula (13).

$$\begin{pmatrix} Mx \\ My \\ Mz \end{pmatrix} = R \cdot \begin{pmatrix} Mro \\ Mpe \\ Mss \end{pmatrix} \quad (13)$$

and the correcting gradient ΔGcan be expressed by elements shown as the following formula (14).

$$\Delta G = \begin{pmatrix} \Delta Gro \\ \Delta Gpe \\ \Delta Gss \end{pmatrix} \quad (14)$$

When it is supposed that M,imgCh are magnitudes of spatial frequencies in the directions of imaging channels imgCh (i.e., the directions of RO, PE, SS related to a pulse sequence) and M,phCh are magnitudes of spatial frequencies in the directions of physical channels phCh (i.e., the directions of physical channels related to the X-, Y-, and Z-gradient coils), the formula (13) is supposed to connect those directions with the rotation matrix R.

As shown in the formulas (9) and (11), when imgCh is made to correspond to phCh1, α[imgCh][phCh1][phCh2]

are coefficients representing how much the first-order phase distribution in the phCh2 direction should be corrected. T appears in the formula (11) as an interval of time for the correcting gradient. F,imgCh appeared in the formula (11) as ratios of gradient magnitudes required in an actual scan, the ratios being computed based on gradient magnitudes required to satisfy specified imaging conditions for imaging channels given by each suffix. Mo,imgCh seen in the formula (11) are magnitudes of spatial frequencies specified as a reference in imgCh directions.

Also, as shown in the formulas (10) and (12), when imaging channels imgCh of RO, PE and SS concerning a pulse sequence are made to correspond to physical channels phCh, B[imgCh][phCh]

are coefficients representing how much the zero-th order phase distribution should be corrected. F,imgCh shown in formula (12) are the same parameters as those in formula (11).

Computation of the elements of each correcting gradient coefficient matrix shown in FIG. 33, which is carried out by the controller 6, will now be explained. First, an element in a matrix is selected (Step S61). Next, an imaging sectional direction is selected in relation to the determined element (Step S62). In order to obtain elements of the matrix, imaging conditions should be changed in several ways, and in each imaging condition, a phase shift distribution of spins should be obtained and compared with each other.

In order to obtain the elements, first, a variable i for counting up the number collected is initialized by i=o (Step S63). Then, imaging conditions, such as spatial resolution and slice thickness, are determined such that a designated element is obtained (Step S64). Thanks to characteristics of gradient coils or a used pulse sequence, the number collected can be lowered when any element is regarded clearly as zero.

Further, at Step S65 in FIG. 33, the prescans G and H (i.e., a series of processes including Steps S42 to S44 in FIG. 31) are executed. Processing is moved to Step S66, where, on the basis of the two-dimensional vectors pmain and psub showing positional displacements of the main echo and sub-echo components and being obtained with the prescans, differences in those peak position vectors are computed for every variable i by the formula:

ΔPi=pmain−psub

Processing is moved to Step S67 to determine whether there still remains an unselected imaging condition. When there is an imaging condition which has not been selected so far, the variable i is incremented (i=i+1) at Step S68, and the processing is returned to Step S64. Thus, a series of steps S64 to S66 are repeated one time or a plurality of times. Differences APi in the peak position vectors are obtained on different imaging conditions or one imaging condition.

When the determination at Step S67 produces No and it is determined that all the prescans have ended for the predetermined imaging conditions, the controller 6 executes a process at Step S69, where correcting quantities of corresponding elements Δα[imgCh][phCh1][phCh2]

are computed based on information of the imaging conditions and the difference ΔPi in the peak position vectors. Then, at Step S70, the correcting quantities Δα[imgCh][phCh1][phCh2] are used to compute corresponding matrix elements:

$$\alpha[imgCh][phCh1][phCh2] =$$
$$\alpha'[imgCh][phCh1][phCh2] + \Delta\alpha[imgCh][phCh1][phCh2]$$

The foregoing processing is carried out for all the elements selected at Step S61 (Step S71).

The elements of each correcting RF phase coefficient vector are computed in the same manner as in FIG. 33. This computation is illustrated in Steps S81 to S91 in FIG. 34. At Step S81, a desired element B[imgCh][phCh]

of correcting RF phase coefficient vectors is preselectea. As Step S86, phase differences between the main echo and sub-echo components $\Delta\phi i = \phi main - \phi sub$ are computed for each imaging condition on the basis of the prescans G and H and the postcalculation associated with the prescans. Furthermore, at Step S89, information of the imaging conditions and the phase differences $\Delta\phi i$ are used to compute correcting quantities of corresponding vector elements:

$\Delta B[imgCh][phCh]$.

At Step S90, corresponding vector elements are computed by the following:

$$\Delta B[imgCh][phCh] = \Delta B'[imgCh][phCh] + \Delta B[imgCh1][phCh].$$

The correcting gradient coefficient matrices and correcting RF phase coefficient vectors are thus-obtained, and stored in the memory unit 13 or other internal memories (not shown) for use with a diagnostic scan which is to be carried out later on. The diagnostic scan is based on the manner described in FIG. 32. In other words, imaging conditions of the diagnostic scan are determined (Step S51), the correcting coefficient matrices and coefficient vectors which have been stored so far are read out (Step S52), and the correcting quantity $\Delta\phi$ of the application phase and the correcting quantity $\Delta G$ of the gradients are computed using the formulas (11) and (12). Finally, a pulse sequence reflecting those correcting quantities Ad) and $\Delta G$ is executed during the diagnostic scan (Step S54).

The above processing eliminates the necessity of executing the prescans performed in the same imaging sectional direction as the scan. Therefore, without the prescans, the scan can be done for an imaging section oriented in an arbitrary direction.

The characteristics of imaging described in the above sixth embodiment can be compared with the prior art references as follows. In U.S. Pat. No. 5,378,985 and Japanese Patent Laid-Open No. 6-54827 both described above, it is considered that all the elements corrected in each correspond to Kp,ro and Kp,ss among the correcting gradient coefficient matrices and K$\phi$,ro and K$\phi$,ss among the correcting RF phase coefficient vectors. In techniques of those references, since each element in not clearly separated, it is required that the prescan should be performed directly before the imaging scan with the same section direction, spatial resolution, and slice thickness as in the imaging scan.

In contrast, the sixth embodiment discloses a correction technique whereby not only diagonal elements of the correcting gradient coefficient matrix Kp,pe but also the correcting RF phase coefficient vector K$\phi$,pe, which are impossible to be corrected by the above-mentioned prior techniques, are additionally corrected, thereby increasing the number of corrected elements. In addition, the non-diagonal elements of all the correcting gradient coefficient matrices can be independently measured and corrected in the sixth embodiment, whereby correcting quantities can be computed even if the direction of an imaging section differs from each other between the prescan and the imaging scan. Further, correcting the phase of the RF pulse and the quantity of the gradients leads to correction of almost all the elements in the matrices and vectors. Accordingly, even when the MRI system according to the sixth embodiment employs the same or identical gradient coils in construction as conventional ones, the MRI system of this embodiment is able to provide more stable and high-quality MR images than conventional ones.

The computation models accomplishing the foregoing formulas (11), (12), etc. can be modified in compliance with the characteristics of gradient systems.

(Seventh embodiment)

The MRI system according to the seventh embodiment of the present invention will be described in conjunction with FIGS. 35 to 40. Apart from the foregoing embodiments, the MRI system in this embodiment is designed such that phase errors including phase error distributions of the second or higher orders are properly corrected without correction of waveforms of gradients and an application phase of the RF pulse included in an imaging pulse sequence of the scan.

The hardware of the MRI system is constructed in the same way as ones described before. The controller 6 is responsible for executing the procedure shown in FIG. 35 into which two kinds of prescans and one scan are combined. For the prescans and scan, an FSE method is used.

Figure 35:
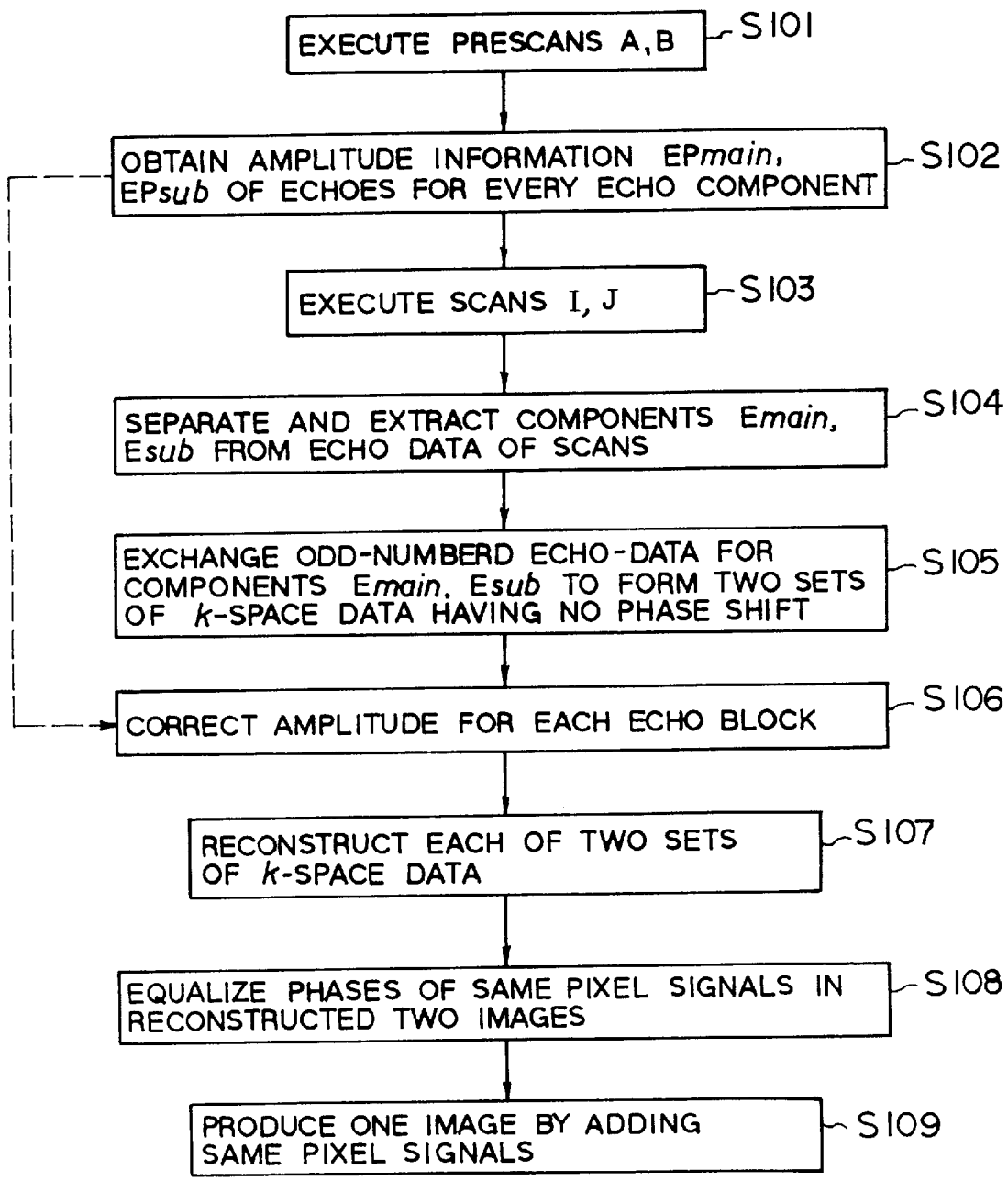
FIG. 35 represents a flowchart of processing for image data acquisition in a seventh embodiment.
Figure 36:
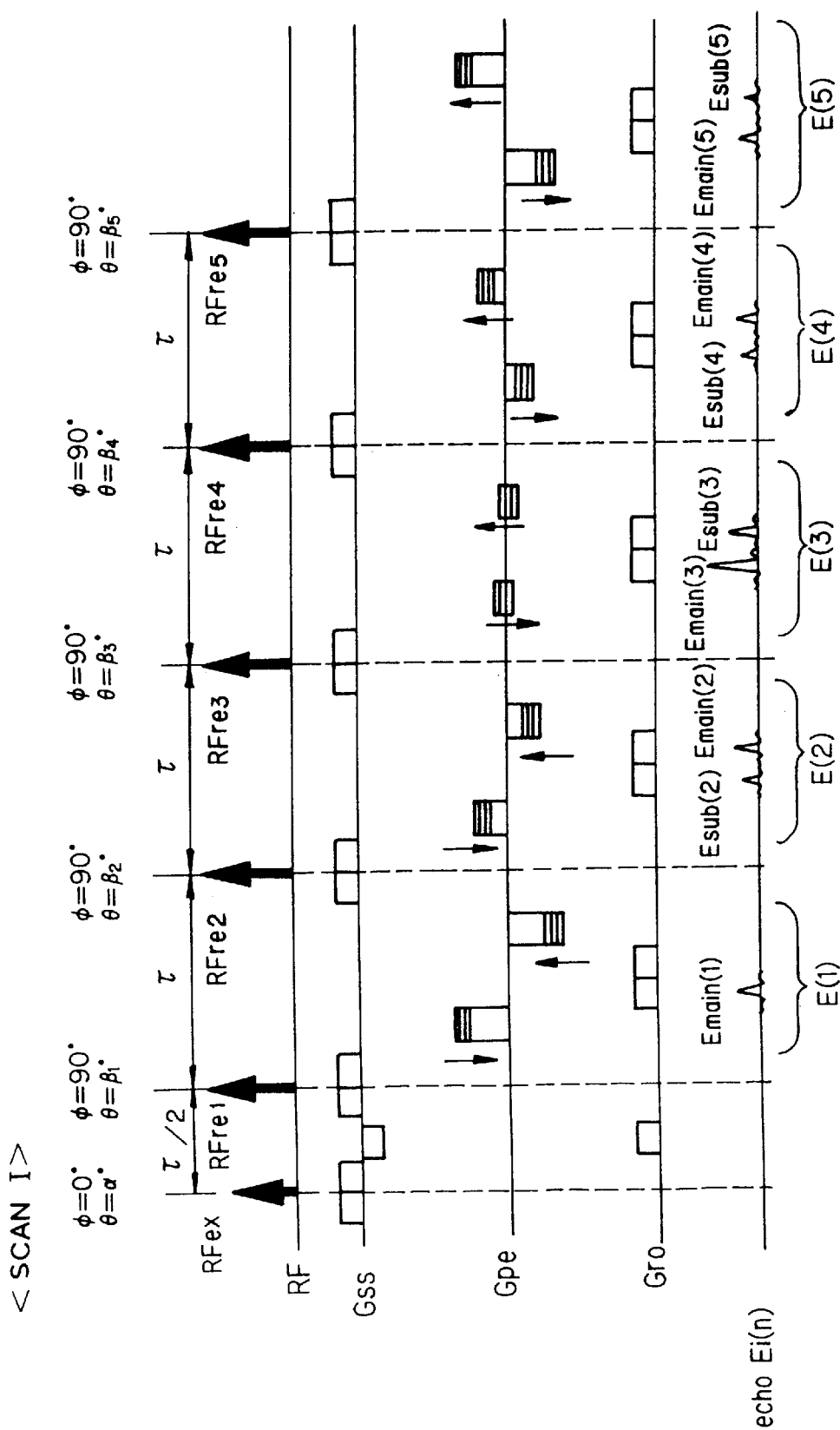
FIG. 36 is a pulse sequence illustrating one scan I in the seventh embodiment.
Figure 37:
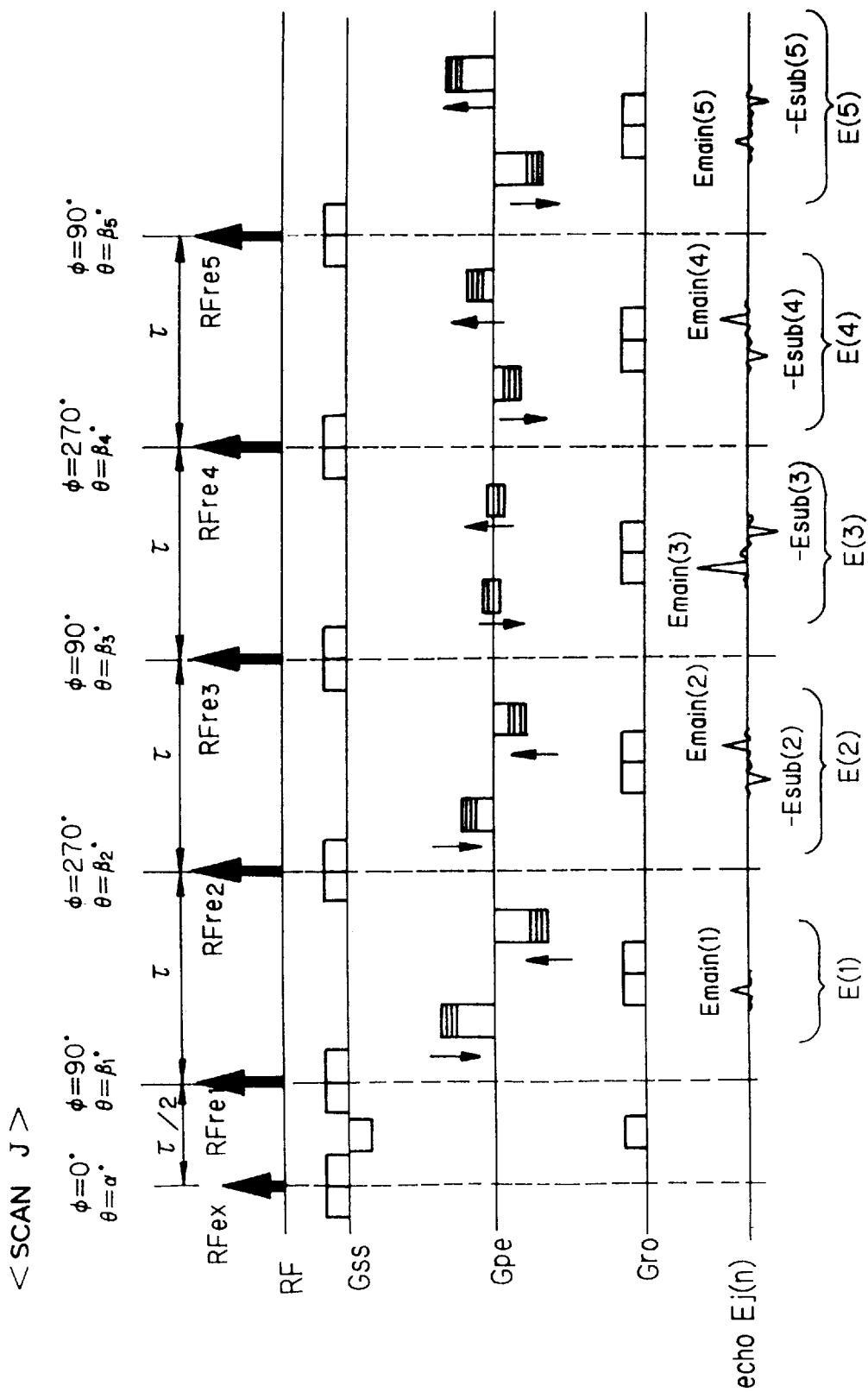
FIG. 37 is a pulse sequence illustrating the other prescan j in the seventh embodiment.
Figure 38:
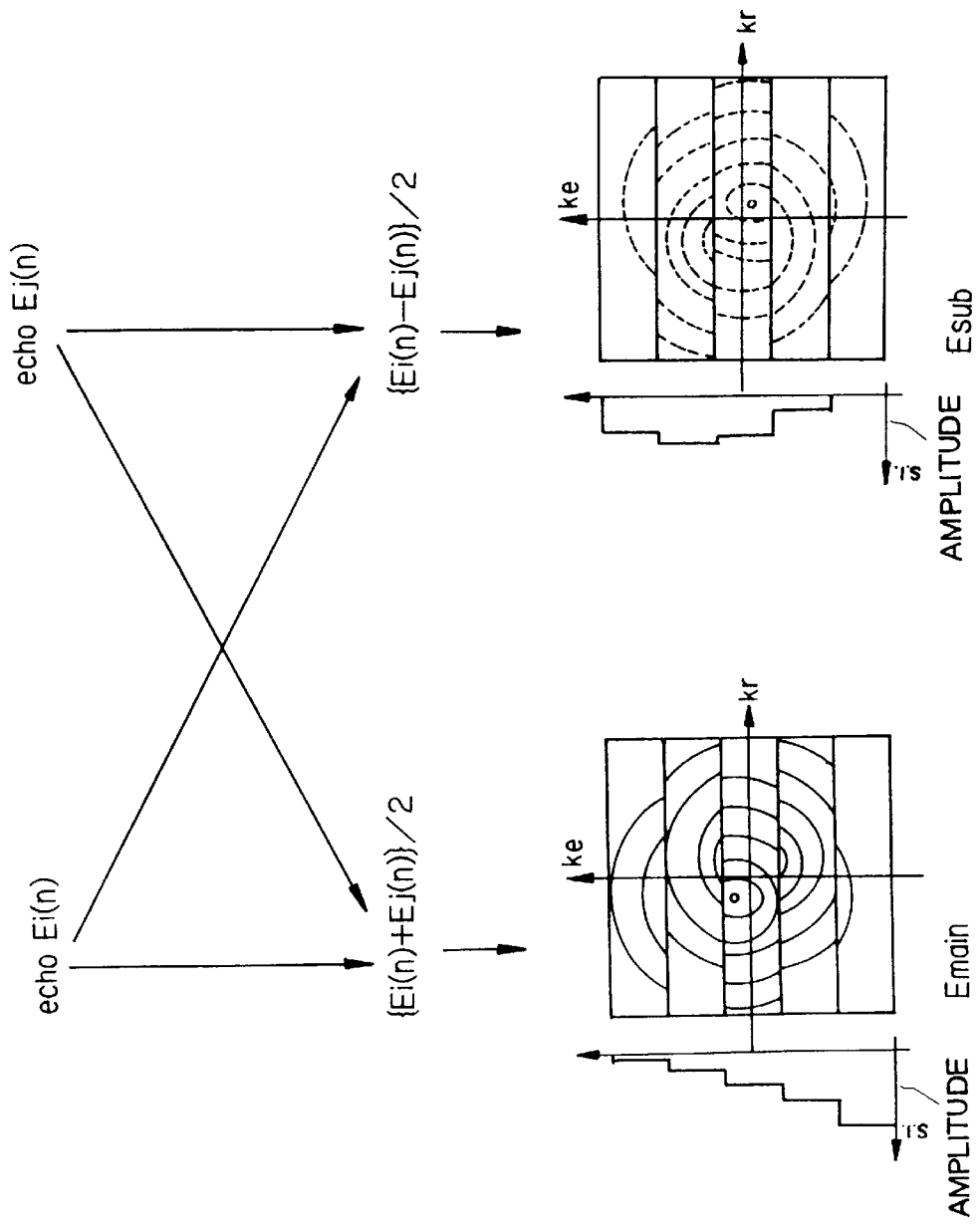
FIG. 38 shows an illustration of a separation and extraction of main echo and sub-echo components in two-dimensional k-spaces.

First of all, in a state that the multiplexer 11 has switched over its output to the controller side, the controller 6 sends the sequencer 5 a command to execute two kinds of prescans A and B in sequence (Step S 101 in FIG. 35). These prescans A and B are the same in manner as those in the first embodiment.

Figure 39:
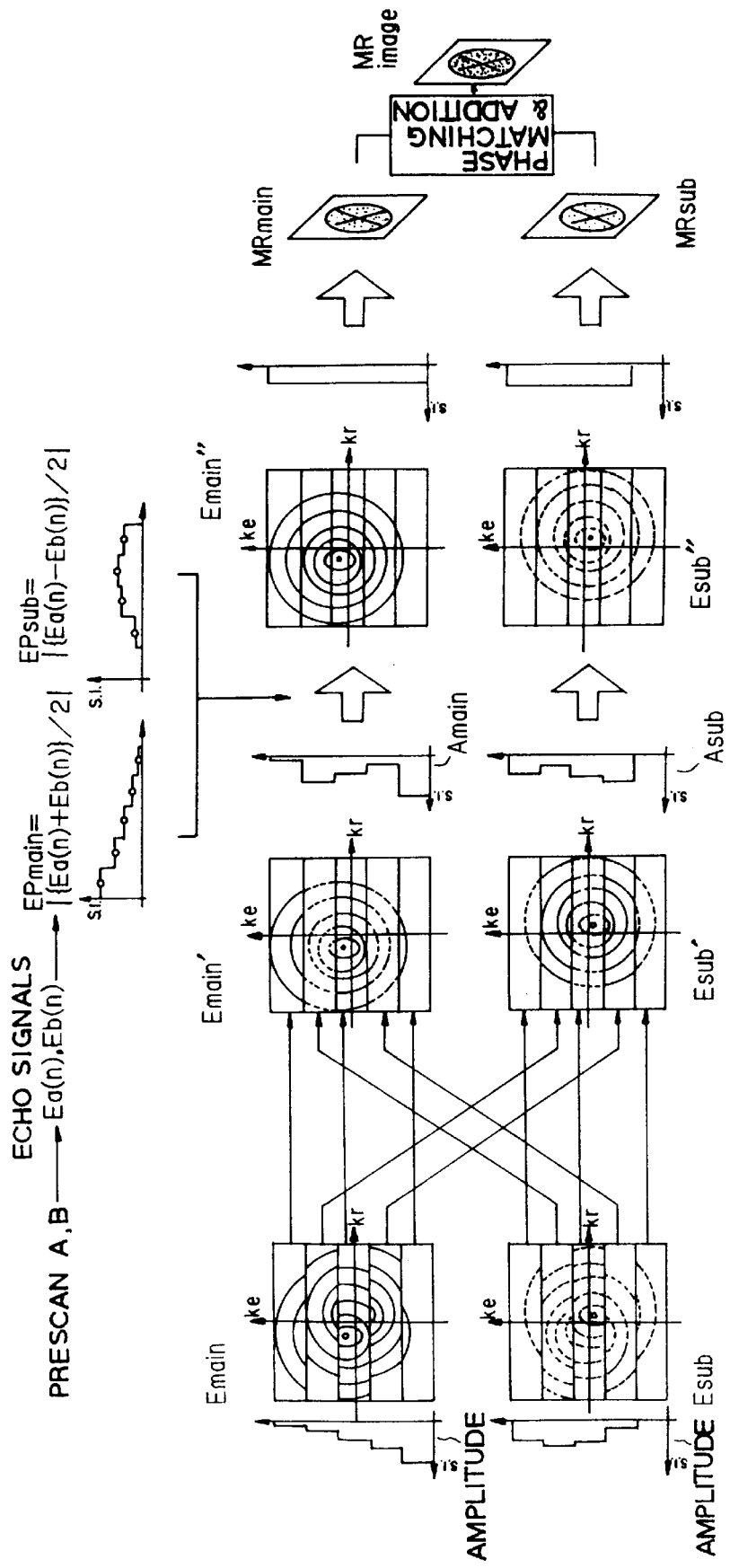
FIG. 39 represents a series of processes for producing a single real-space MR image from main echo and sub-echo components mapped individually in two two-dimensional k-space.
Figure 40:
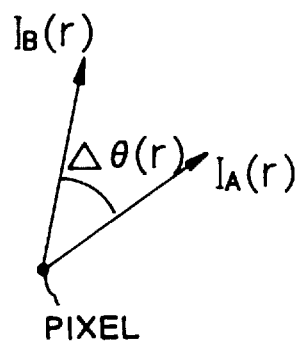
FIG. 40 is a vector illustration for explaining phase matching between two pixel signals.

In the same way as above, the main echo components Emain(n) and sub-echo components Esub(n) are extracted (computed) by Emain(n)={Ea(n)+Eb(n)}/2
Esub(n)={Ea(n)−Eb(n)}/2 using echo signals Ea(n) and Eb(n) obtained in prescans A and B, their absolute values |{Ea(n)+Eb(n)J/2| and |{Ea(n)−Eb(n)1/2| are computed, and the computed absolute values are set as amplitude information EPmain and EPsub of the main echo and sub-echo components Emain(n) and Esub(n), respectively (Step S102; refer to FIG. 39). The controller 6 then instructs not only the multiplexer 11 to switch over to the reconstruction unit side but also the sequencer 5 to execute in turn two kinds of scans I and J (Step S103). Pulse sequences used in these diagnostic scans I and J are each shown in FIGS. 36 and 37. As understood from the figures, except the application phase patterns of RF pulses, the pulse sequences are the same as a normally-used FSE method; namely, no correction is made to the application phases of RF pulses and the waveforms of gradients. The application phase pattern of RF refocusing pulses in one diagnostic scan I is not changed from a normally-used FSE method, while that in the other diagnostic scan J is changed in that the application phases $\phi$ of the even-numbered RF refocusing pulses are set to 270° additionally rotated by 180°. This application phase pattern is, for example, the same as one in the foregoing prescan B.

Then, the controller 6 sends the reconstruction unit 11 a command to execute in turn procedures shown at Step S94 and its subsequent steps.

Responsively to the command, the reconstruction unit 11 extracts and separates the two-dimensionally distributed main echo and sub-echo components Emain and Esub in the k-space using the data Ei(n) and Ej(n) acquired by the diagnostic scans I and J (Step S104). This process is carried out by Emain={Ei(n)+Ej(n)}/2
Esub={Ei(n)−Ej(n)}/2 which are the same formulas described before. The separated and extracted main echo and sub-echo components are pictorially shown in FIGS. 38 and 39. The main echo components Emain are illustrated by solid lines, and the sub-echo component by dashed lines.

As clearly understood from foregoing formulas (1) and (2), for each of the main echo components Emain and sub-echo components Esub, the phase alternately repeats two values φ1 and φ2 in a manner such that it takes φ1 at odd-numbered echo signals and it takes φ2 at even-numbered echo signals. Additionally, taking account of regularity of the gradient fields, the phases of odd-numbered echo signals of the main echo components Emain and the phases of even-numbered echo signals of the sub-echo components Esub are equal to each other in most cases.

In accordance with this principle, as shown in FIG. 39, the reconstruction unit 11 produces new main echo components Emain' and sub-echo components Esub' by exchanging echo data belonging to even- or odd-numbered echo blocks, every echo block, in their k-spaces between corresponding echo blocks in the main echo and subecho components Emain and Esub (Step S105). In detail, the exchange is carried out such that when an even-numbered echo signal is placed at each of the centers of the k-spaces, all the odd-numbered echo data are exchanged with each other, whereas when an odd-numbered echo signal is placed at each of the centers of the k-spaces, all the even-numbered echo data are exchanged with each other. As a result, in the newly-produced main echo and sub-echo components Emain' and Esub' mapped in the respective k-spaces, the phase shifts between echo blocks will almost disappear, whereby all the echo data are positionally smooth-connected with each other, as pictorially shown in FIG. 39.

Each of the main echo and sub-echo components Emain' and Esub' at this stage are merely arranged alternately at every echo block in the k-space. In short, there is still dispersion of the echo signal amplitudes between echo blocks, as shown by the graphs Amain and Asub each representing changes in the amplitude in the ke-direction.

Therefore, the reconstruction unit 11 receives from the controller 6 the amplitude information EPmain and EPsub made using the prescans A and B, designates the information ElPmain and EPsub as amplitude correction data, and puts amplitude correction into execution, for every echo block, to give a uniform amplitude distribution over the respective entire k-space to each of the main echo and subecho components Emain' and Esub' (Step S106). This amplitude correction further produces two new sets of main echo and sub-echo components Emain" and Esub" each mapped in the k-spaces (refer to FIG. 39).

The reconstruction unit 11 subsequently reconstructs (two-dimensional Fourier transformation) each of the two new sets of main echo and sub-echo components Emain" and Esub", thereby producing two sets of MR image data MRmain and MRsub, respectively (Step S107). Since both the echo data Emain" and Esub" mapped in their respective k-space have almost no phase shift between echo data, even if adjustment is poor, it is possible to exclude most ghost artifacts from the reconstructed MR images MRmain and MRsub.

A further process is executed by the reconstruction unit 11 at Step S108, in which the phases of two pixel signals at the same two pixel positions common to the two MR images are arranged to be equal to each other (Step S108). This phase arrangement is, for example, carried out as follows. When it is supposed that pixel numbers (complex data) at the same positions common to the two MR images MRmain and MRsub are $I_A(r)$ and $I_B(r)$ (refer to FIG. 40), the phase difference $\Delta\Gamma(r)$ is computed by $$\Delta\theta(r) = \arg\{I_B(r)\} - \arg\{I_A(r)\}$$

and using a relation of $$I_A'(r) = I_B(r) \cdot \exp\{-j\Delta\theta(r)\}$$

a final MR image I(r) is computed at every pixel by the following formula (Step S109):

$$I(r) = \{I_A(r) + I_B'(r)\}/2$$

Alternatively, IB'(r) can be:

$$I_B'(r) = \{(I_B(r)/I_A(r)) + (I_B(r)/I_B(r)^*)\} I_A(r)$$

where $(I_B(r)/I_A(r))^*$ is the complex conjugate of $(I_B(r)/I_A(r)^*)\} I_A(r)$, and data of the final MR image I(r) can be computed pixel by pixel using the approximation of IB'(r) (Step S109).

Still alternatively, data of the final MR image I(r) can be obtained pixel by pixel as follows (Step S109).

$$I(r) = \{|I_A(r)| + |I_B(r)|\}/2$$

As described above, the MRI system of this embodiment requires at least two diagnostic scans. However, even when there exists a phase error distribution of the second or higher order which is theoretically impossible to be corrected by adjusting the application phase of the RF excitation pulse and the waveforms of gradients, the MRI system can steadily exclude the phase error distribution including such higher-order error components. Thus, it is possible to provide MR images of stable and higher-quality, without deterioration of image quality. In addition, since it is not necessary to utilize phase information acquired from the prescans, an MR imaging technique having resistance against an object motion etc. is provided.

In the foregoing seventh embodiment, when the amplitude correction is unnecessary in some cases, the prescans A and B can be excluded.

Further, lowering the flip angles due to the RF refocusing pulses can cause changes in amplitude ratios between the main echo and sub-echo components, and can suppress ups and downs in amplitude in the respective k-spaces. When such manner of lowering the flip angles is employed, diagnostic scans can be performed prior to prescans, because the pulse sequence itself used in the diagnostic scan has no relation with information acquired by the prescans.

Still further, the imaging techniques taught by the seventh and its modified embodiments can be applied to those including a plurality of RF refocusing pulses, such as a CPMG pulse train and phase reversal CP pulse train.

Figure 41:
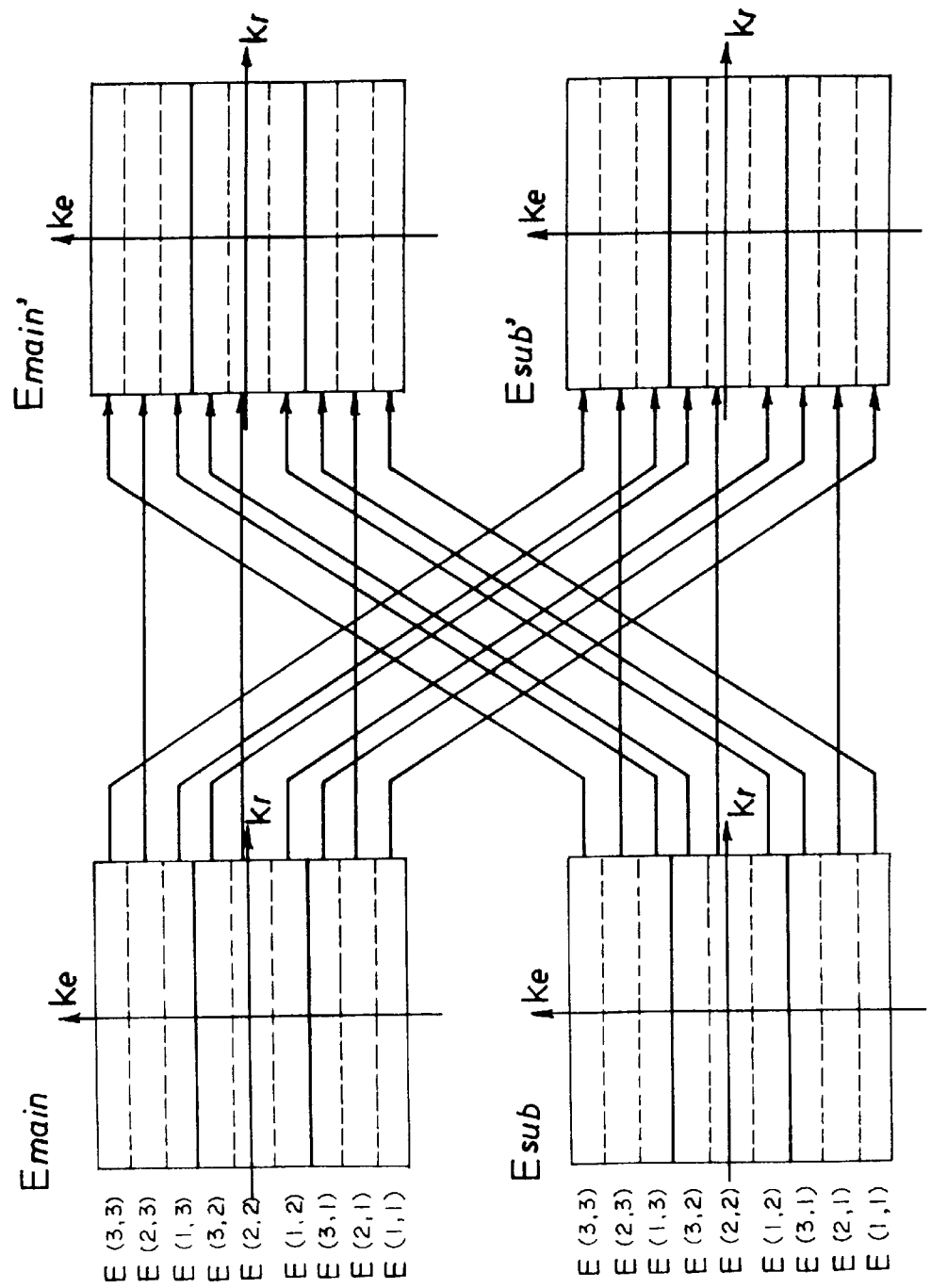
FIG. 41 is a pictorial illustration of a variant for echo data conversion in the seventh embodiment.

However, when a GRASE method is employed as one of such imaging techniques, attention must be paid to the foregoing echo data exchange, for there are some cases in the GRASE method that do not hold the above-described situation in which even-numbered or odd-numbered echo data belonging to a plurality of echo blocks arranged in the phase encode direction of the k-space can simply be exchanged, block by block, between the two echo components Emain and Esub. One such example is shown in FIG. 41. Two sets of k-space data Emain and Esub illustrated therein are derived from the GRASE method. In detail, echo data $E(N_{RF}, N_{GE})$ are acquired in a manner that the RF refocusing pulses are odd in number ($=N_{RF}=3$), the gradient echoes generated after each RF refocusing pulse are three in number (NGE=3). When the number of RF refocusing pulses is odd as exemplified above, two new sets of k-space data Emain' and Esub', which are almost equal in phase in the respective k-space data, can be produced by converting echo data E(NRF, NGO in an odd-numbered (or even-numbered) echo block for each RF refocusing pulse at the process corresponding to Step S25 shown in the foregoing FIG. 35. Utilizing regularity associated with the phase shifts in this way makes it possible to effectively suppress generation of artifacts for imaging methods that do not change largely the waveform of phase encode gradients applied subsequently after each RF refocusing pulse.

What is claimed is:

1. A method of obtaining a magnetic resonance (MR) image using an imaging scan applied to an object to be imaged, the method comprising the steps of:

performing a first prescan applied to the object with a first preliminary pulse sequence including a first single RF excitation pulse and a plurality of first RF refocusing pulses each of which is given an application phase set to a specified phase value, thereby the first prescan providing responsively to the first RF refocusing pulses a first group of a plurality of echo data including a plurality of first main echo components and a plurality of first sub-components;

performing a second prescan applied to the object with a second preliminary pulse sequence including a second single RF excitation pulse and a plurality of second RF refocusing pulses of which even numbered second RF refocusing pulses are given an application phase set to another specified phase value different by 180° from the specified phase value, thereby the second prescan providing responsively to the second RF refocusing pulses a second group of a plurality of echo data including a plurality of second main echo components and a plurality of second sub-echo components;

obtaining from the first and second groups of echo data a main echo family substantially comprising a plurality of main echo components associated with the first and second main echo components and a sub-echo family substantially comprising a plurality of sub-echo components associated with the first and second sub-echo components and constituted by components other than the main echo components;

correcting a predetermined sequence-adjusting factor of the imaging pulse sequence on the basis of the main echo and sub-echo families; and performing the corrected imaging Pulse sequence on the object.

2. The method of claim 1, wherein the correcting step includes calculating a correction data corresponding to at least one of a phase shift of the main echo family and a displacement in temporal position of an echo peak in the main echo family, and correcting the sequence-adjusting factor of the imaging pulse sequence based on the correction data.

3. The method of claim 2, wherein each of the first and second preliminary pulse sequences and the imaging pulse sequence is formed on either one of a CPMG pulse train and a phase reversal CP pulse train.

4. The method of claim 2, wherein each of the first and second preliminary pulse sequences and the imaging pulse sequence is formed in accordance with a sequence selected from the group consisting of a GRASE sequence and a fast SE sequence.

5. The method of claim 2, wherein each of the first and second preliminary pulse sequences includes a phase encode gradient whose phase encoding quantity is set to zero.

6. The method of claim 5, wherein the calculation in the correcting step is based on addition and subtraction executed between two sets of echo data each set belonging to a specified echo mapping block common to the first and second groups of echo data.

7. The method of claim 6, wherein the imaging pulse sequence includes an RF excitation pulse, a slice gradient which is applied to the object and handled as the sequence-adjusting factor and a readout gradient and the correction data consists of at least one of a correction quantity to an application phase for the RF excitation pulse, a correction quantity to the slice gradient, and a correction quantity to the readout gradient.

8. The method of claim 7, wherein the correction data is either one of a first combination of the correction quantity to the application phase and the correction quantity to the readout gradient and a second combination of the correction quantities to the slice and readout gradients.

9. The method of claim 5, wherein the calculating in the correcting step is based on addition and subtraction executed between two sets of echo data each set belonging to a specified echo mapping block common to the first and second groups of echo data;

computing a phase shift and a displacement of echo peaks formed by echo data sets odd-numbered and even-numbered in at least one of the main echo and sub-echo data families; and obtaining the correction data on the basis of at least one of the phase shift and the displacement.

10. The method of claim 9, wherein the imaging pulse sequence includes an RF excitation pulse, a slice gradient and a readout gradient all of which are applied to the object and handled as the sequence-adjusting factor and the correction data consists of at least one of a correction quantity to an application phase for the RF excitation pulse, a correction quantity to the slice gradient, and a correction quantity to the readout gradient.

11. The method of claim 10, where in the correction data is one of a first combination of the correction quantity to the application phase and the correction quantity to the readout gradient and a second combination of the correction quantities to the slice and readout gradients.

12. The method of claim 5, wherein the calculation in the correcting step is based on addition and subtraction executed between two sets of echo data each set belonging to a specified echo mapping block common to the first and second groups of echo data;

comparing with each other two sets of echo data sampled in each of the main echo and sub-echo data families in terms of a phase distribution selected from the group consisting of the zero-th order and the first-order phase distributions of spins of each set of echo data and;

obtaining the correction data on the basis of compared results.

13. The method of claim 12, wherein the imaging pulse sequence includes an RF excitation pulse, a slice gradient and a readout gradient all of which are applied to the object and handled as the sequence-adjusting factor and the correction data consists of at least one of a correction quantity to an application phase for the RF excitation pulse, a correction quantity to the slice gradient, and a correction quantity to the read out gradient.

14. The method of claim 13, wherein the correction data is one of a first combination of the correction quantity to the application phase and the correction quantity to the readout gradient and a second combination of the correction quantities to the slice and readout gradients.

15. The method of claim 2, wherein each of the first and second preliminary pulse sequences includes a phase encode gradient formed by an waveform identical to a shot of a pulse sequence assigned to an echo mapping block including a center in a phase encode direction of a k-space to which acquired echo data are mapped responsively to conducting the imaging scan.

16. The method of claim 15, wherein the obtaining step is based on separating and extracting from the first and second groups of echo data the main echo family and the sub-echo data family by at least performing one of addition and subtraction between two sets of echo data corresponding to effective echo time in each of the first and second groups of echo data;

and wherein the calculation in the correcting step includes computing the phase shift and the displacement of echo peaks formed by echo data sets corresponding to the effective echo time in at least one family selected from the group of families consisting of the main echo and sub-echo families and obtaining the correction data on the basis of at least one of the phase shift and the displacement.

17. The method of claim 2, wherein each of the first and second preliminary pulse sequences includes a phase encode gradient formed by a waveform identical to a shot of a pulse sequence assigned to one of a whole area and a part of a k-space to which acquired echo data are mapped responsively to conducting the imaging scan.

18. The method of claim 17, wherein the obtaining step is based on two-dimensional separating and extracting from the first and second groups of echo data the main echo family and the sub-echo data family by at least performing one calculation selected from the group consisting of addition and subtraction between the first and second groups of echo data;

and wherein the calculating in the correcting step includes computing at least one combination selected from the group consisting of the first combination of a phase shift and a two-dimensional displacement vector as the displacement of an echo peak formed by a desiredly-numbered two-dimensional main echo component of the main echo family and a second combination of the phase shift and a two-dimensional displacement vector as the displacement of an echo peak formed by a desiredly-numbered two-dimensional sub-echo component of the sub-echo family and obtaining the correction data on the basis of the computation.

19. The method of claim 1, wherein the object is different between in performing the first and second prescans and in performing the imaging scan, the object being a phantom in performing the first and second prescans.

20. The method of claim 1, further comprising the steps of:

first obtaining inherent phase error information concerning a combination of imaging channels and physical channels of gradient coils used for performing the imaging pulse sequence on the basis of the first and second echo data groups; and second obtaining imaging condition information associated with gradients applied by the gradient coils, wherein the correcting step includes computing a correction data used for correcting the sequence-adjusting factor of the imaging pulse sequence using the inherent phase error information and the imaging condition information.

21. The method of claim 20, wherein the imaging condition information includes information concerning a direction of an imaging section of the object, a desired resolution level of the MR image, and a desired slice thickness of the object specified in conducting the imaging scan.

22. The method of claim 1, wherein the specified application phase value is 90° and another specified application phase value is 270°.

23. A method of magnetic resonance imagining by which an MR echo data is emanated from an object to be imaged, the method comprising the steps of:

first performing a first imaging scan to the object with a first imaging pulse sequence including an RF excitation pulse, a plurality of RF refocusing pulses each having an application phase set to a first specified phase value, and a phase encode gradient phase-encoding in a k-space on which the echo data is mapped, thereby the first imaging scan providing a first echo data group;

second performing a second imaging scan to the object with a second imaging pulse sequence including an RF excitation pulse, a plurality of RF refocusing pulses of which even-numbered RF refocusing pulse each has an application phase set to a second specified phase value differed by 180° from the first specified phase value, and a phase encode gradient phase-encoding in another k-space, thereby the second imaging scan providing a second echo data group;

separating and extracting from the first and second echo data groups a first k-space data being mapped over a plurality of mapping blocks of the k-space and consisting of a group of main echo components and a second k-space data being mapped over a plurality of mapping blocks of the k-space and consisting of a group of echo components other than the main echo components by performing addition and subtraction between the first and second echo data groups;

exchanging to each other and block by block echo data positioned at either one of an even-numbered mapping block of the first and second k-space data and an odd-numbered mapping block of the first and second k-space data;

reconstructing each of the first and second k-space data which has been data-exchanged in the exchanging step, thereby two real-space MR images being provided; and producing a single real-space MR image from the two real-space MR images.

24. The imaging method of claim 23, wherein the exchanging step is composed of a step exchanging block by block echo data residing in either of an even-numbered and an odd-numbered echo mapping blocks for mapping an echo signal emanating from an interval formed between adjacent two of the plurality of RF refocusing pulses applied by each of the first and second imaging scans.

25. The imaging method of claim 23, wherein the exchanging step is composed of a step exchanging block by block echo data residing in either of an even-numbered and an odd-numbered echo mapping blocks among the plurality of echo mapping blocks divided in a phase encode direction in each of the two k-spaces.

26. The imaging method of claim 23, further comprising the steps of:
    third performing a first prescan to the object with a first preliminary pulse sequence including an RF excitation pulse and a plurality of RF refocusing pulses each having an application phase set to a third specified phase value, thereby the first prescan providing a third echo data group;
    fourth performing a second prescan to the object with a second preliminary pulse sequence including an RF excitation pulse and a plurality of RF refocusing pulses of which even-numbered RF refocusing pulse each has an application phase set to a fourth specified phase value differed by 180° from the third specified phase value, thereby the second prescan providing a fourth echo data group;
    second separating and extracting first amplitude information of a first group consisting of a main echo component and second amplitude information of a second group consisting of an echo component other than the main echo component by performing addition and subtraction between the third and fourth echo data groups; and
    correcting amplitudes of each of the first and second k-space data using each of the first and second amplitude information, the amplitude correcting step being interposed between the k-space data reconstructing step and the single real-space MR image producing step.

27. The imaging method of claim 23, wherein the single real-space MR image producing step includes a step for equalizing phases of each pair of pixel signals residing at same positions common to two sample areas selected from entire areas of the two real-space MR images, respectively, with absolute values of the pixel signals unchanged.

28. The imaging method of claim 27, wherein the phase equalizing step is composed of a step utilizing only a phase distribution of low spatial frequency pixel signals in order to equalize the phases.

29. The imaging method of claim 27, wherein each of the sample areas is the entire area of each of the two real-space MR images and the single real-space MR image producing step includes a step for adding to each other each pair of pixel signals residing at same positions common to the two real-space MR images each of which is phase-equalized pixel by pixel.

30. The imaging method of claim 23, wherein the single real-space MR image producing step includes:
    a step for forming two absolute-value images by computing image by image absolute values of pixel signals of each of the two real-space MR images; and
    a step for forming the single real-space MR image by adding the two absolute-value images pixel by pixel.

31. The imaging method of claim 23, wherein the first specified application phase value is 90° and the second specified application phase value is 270°.

32. A system for magnetic resonance imaging (MRI) in which an imaging pulse sequence is magnetically applied to an object to be imaged by an imaging scan, the system comprising:
    first means for performing a first prescan to the object with a first preliminary pulse sequence including a first single RF excitation pulse and a plurality of first RF refocusing pulses each having an application phase set to a first specified value, thereby the first prescan providing responsively to the first RF refocusing pulses a first group of a plurality of echo data including a plurality of first main echo components and a plurality of first sub-echo components;
    second means for performing a second prescan to the object with a second preliminary pulse sequence including a second single RF excitation pulse and a plurality of second RF refocusing pulses of which even-numbered RF refocusing pulses have an application phase set to a second specified value different by 180° from the first specified value, thereby the second prescan providing responsively to the second RF refocusing pulses a second group of a plurality of echo data including a Plurality of second main echo components and a plurality of second sub-echo components;
    means for calculating from the first and second groups of echo data a main echo family comprising a plurality of main echo components associated with the first and second main echo components and a sub-echo family including a plurality of sub-echo components associated with the first and second sub-echo components; and
    means for correcting a sequence-adjusting factor of the imaging pulse sequence on the basis of the correction data prior to conducting the imaging scan.

33. The system of claim 32, wherein the correcting means includes further means for calculating a correction data corresponding to at least one of a phase shift of the main echo family and a displacement in temporal position of an echo peak in the main echo family, and means for correcting the sequence-adjusting factor of the imaging pulse sequence based on the correction data.

34. The system of claim 33, further comprising;
    first obtaining inherent phase error information concerning a combination of imaging channels and physical channels of gradient coils used for performing the imaging pulse sequence on the basis of the first and second groups of echo data; and
    second obtaining imaging condition information associated with gradients applied by the gradient coils,
    wherein the correcting step includes computing a correction data used for correcting the sequence-adjusting factor of the imaging pulse sequence using the inherent phase error information and the imaging condition information.

35. The system of claim 34, wherein the imaging condition information includes information concerning a direction of an imaging section of the object, a desired resolution level of the MR image, and a desired slice thickness of the object specified in conducting the imaging scan.

36. The system of claim 32, wherein the specified application phase value is 90° and another specified application phase value is 270°.

37. The system of claim 32, wherein each of the first and second preliminary pulse sequences and the imaging pulse sequence are formed on either one of a CPMG pulse train and a phase inversion CP pulse train.

38. The system of claim 32, wherein each of the first and second preliminary pulse sequences and the imaging pulse sequence are formed in accordance with either one of a GRASE sequence and a fast SE sequence.

39. A system for magnetic resonance imaging (MRI) whereby an MR echo data is emanated from an object to be imaged, the system comprising:
    first means for performing a first imaging scan to the object with a first imaging pulse sequence including an RF excitation pulse, a plurality of RF refocusing pulses each having an application phase set to a first specified phase value, and a phase encode gradient phase-encoding in a k-space on which the echo data is mapped, thereby the first imaging scan providing a first echo data group;

second means for performing a second imaging scan to the object with a second imaging pulse sequence including an RF excitation pulse, a plurality of RF refocusing pulses of which even-numbered RF refocusing pulse each has an application phase set to a second specified phase value differed by 180° from the first specified phase value, and a phase encode gradient phase-encoding in another k-space, thereby the second imaging scan providing a second echo data group;

means for separating and extracting a first k-space data being mapped over a plurality of mapping blocks of the k-space and consisting of a group of main echo components and a second k-space data being mapped over a plurality of mapping blocks of the k-space and consisting of a group of echo components other than the main echo components by performing addition and subtraction between the first and second echo data groups;

means for exchanging to each other and block by block echo data positioned at either one of an even-numbered mapping block of the first and second k-space data and an odd-numbered mapping block of the first and second k-space data;

means for reconstructing each of the first and second k-space data which has been data-exchanged in the exchanging step, thereby two real-space MR images being provided; and means for producing a single real-space MR image from the two real-space MR images.

\* \* \* \* \*

UNITED STATES PATENT AND TRADEMARK OFFICE
CERTIFICATE OF CORRECTION

PATENT NO. : 5,818,229
DATED : October 6, 1998
INVENTOR(S) : H. Kanazawa

It is certified that error appears in the above-identified patent and that said Letters Patent is hereby corrected as shown below:

At column 1, line 42, change "(l 1)" to --(1,1)--;
at column 1, line 46, change "4)" to --$\phi$--; change "0O" to --0°--;
at column 1, line 48, change "angle 0" to --angle $\theta$--;
at column 1, line 49, change "angle 0" to --angle $\theta$--;
at column 1, line 50, change "a" to --$\alpha$--;
at column 1, line 51, change "131 to B5" to --$\beta_1$ to $\beta_5$--;
at column 1, line 52, change "1800" to --180°--;
at column 2, line 57, change "sequencers" to --sequence is--;
at column 2, line 67, insert --the-- between "between" and "two";
at column 3, line 41, change ";" to --:--;
at column 4, line 7, insert --is-- between "and" and "expressed";
at column 4, line 10, change "state, the" to --state. The--;
at column 4, line 53, insert --the-- between "between" and "two";
at column 4, line 56, after "as if", insert --the--;
at column 6, line 23, change "of scanning" to --being scanned--;
at column 6, line 50, change "an object of scanning" to --an object being scanned--;
at column 7, line 19, delete "at a time";
at column 8, line 6, change "ecno" to --echo--;
at column 8, line 10, insert --the-- between "between" and "two";
at column 8, line 22, insert --the-- between "between" and "two";
at column 8, line 37, insert --the-- between "between" and "two";
at column 8, line 56, delete "a";
at column 8, line 64, delete "an";
at column 8, line 66, change "to" to --of--;
at column 9, line 5, change "to" to --of--;
at column 9, line 8, change "pulse each has" to --pulses each have--;
at column 9, line 20, change "to" to --with--;
at column 9, line 38, change "to" to --of--;
at column 9, line 42, change "to" to --of--;

UNITED STATES PATENT AND TRADEMARK OFFICE
CERTIFICATE OF CORRECTION

PATENT NO. : 5,818,229
DATED : October 6, 1998
INVENTOR(S) : H. Kanazawa

It is certified that error appears in the above-identified patent and that said Letters Patent is hereby corrected as shown below:

column 18, line 65, change "and" to --or--;
column 19, line 16, change "Ee(m.n)" to --Ee(m,n)--;
column 19, line 29, delete "(@";
column 19, line 31, delete "alone";
column 22, line 36, change "can" to --and--;
column 23, line 19, change "Hare" to --H are--;
column 23, line 21, change "uses" to --use--;
column 23, line 23, change "prescan" to --prescans--;
column 24, line 24, change "executed is a prescan" to --a prescan is executed--;
column 27, line 12, change "As" to --At--;
column 27, line 15, change "$\Delta \varphi$ i" to --$\Delta\varphi i$--;
column 27, line 37, change "$\Delta \varphi$" to --$\Delta\varphi$--;
column 27, line 40, change "Ad)" to --$\Delta\varphi$--;
column 29, lines 16-17, insert --the-- between "of" and "regularity".

UNITED STATES PATENT AND TRADEMARK OFFICE
CERTIFICATE OF CORRECTION

PATENT NO.   : 5,818,229
DATED        : October 6, 1998
INVENTOR(S)  : H. Kanazawa It is certified that error appears in the above-identified patent and that said Letters Patent is hereby corrected as shown below:

On the tile page of Patent, in the Abstract, after "even-numbered RF refocusing", change "pulse has" to --pulses have--;
On the tile page of the Patent, in the Abstract, after "by the first and second", change "prescan" to --prescans--.

Signed and Sealed this

First Day of June, 1999

Attest:

Q. TODD DICKINSON

*Attesting Officer*    *Acting Commissioner of Patents and Trademarks*